(12) United States Patent
Ise et al.

(10) Patent No.: US 10,609,315 B2
(45) Date of Patent: Mar. 31, 2020

(54) SOLID-STATE IMAGE PICKUP ELEMENT, APPARATUS, AND METHOD FOR FOCUS DETECTION

(71) Applicant: CANON KABUSHIKI KAISHA, Tokyo (JP)

(72) Inventors: Makoto Ise, Tokyo (JP); Tatsuya Arai, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/358,854

(22) Filed: Mar. 20, 2019

(65) Prior Publication Data

US 2019/0222784 A1 Jul. 18, 2019

Related U.S. Application Data

(62) Division of application No. 15/784,354, filed on Oct. 16, 2017, now Pat. No. 10,284,800.

(30) Foreign Application Priority Data

Oct. 21, 2016 (JP) .................................. 2016-206710
Oct. 21, 2016 (JP) .................................. 2016-206720
Nov. 8, 2016 (JP) .................................. 2016-217766

(51) Int. Cl.
*H04N 5/232* (2006.01)
*H04N 5/374* (2011.01)
(Continued)

(52) U.S. Cl.
CPC ..... *H04N 5/3696* (2013.01); *H01L 27/14605* (2013.01); *H01L 27/14634* (2013.01);
(Continued)

(58) Field of Classification Search
CPC ............ H04N 5/3696; H04N 5/23245; H04N 5/232122; H04N 9/04557; H04N 9/04515;
(Continued)

(56) References Cited

U.S. PATENT DOCUMENTS 8,035,704 B2 * 10/2011 Hu ....................... H04N 5/3675
348/246
8,571,346 B2 * 10/2013 Lin ...................... H04N 5/3675
348/180
(Continued)

FOREIGN PATENT DOCUMENTS

JP 2015-012489 A 1/2015

*Primary Examiner* — Hung H Lam
(74) *Attorney, Agent, or Firm* — Cowan, Liebowitz & Latman, P.C.

(57) ABSTRACT

A solid-state image pickup element, including: a pixel array including a plurality of pixels; a first calculator that calculates a phase difference evaluation value for focus detection by a phase difference detection method based on signal from the pixel; and a second calculator that calculates a contrast evaluation value for focus detection by a contrast detection method based on signal from the pixel, wherein, when the first calculator completes calculation of the phase difference evaluation value, the phase difference evaluation value is output regardless of whether or not output of an image signal acquired by the pixel array is completed, and wherein, when the second calculator completes calculation of the contrast evaluation value, the contrast evaluation value is output regardless of whether or not output of the image signal acquired by the pixel array is completed.

16 Claims, 37 Drawing Sheets

(51) Int. Cl.
  *H04N 5/369* (2011.01)
  *H04N 5/378* (2011.01)
  *H01L 27/146* (2006.01)
  *H04N 5/235* (2006.01)
  *H04N 9/04* (2006.01)

(52) U.S. Cl.
  CPC ..... *H01L 27/14645* (2013.01); *H04N 5/2353* (2013.01); *H04N 5/23245* (2013.01); *H04N 5/232122* (2018.08); *H04N 5/232123* (2018.08); *H04N 5/36961* (2018.08); *H04N 5/374* (2013.01); *H04N 5/378* (2013.01); *H04N 9/04515* (2018.08); *H04N 9/04557* (2018.08)

(58) Field of Classification Search
  CPC ......... H04N 5/36961; H04N 5/232123; H04N 5/378; H04N 5/2353; H04N 5/374; H01L 27/14634; H01L 27/14645; H01L 27/14605

See application file for complete search history.

(56) References Cited

U.S. PATENT DOCUMENTS

| | | |
|---|---|---|
| 2001/0026683 A1 | 10/2001 | Morimoto et al. |
| 2010/0302433 A1 | 12/2010 | Egawa |
| 2012/0327267 A1 | 12/2012 | Takahara |
| 2014/0168484 A1* | 6/2014 | Suzuki ............... H04N 5/23212 348/246 |
| 2014/0320736 A1 | 10/2014 | Tomita et al. |
| 2015/0163440 A1 | 6/2015 | Furumochi et al. |
| 2017/0235214 A1* | 8/2017 | Seki ..................... G03B 17/565 396/529 |
| 2019/0182419 A1* | 6/2019 | Sekiguchi ................ G02B 7/28 |

\* cited by examiner

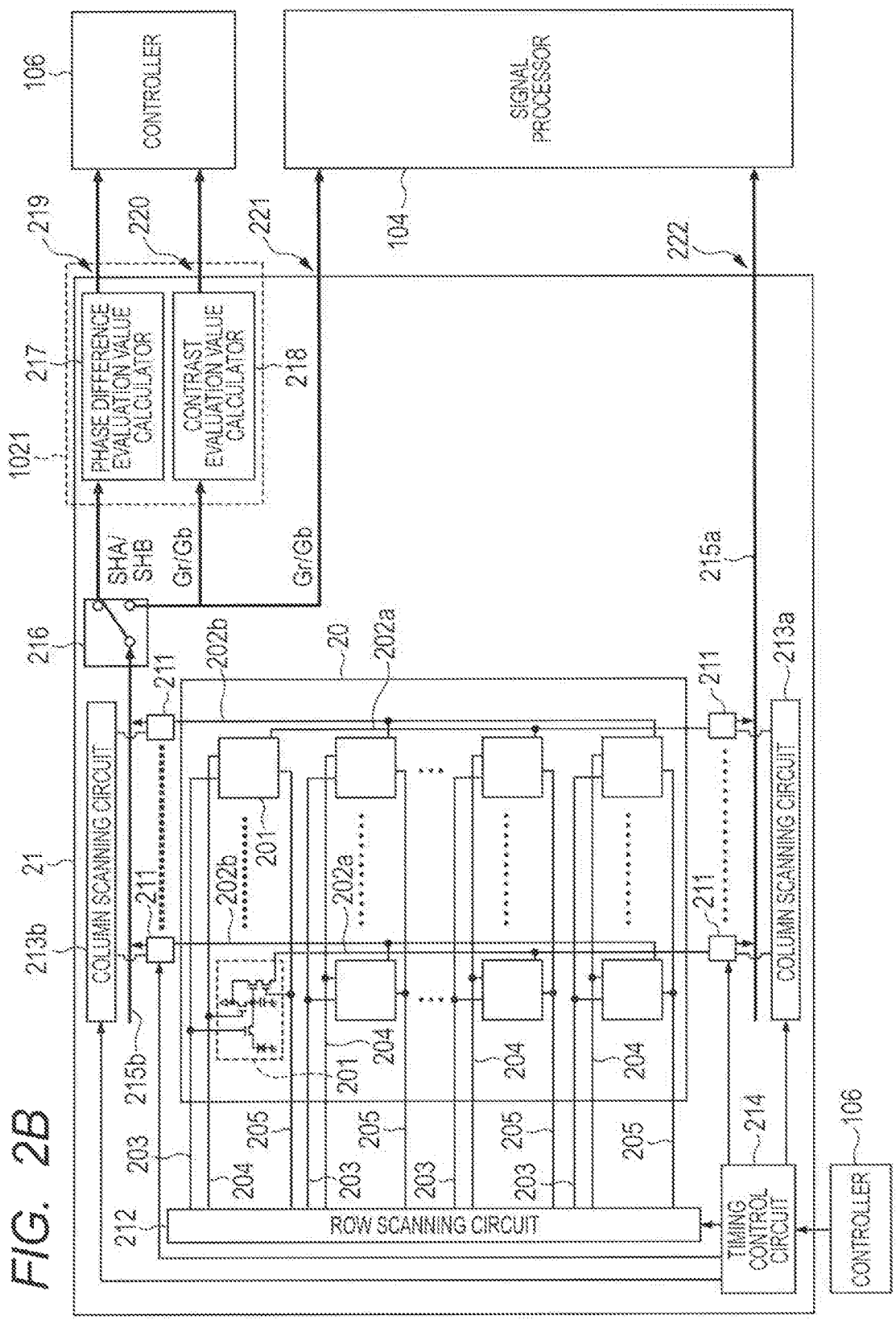

FIG. 5

| | | | | | | ROW NUMBER | ROW SELECTED WHEN SECOND IMAGE SIGNALS ARE TO BE ACQUIRED | ROW SELECTED WHEN FIRST IMAGE SIGNALS ARE TO BE ACQUIRED |
|---|---|---|---|---|---|---|---|---|
| SHA | Gr | SHA | Gr | SHA | Gr | 1 | ○ | |
| Gb | SHB | Gb | SHB | Gb | SHB | 2 | ○ | |
| R | Gr | R | Gr | R | Gr | 3 | | ○ |
| Gb | B | Gb | B | Gb | B | 4 | | ○ |
| R | Gr | R | Gr | R | Gr | 5 | | ○ |
| Gb | B | Gb | B | Gb | B | 6 | | ○ |
| R | Gr | R | Gr | R | Gr | 7 | | ○ |
| Gb | B | Gb | B | Gb | B | 8 | | ○ |
| SHA | Gr | SHA | Gr | SHA | Gr | 9 | ○ | |
| Gb | SHB | Gb | SHB | Gb | SHB | 10 | ○ | |
| R | Gr | R | Gr | R | Gr | 11 | | ○ |
| Gb | B | Gb | B | Gb | B | 12 | | ○ |
| R | Gr | R | Gr | R | Gr | 13 | | ○ |
| Gb | B | Gb | B | Gb | B | 14 | | ○ |
| R | Gr | R | Gr | R | Gr | 15 | | ○ |
| Gb | B | Gb | B | Gb | B | 16 | | ○ |
| | | | | | | ⋮ | ⋮ | ⋮ |

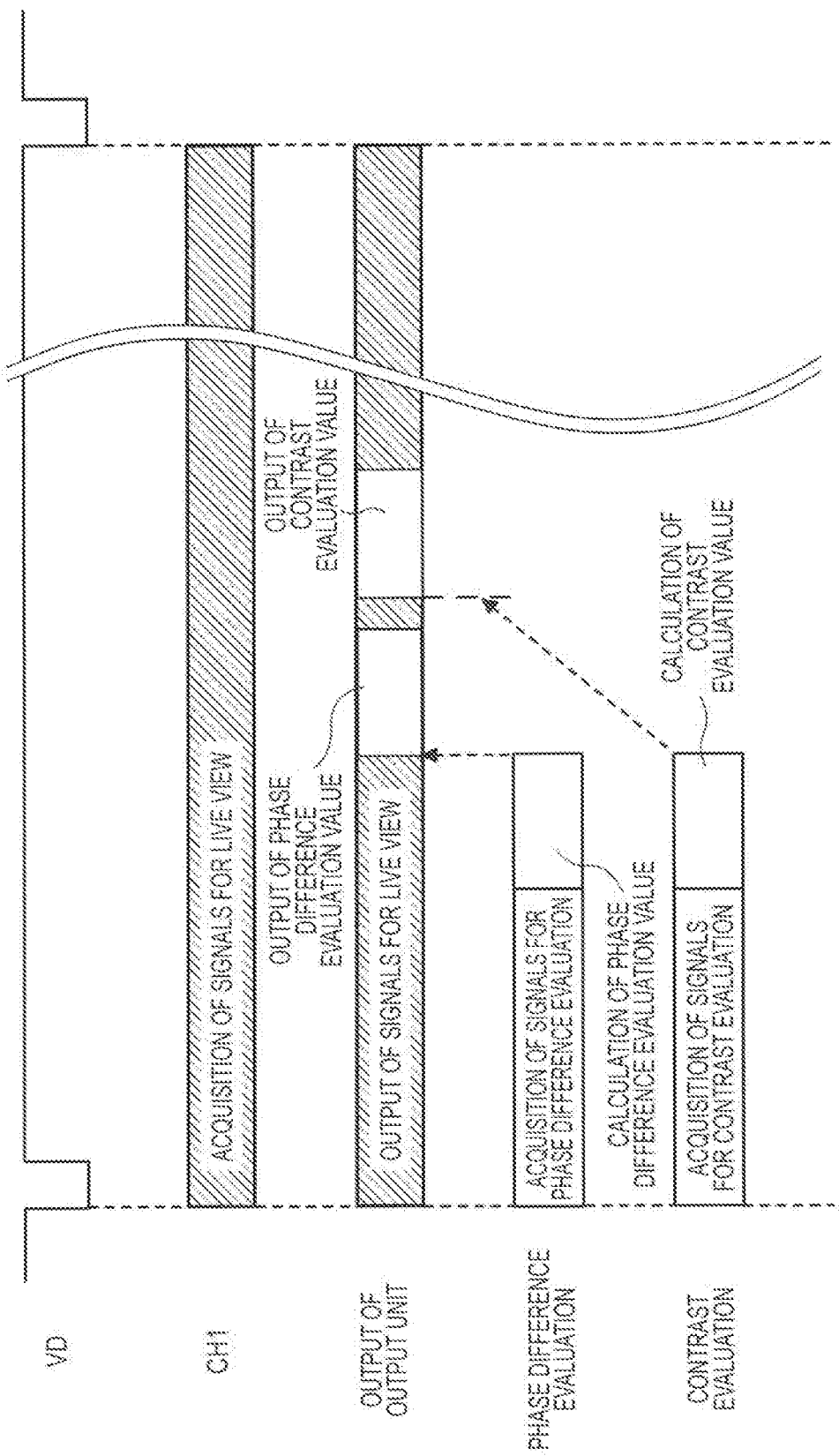

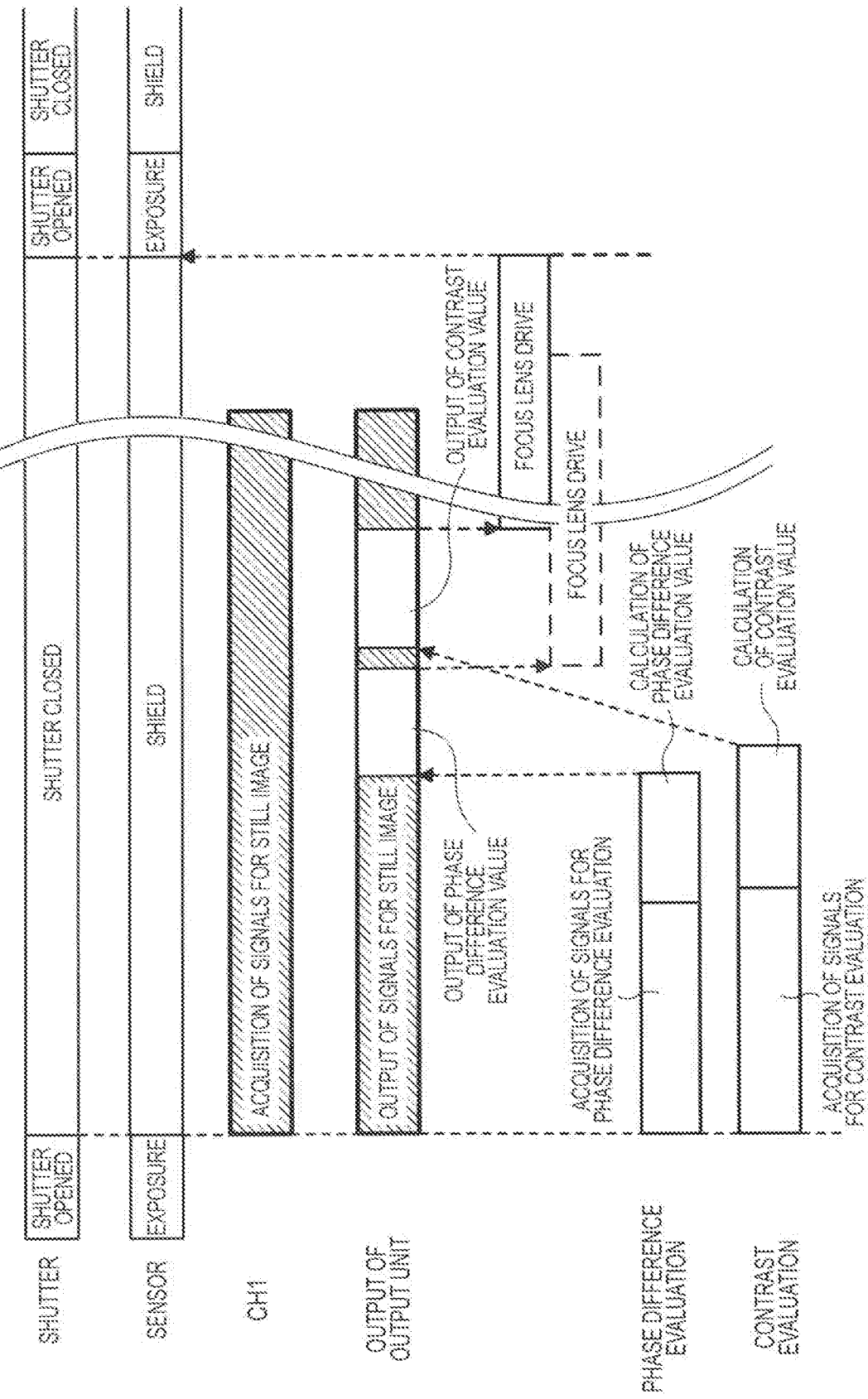

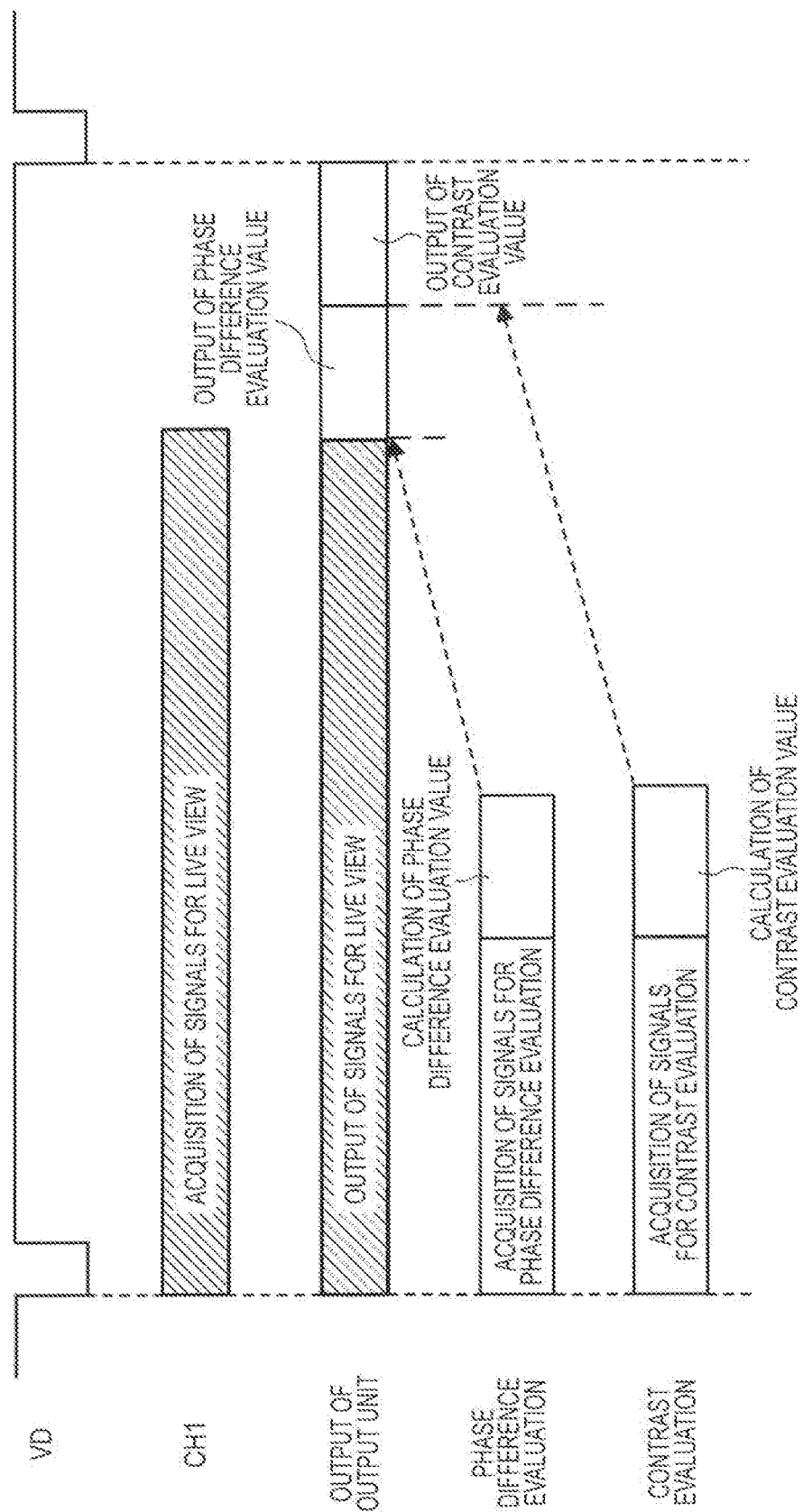

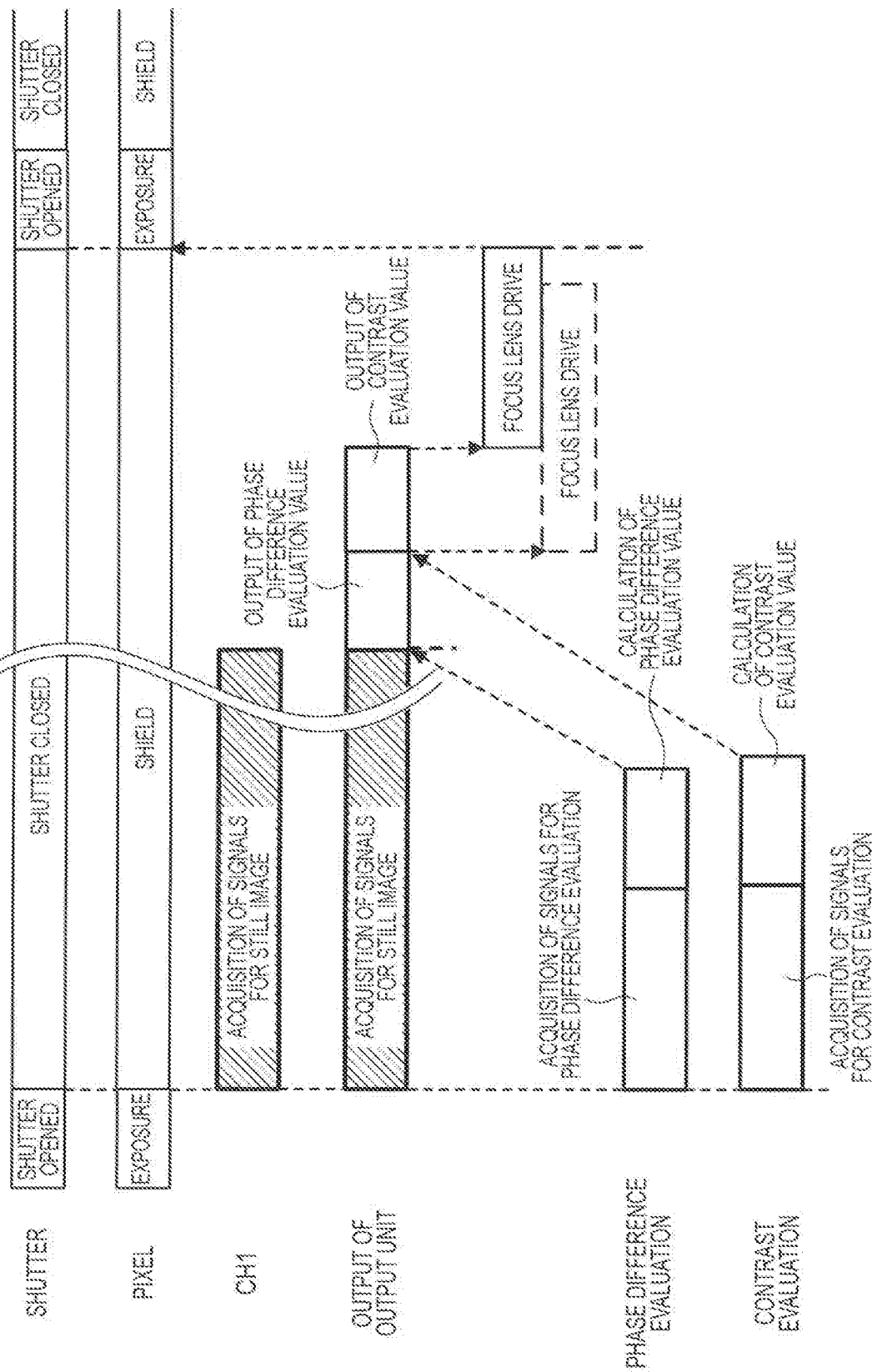

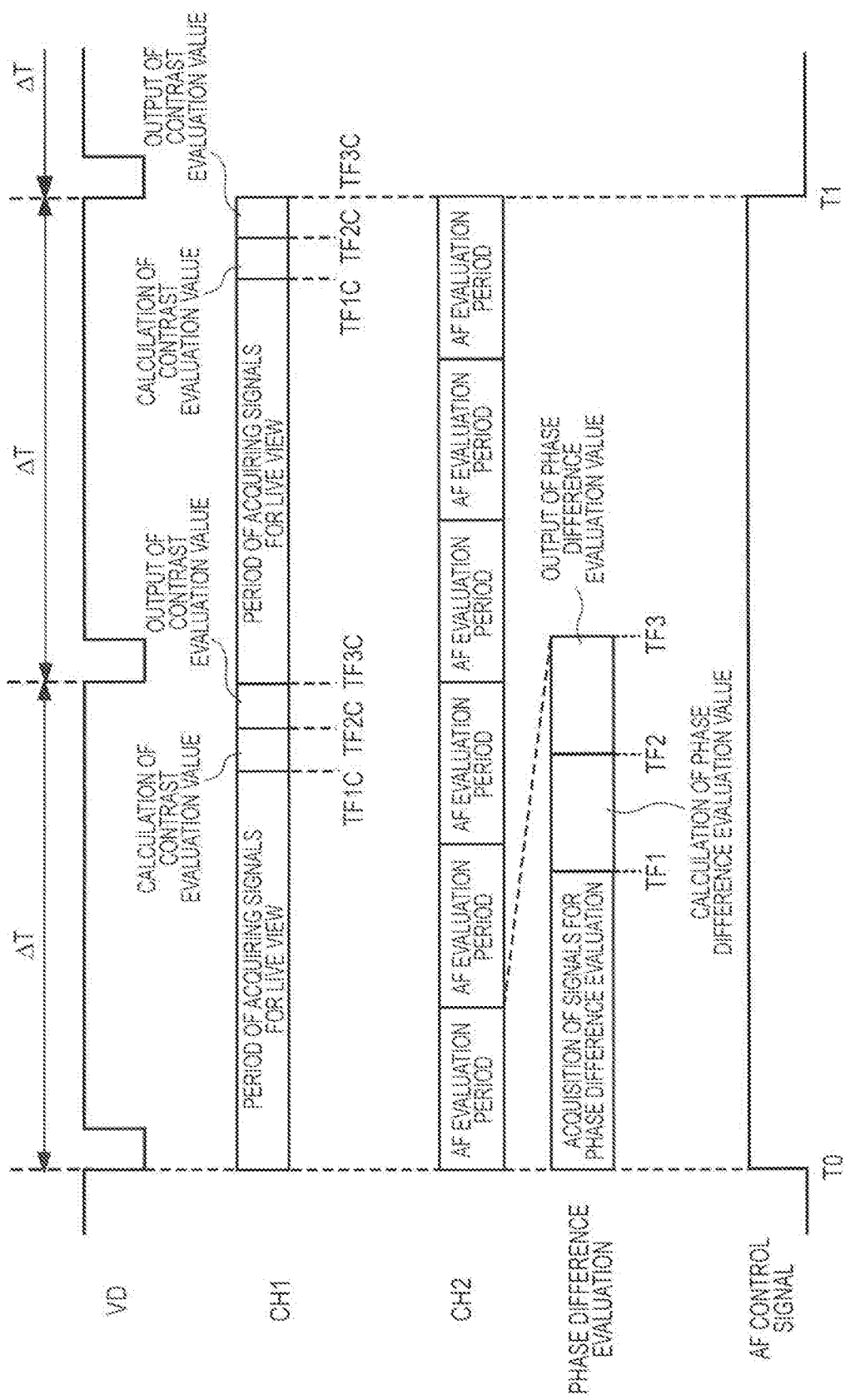

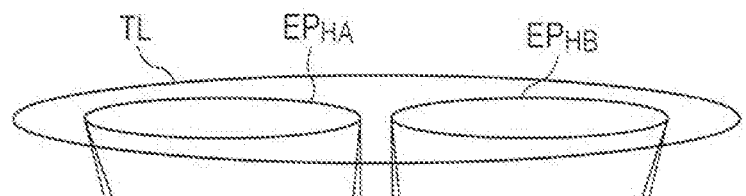
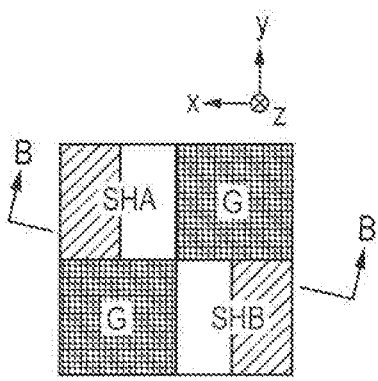
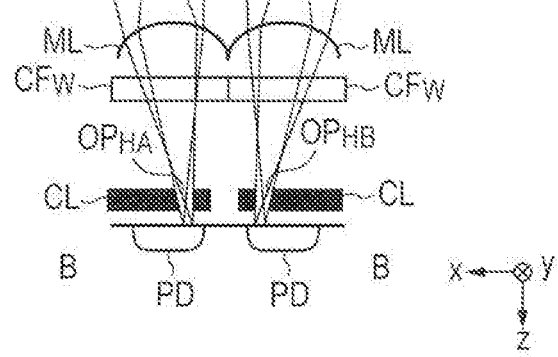
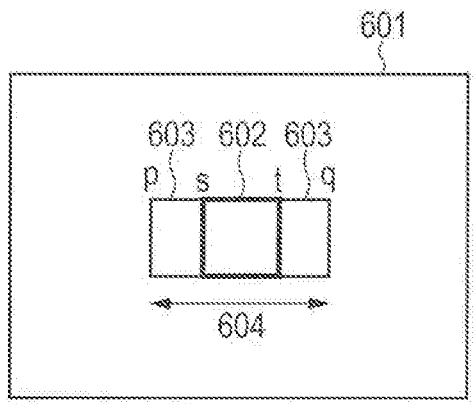

FIG. 28

| | | | | | | ROW NUMBER | PHASE DIFFERENCE DETECTION ROW | IMAGE PICKUP ROW |
|---|---|---|---|---|---|---|---|---|
| SHA | Gr | SHA | Gr | SHA | Gr | 1 | O | |
| Gb | SHB | Gb | SHB | Gb | SHB | 2 | O | |
| R | Gr | R | Gr | R | Gr | 3 | | O |
| Gb | B | Gb | B | Gb | B | 4 | | O |
| R | Gr | R | Gr | R | Gr | 5 | | O |
| Gb | B | Gb | B | Gb | B | 6 | | O |
| R | Gr | R | Gr | R | Gr | 7 | | O |
| Gb | B | Gb | B | Gb | B | 8 | | O |
| SHA | Gr | SHA | Gr | SHA | Gr | 9 | O | |
| Gb | SHB | Gb | SHB | Gb | SHB | 10 | O | |
| R | Gr | R | Gr | R | Gr | 11 | | O |
| Gb | B | Gb | B | Gb | B | 12 | | O |
| R | Gr | R | Gr | R | Gr | 13 | | O |
| Gb | B | Gb | B | Gb | B | 14 | | O |
| R | Gr | R | Gr | R | Gr | 15 | | O |
| Gb | B | Gb | B | Gb | B | 16 | | O |

SOLID-STATE IMAGE PICKUP ELEMENT, APPARATUS, AND METHOD FOR FOCUS DETECTION

CROSS-REFERENCE TO RELATED APPLICATIONS

This application is a divisional of application Ser. No. 15/784,354, filed Oct. 16, 2017 the entire disclosure of which is hereby incorporated by reference.

BACKGROUND OF THE INVENTION

Field of the Invention

This disclosure relates to a solid-state image pickup element, a method of controlling a solid-state image pickup element, and an image pickup apparatus.

Description of the Related Art

Image pickup apparatus such as a digital camera and a video camera are equipped with an autofocus (AF) function of automatically focusing on an object (automatically adjusting a focus position of a lens).

In order to achieve a fast autofocus, signals for focus detection are required to be read out at a high frame rate. However, when the signals for focus detection are read out at a high frame rate, increase in amount of data to be transferred to a signal processor located at a subsequent stage of a solid-state image pickup element is caused. In view of this, the following solid-state image pickup element has been proposed. The solid-state image pickup element includes an AF evaluation value detection unit configured to detect an AF evaluation value, and is configured to output the AF evaluation value detected by the AF evaluation value detection unit to the outside (see Japanese Patent Application Laid-Open No. 2015-12489).

Incidentally, as an AF method, there has been known a hybrid AF, which uses a combination of an AF by a phase difference detection method, that is, a phase difference AF, and an AF by a contrast detection method, that is, a contrast AF. The hybrid AF generally employs a method of moving a focus lens to a position near an in-focus position by the phase difference AF, and further moving the focus lens to the in-focus position by the contrast AF. With this method, a time required for obtaining an in-focus state can be reduced, and an in-focus accuracy can be improved. However, in Japanese Patent Application Laid-Open No. 2015-12489, no consideration is given to the hybrid AF technology, and hence a fast and highly accurate autofocus has not always been achieved depending on image pickup conditions and the like.

SUMMARY OF THE INVENTION

According to an aspect of an embodiment, there is provided a solid-state image pickup element, including: a pixel array including a plurality of pixels; a first calculator that calculates a phase difference evaluation value for focus detection by a phase difference detection method based on signal from the pixel; and a second calculator that calculates a contrast evaluation value for focus detection by a contrast detection method based on signal from the pixel, wherein, when the first calculator completes calculation of the phase difference evaluation value, the phase difference evaluation value is output regardless of whether or not output of an image signal acquired by the pixel array is completed, and wherein, when the second calculator completes calculation of the contrast evaluation value, the contrast evaluation value is output regardless of whether or not output of the image signal acquired by the pixel array is completed.

According to another aspect of an embodiment, there is provided a method of controlling a solid-state image pickup element, including: outputting an image signal acquired by a pixel array including a plurality of pixels; calculating a phase difference evaluation value for focus detection by a phase difference detection method based on signal from the pixel; calculating a contrast evaluation value for focus detection by a contrast detection method based on signal from the pixel; outputting, when calculation of the phase difference evaluation value is completed, the phase difference evaluation value regardless of whether or not output of the image signal acquired by the pixel array is completed; and outputting, when calculation of the contrast evaluation value is completed, the contrast evaluation value regardless of whether or not output of the image signal acquired by the pixel array is completed.

According to further another aspect of an embodiment, there is provided an image pickup apparatus, including: a solid-state image pickup element, including: a pixel array including a plurality of pixels; a first calculator that calculates a phase difference evaluation value for focus detection by a phase difference detection method based on signal from the pixel; and a second calculator that calculates a contrast evaluation value for focus detection by a contrast detection method based on signal from the pixel, the solid-state image pickup element being configured to: output, when the first calculator completes calculation of the phase difference evaluation value, the phase difference evaluation value regardless of whether or not output of an image signal acquired by the pixel array is completed; and output, when the second calculator completes calculation of the contrast evaluation value, the contrast evaluation value regardless of whether or not output of the image signal acquired by the pixel array is completed; and a controller that performs control for driving a focus lens based on the phase difference evaluation value and the contrast evaluation value.

According to further another aspect of an embodiment, there is provided a solid-state image pickup element, including: a pixel array including a plurality of pixels arranged in matrix; a first calculator that calculates a phase difference evaluation value for focus detection by a phase difference detection method based on a signal from a pixel for phase difference detection included in the plurality of pixels; an interpolation processor that generates a signal for compensating for a defect, which is caused in an image signal acquired by the pixel array and caused because the pixel for phase difference detection is included in the plurality of pixels, through interpolation using a signal from a pixel other than the pixel for phase difference detection; and a second calculator that calculates a contrast evaluation value for focus detection by a contrast detection method based on the image signal including the signal generated by the interpolation processor through the interpolation.

According to further another aspect of an embodiment, there is provided a method of controlling a solid-state image pickup element, including: calculating a phase difference evaluation value for focus detection by a phase difference detection method based on a signal from a pixel for phase difference detection included in a plurality of pixels arranged in matrix in a pixel array; generating a signal for compensating for a defect, which is caused in an image signal acquired by the pixel array and caused because the pixel for phase difference detection is included in the plurality of pixels, through interpolation using a signal from a pixel other than the pixel for phase difference detection; and calculating a contrast evaluation value for focus detection by a contrast detection method based on the image signal including the signal generated through the interpolation.

According to further another aspect of an embodiment, there is provided an image pickup apparatus, including: a solid-state image pickup element including: a pixel array including a plurality of pixels arranged in matrix; a first calculator that calculates a phase difference evaluation value for focus detection by a phase difference detection method based on a signal from a pixel for phase difference detection included in the plurality of pixels; an interpolation processor that generates a signal for compensating for a defect, which is caused in an image signal acquired by the pixel array and caused because the pixel for phase difference detection is included in the plurality of pixels, through interpolation using a signal from a pixel other than the pixel for phase difference detection; and a second calculator that calculates a contrast evaluation value for focus detection by a contrast detection method based on the image signal including the signal generated by the interpolation processor through the interpolation; and a controller that performs control for driving a focus lens based on the phase difference evaluation value and the contrast evaluation value.

According to further another aspect of an embodiment, there is provided a solid-state image pickup element, including: a plurality of image pickup pixels that each receive light condensed by an image pickup optical system; a plurality of phase difference detection pixels that each receive a pair of light fluxes passing through different pupil partial regions of the image pickup optical system; a circuit that reads out image pickup signal from the image pickup pixel, and to read out phase difference signal from the phase difference detection pixel; a contrast evaluation value calculator that calculates a contrast evaluation value based on the image pickup signal; a phase difference evaluation value calculator that calculates a phase difference evaluation value based on the phase difference signal before readout of the image pickup signal is completed; and a determination unit that determines whether or not to calculate the contrast evaluation value based on the phase difference evaluation value.

According to further another aspect of an embodiment, there is provided an image pickup apparatus, including: a solid-state image pickup element including: a plurality of image pickup pixels that each receive light condensed by an image pickup optical system; a plurality of phase difference detection pixels that each receive a pair of light fluxes passing through different pupil partial regions of the image pickup optical system; a circuit that reads out image pickup signal from the image pickup pixel, and to read out phase difference signal from the phase difference detection pixel; a contrast evaluation value calculator that calculates a contrast evaluation value based on the image pickup signal; a phase difference evaluation value calculator that calculates a phase difference evaluation value based on the phase difference signal before readout of the image pickup signal is completed; and a determination unit that determines whether or not to calculate the contrast evaluation value based on the phase difference evaluation value; and a controller that performs an in-focus operation of the image pickup optical system based on any one of the phase difference evaluation value and the contrast evaluation value.

According to further another aspect of an embodiment, there is provided a method of controlling a solid-state image pickup element, the solid-state image pickup element including: a plurality of image pickup pixels that each receive light condensed by an image pickup optical system; a plurality of phase difference detection pixels that each receive a pair of light fluxes passing through different pupil partial regions of the image pickup optical system; and a circuit that reads out image pickup signal from the image pickup pixel, and to read out phase difference signal from the phase difference detection pixel, the method including: calculating a phase difference evaluation value based on the phase difference signal before readout of the image pickup signal is completed; and determining whether or not to calculate a contrast evaluation value based on the image pickup signal, depending on the phase difference evaluation value.

Further features of the present invention will become apparent from the following description of exemplary embodiments with reference to the attached drawings.

BRIEF DESCRIPTION OF THE DRAWINGS

FIG. 2B and FIG. 2C are circuit diagrams for illustrating the solid-state image pickup element according to the first embodiment.

FIG. 5 is a diagram for illustrating an example of rows selected at the time of readout in the solid-state image pickup element according to the first embodiment.

FIG. 11C is a time chart for illustrating an example of an operation of an image pickup apparatus according to the third embodiment.

FIG. 11D is a time chart for illustrating another example of the operation of the image pickup apparatus according to the third embodiment.

FIG. 12B is a time chart for illustrating an example of an operation of an image pickup apparatus according to Reference Example 1.

FIG. 12C is a time chart for illustrating another example of the operation of the image pickup apparatus according to Reference Example 1.

FIG. 14 is a diagram for illustrating a layout of pixels in the solid-state image pickup element according to the fourth embodiment.

FIG. 15A and FIG. 15B are diagrams for conceptually illustrating interpolation processing.

FIG. 16 is a time chart for illustrating an operation of an image pickup apparatus according to the fourth embodiment.

FIG. 23A and FIG. 23B are schematic diagrams for illustrating a structure of phase difference detection pixels in the image pickup element according to the sixth embodiment.

FIG. 24 is a schematic diagram for illustrating a focus detection region on a pixel array in the image pickup element according to the sixth embodiment.

FIG. 28 is a schematic diagram for illustrating an arrangement of sub-pixels in the image pickup element according to the sixth embodiment.

DESCRIPTION OF THE EMBODIMENTS

Preferred embodiments of the present invention will now be described in detail in accordance with the accompanying drawings.

First Embodiment

Figure 1:
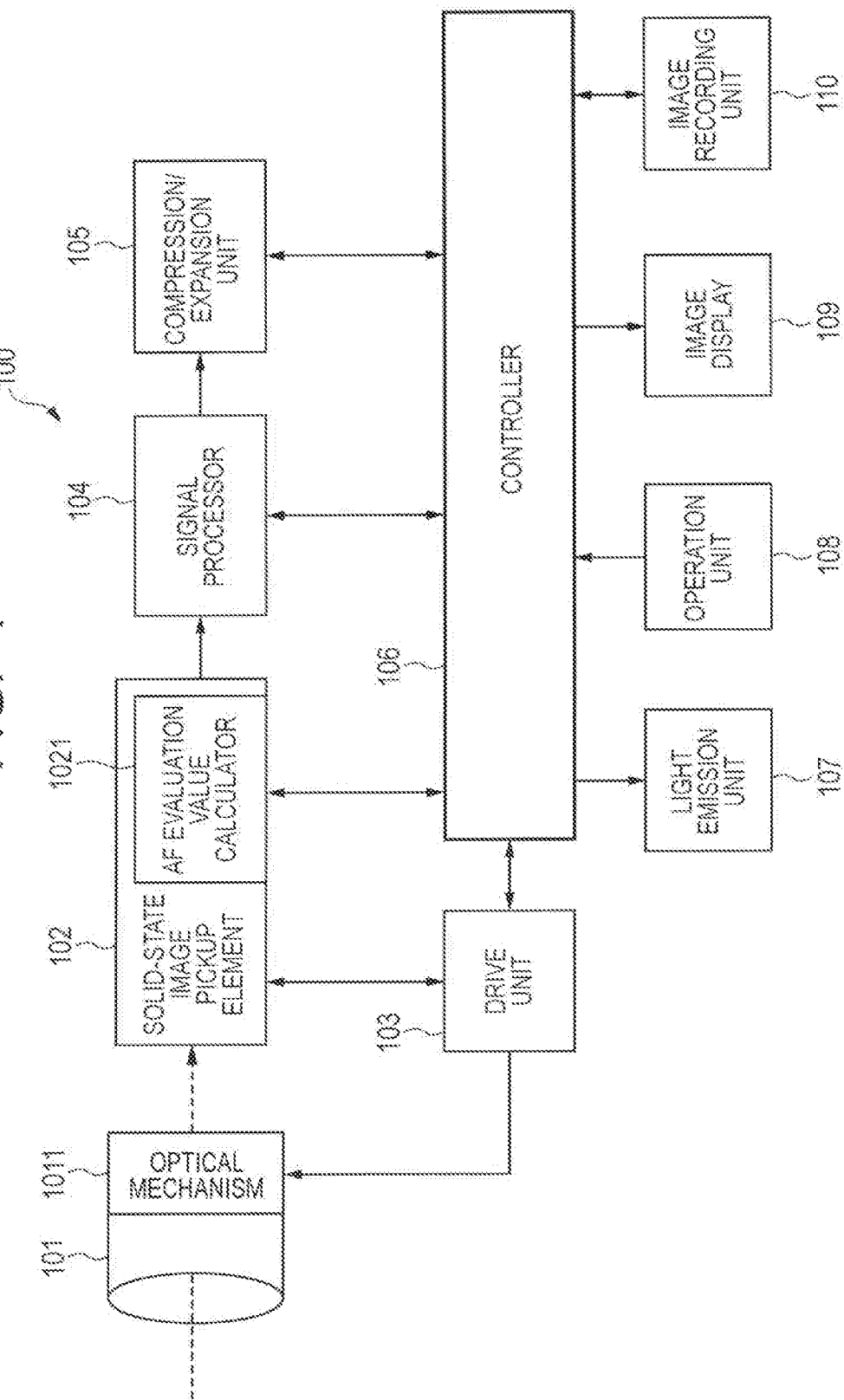
FIG. 1 is a block diagram for illustrating a configuration of an image pickup apparatus according to a first embodiment.

A solid-state image pickup element, a method of controlling a solid-state image pickup element, and an image pickup apparatus according to a first embodiment are described with reference to FIG. 1 to FIG. 7. FIG. 1 is a block diagram for illustrating a configuration of the image pickup apparatus according to the first embodiment. Description is given here of an example of a case in which an image pickup apparatus 100 according to the first embodiment is an electronic camera, that is, a digital camera, which is capable of acquiring a moving image and a still image, but the present invention is not limited thereto.

As illustrated in FIG. 1, the image pickup apparatus 100 includes an image pickup optical system 101, a solid-state image pickup element 102, a drive unit 103, a signal processor 104, a compression/expansion unit 105, a controller 106, a light emission unit 107, an operation unit 108, an image display 109, and an image recording unit 110.

The image pickup optical system (lens unit) 101 includes a lens group for condensing light reflected from an object to the solid-state image pickup element 102. The lens group includes a focus lens and a zoom lens. The lens group and microlenses ML (see FIG. 3A to FIG. 4B) to be described later are combined to construct the image pickup optical system. The image pickup optical system 101 includes an optical mechanism 1011 including an AF mechanism, a zoom drive mechanism, a mechanical shutter mechanism, and a diaphragm mechanism. The optical mechanism 1011 is driven by the drive unit (drive circuit) 103 based on a control signal output from the controller 106.

The solid-state image pickup element 102 includes pixels 201 to be described later and an A/D converter (not shown). The solid-state image pickup element 102 is, for example, an XY-readout-type CMOS image sensor. The solid-state image pickup element 102 is driven by the drive unit 103 based on a control signal output from the controller 106. The solid-state image pickup element 102 performs image pickup operations such as exposure and accumulation, signal readout, and reset, to output signals acquired by the image pickup operations, that is, image pickup signals (hereinafter also referred to as "image signals" and "image data"). The solid-state image pickup element 102 includes an AF evaluation value calculator 1021. The AF evaluation value calculator 1021 calculates an AF evaluation value, that is, a phase difference evaluation value and a contrast evaluation value, based on the signals acquired by the solid-state image pickup element 102, to output the calculated AF evaluation value to the controller 106.

The signal processor 104 is controlled by the controller 106 to subject the image signals acquired by the solid-state image pickup element 102 to predetermined signal processing such as white balance adjustment processing, color correction processing, and auto-exposure (AE) processing.

The compression/expansion unit 105 operates under control of the controller 106. The compression/expansion unit 105 subjects the image signals transmitted from the signal processor 104 to compression encoding processing, to thereby generate encoded image data. In the compression encoding processing, a predetermined still image data format, for example, a joint photographic coding experts group (JPEG) method, is used. Further, the compression/expansion unit 105 subjects the encoded image data transmitted from the controller 106 to expansion decoding processing, to thereby obtain decoded image data. The compression/expansion unit 105 can also subject moving image data to the compression encoding processing or the expansion decoding processing. In the compression encoding processing or the expansion decoding processing with respect to the moving image data, for example, a moving picture experts group (MPEG) method is used.

The controller 106 includes, for example, a central processor (CPU), a read only memory (ROM), and a random access memory (RAM). The CPU executes a program stored in the ROM or the like so that the controller 106 may generally control the entire image pickup apparatus 100.

When it is determined in the AE processing performed by the signal processor 104 that an exposure value of an object is low, the controller 106 controls the light emission unit 107 to emit light toward the object for illumination of the object. As the light emission unit 107, for example, a stroboscopic device using a xenon tube or an LED light emitting device is used.

The operation unit 108 is, for example, various operation keys including a shutter release button, a lever, a dial, or a touch panel. The operation unit 108 transmits an operation signal corresponding to the operation input performed by a user to the controller 106.

The image display 109 includes a display device (not shown), for example, a liquid crystal display (LCD), and an interface (not shown) for the display device. The image display 109 displays an image corresponding to the image data transmitted from the controller 106 on a display screen of the display device.

As the image recording unit 110, a storage medium, for example, a portable semiconductor memory, an optical disc, a hard disk drive (HDD), or a magnetic tape, is used. The encoded image data subjected to the compression encoding processing by the compression/expansion unit 105 is recorded in the image recording unit 110 as an image file. The image recording unit 110 reads out the image file designated by the controller 106 from the storage medium to output the image file to the controller 106. The controller 106 causes the compression/expansion unit 105 to perform the expansion decoding processing on the encoded image data read out from the image recording unit 110, to thereby obtain the decoded image data.

Next, a basic operation of the image pickup apparatus 100 according to the first embodiment is described. For example, when a still image is to be taken, the solid-state image pickup element 102 operates as follows before the still image is taken. Specifically, the solid-state image pickup element 102 sequentially subjects the image signals output from the pixels 201 to be described later to CDS processing and AGC processing, and converts the image signals subjected to the processing into digital image signals with use of the A/D converter. CDS is an abbreviation for correlated double sampling. Further, AGC is an abbreviation for automatic gain control. The digital image signals thus obtained are transmitted to the AF evaluation value calculator 1021 and the signal processor 104.

The AF evaluation value calculator 1021 calculates the AF evaluation value including the phase difference evaluation value and the contrast evaluation value based on the image signals acquired by the solid-state image pickup element 102, to output the calculated AF evaluation value to the controller 106. The controller 106 determines a feedback control amount, that is, a focus lens drive amount based on the AF evaluation value, to output the determined feedback control amount to the drive unit 103. The drive unit 103 drives the focus lens with use of the AF mechanism of the optical mechanism 1011 based on the feed-back control amount transmitted from the controller 106.

The signal processor 104 subjects the digital image signals output from the solid-state image pickup element 102 to, for example, image quality correction processing, to thereby generate, for example, a camera-through image signal, that is, a live view image signal. The signal processor 104 transmits the generated live view image signal to the image display 109 via the controller 106. The image display 109 displays a live view image corresponding to the live view image signal. The user can adjust the angle of view (perform framing) while viewing the live view image displayed on the image display 109.

When the user depresses the shutter release button of the operation unit 108 under a state in which the live view image is displayed on the image display 109, the controller 106 performs the following processing. Specifically, the controller 106 causes the drive unit 103 to control the solid-state image pickup element 102 so that image pickup signals of one frame, that is, digital image signals of one frame, are transmitted from the solid-state image pickup element 102 to the signal processor 104. The signal processor 104 subjects the digital image signals of one frame, which are transmitted from the solid-state image pickup element 102, to, for example, image quality correction processing, to thereby transmit the digital image signals subjected to the image quality correction processing, that is, image data, to the compression/expansion unit 105. The compression/expansion unit 105 subjects the image data to compression encoding processing to obtain encoded image data. The encoded image data obtained by the compression/expansion unit 105 is transmitted to the image recording unit 110 via the controller 106. Thus, the image file of the still image acquired with use of the solid-state image pickup element 102 is recorded in the image recording unit 110.

When the image file of the still image recorded in the image recording unit 110 is to be reproduced, the controller 106 performs the following processing. Specifically, the controller 106 reads out the image file that is selected by the user via the operation unit 108 from the image recording unit 110. Then, the controller 106 transmits the image file read out from the image recording unit 110 to the compression/expansion unit 105. The compression/expansion unit 105 subjects the image file to expansion decoding processing to obtain decoded image data. The controller 106 transmits the decoded image data obtained by the compression/expansion unit 105 to the image display 109. The image display 109 displays a still image corresponding to the decoded image data.

When the moving image data is to be recorded, the controller 106 performs the following processing. Specifically, the controller 106 causes the drive unit 103 to control the solid-state image pickup element 102 so that the digital image signals, which are sequentially output from the solid-state image pickup element 102, may be sequentially input to the signal processor 104. The signal processor 104 sequentially subjects the sequentially-input digital image signals to predetermined image processing, to thereby generate image data, that is, moving image data. The compression/expansion unit 105 subjects the moving image data to compression encoding processing to obtain encoded moving image data. The encoded moving image data obtained by the compression/expansion unit 105 is sequentially transferred to the image recording unit 110 via the controller 106, to thereby be recorded in the image recording unit 110 as a moving image file.

When the moving image file recorded in the image recording unit 110 is to be reproduced, the controller 106 performs the following processing. Specifically, the controller 106 reads out the moving image file that is selected by the user via the operation unit 108 from the image recording unit 110. The controller 106 transmits the moving image file read out from the image recording unit 110 to the compression/expansion unit 105. The compression/expansion unit 105 subjects the moving image file to expansion decoding processing to obtain decoded moving image data. The controller 106 transmits the decoded moving image data obtained by the compression/expansion unit 105 to the image display 109. The image display 109 displays a moving image corresponding to the decoded moving image data.

Figure 2A:
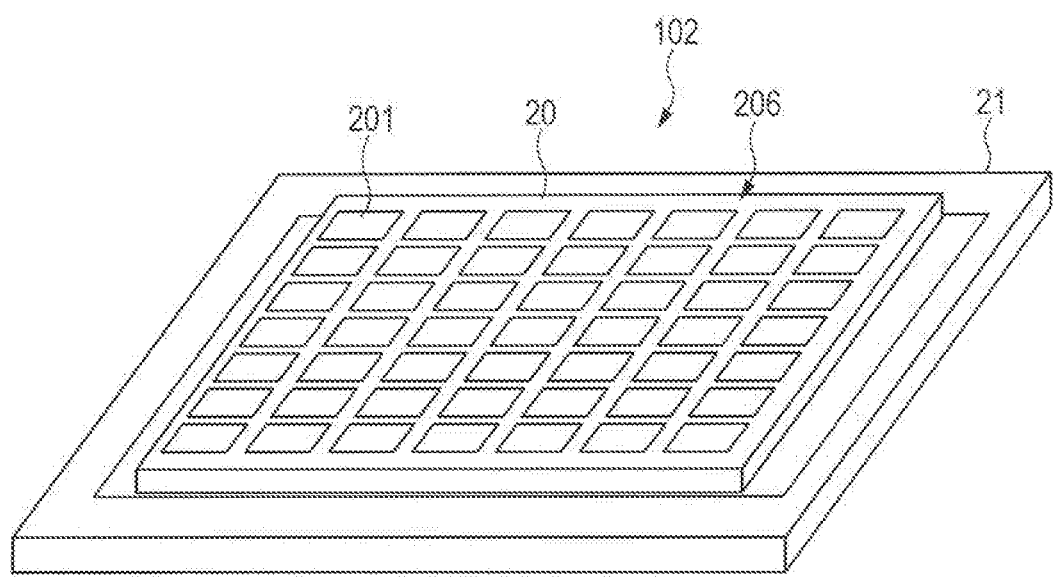
FIG. 2A is a perspective view for illustrating a structure of a solid-state image pickup element according to the first embodiment.

FIG. 2A is a perspective view for illustrating a structure of the solid-state image pickup element included in the image pickup apparatus according to the first embodiment. As illustrated in FIG. 2A, the solid-state image pickup element 102 according to the first embodiment is a stacked image sensor including a first semiconductor chip (a first semiconductor substrate) 20 and a second semiconductor chip (a second semiconductor substrate) 21, in which the first semiconductor chip 20 is stacked on the second semiconductor chip 21. The first semiconductor chip 20 includes a pixel array 206 in which the plurality of pixels (pixel portions) 201 are arrayed in a two-dimensional matrix manner, that is, a row-column manner. The first semiconductor chip 20 is arranged on a light entering side with respect to the second semiconductor chip 21. That is, the first semiconductor chip 20 is positioned on an optical image reception side with respect to the second semiconductor chip 21. The second semiconductor chip 21 has formed thereon a pixel drive circuit (readout circuit, readout unit) including column scanning circuits 213a and 213b and a row scanning circuit 212 to be described later. The second semiconductor chip 21 further has the AF evaluation value calculator 1021 formed thereon.

In the first embodiment, the first semiconductor chip 20 on which the pixels 201 are formed and the second semiconductor chip 21 on which peripheral circuits are formed are different semiconductor chips, and hence a process of forming the pixels 201 and a process of forming the peripheral circuits are separated. Therefore, in the first embodiment, the peripheral circuits or the like may have thinner wiring and higher density, and thus the solid-state image pickup element 102 may be increased in speed, downsized, and sophisticated in function.

Figure 2C:
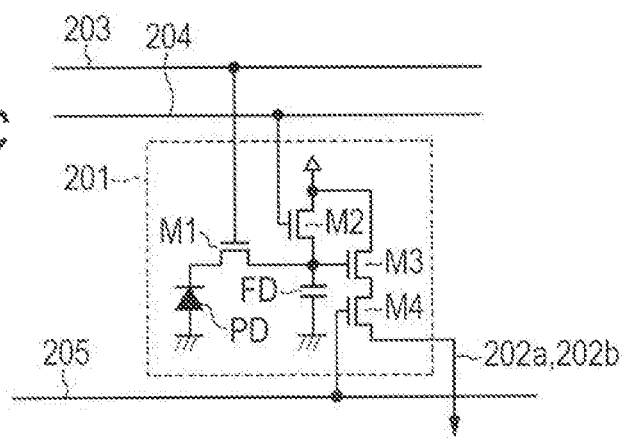

FIG. 2B and FIG. 2C are circuit diagrams for illustrating the solid-state image pickup element according to the first embodiment. FIG. 2C is a circuit diagram for illustrating the configuration of the pixel 201. As illustrated in FIG. 2B, the plurality of pixels 201 arrayed in a two-dimensional matrix manner are formed on the first semiconductor chip 20. Each of the pixels 201 is connected to a transfer signal line 203, a reset signal line 204, and a row selection signal line 205 in a horizontal direction, and is connected to a column signal line 202a or a column signal line 202b in a vertical direction. The pixel 201 connected to the column signal line 202a or 202b differs depending on a readout row. That is, the pixel 201 located in a row including pixels 201SHA and 201SHB (see FIG. 4A) for phase difference detection (for focus detection) to be described later, that is, a phase difference AF row (AF row), is connected to the column signal line 202b. Meanwhile, the pixel 201 located in a row not including the pixels 201SHA and 201SHB for phase difference detection, that is, a normal row, is connected to the column signal line 202a.

As illustrated in FIG. 2C, the pixel 201 includes a photoelectric converter (photodiode) PD, a transfer transistor M1, a reset transistor M2, an amplification transistor M3, a selection transistor M4, and a floating diffusion FD. As the transistors M1 to M4, for example, re-channel MOS field-effect transistors (MOSFETs) are used.

The transfer signal line 203 is connected to a gate of the transfer transistor M1. The reset signal line 204 is connected to a gate of the reset transistor M2. The row selection signal line 205 is connected to a gate of the selection transistor M4. Those signal lines 203 to 205 extend in the horizontal direction, and pixels 201 located in the same row are driven simultaneously. In this manner, an operation of a line sequential operation rolling shutter or an all-row simultaneous operation global shutter can be achieved. Further, the column signal line 202a or the column signal line 202b is connected to a source of the selection transistor M4.

The photoelectric converter PD generates charges through photoelectric conversion. An anode side of the photoelectric converter PD is grounded, and a cathode side of the photoelectric converter PD is connected to a source of the transfer transistor M1. When the transfer transistor M1 is turned on, the charges of the photoelectric converter PD are transferred to the floating diffusion FD. The floating diffusion FD has a parasitic capacitance, and hence the charges transferred from the photoelectric converter PD are accumulated in the floating diffusion FD.

A power supply voltage Vdd is applied to a drain of the amplification transistor M3, and a gate of the amplification transistor M3 is connected to the floating diffusion FD. The gate of the amplification transistor M3 has a potential corresponding to the charges accumulated in the floating diffusion FD. The selection transistor M4 is used to select the pixel 201 from which a signal is read out, and a drain of the selection transistor M4 is connected to a source of the amplification transistor M3. Further, the source of the selection transistor M4 is connected to the column signal line 202a or the column signal line 202b. When the selection transistor M4 is turned on, an output signal corresponding to the potential of the gate of the amplification transistor M3 is output to the column signal line 202a or the column signal line 202b. The power supply voltage Vdd is applied to a drain of the reset transistor M2, and a source of the reset transistor M2 is connected to the floating diffusion FD. When the reset transistor M2 is turned on, the potential of the floating diffusion FD is reset to the power supply voltage Vdd.

The second semiconductor chip 21 includes AD conversion units (column ADC blocks) 211. Each of the AD conversion units 211 is connected to the column signal line 202a or the column signal line 202b. The second semiconductor chip 21 further includes the row scanning circuit 212 that scans respective rows, and the column scanning circuit 213a and 213b that scan respective columns. The second semiconductor chip 21 further includes a timing control circuit 214 that controls the operation timing of each of the row scanning circuit 212, the column scanning circuits 213a and 213b, and the AD conversion units 211 based on a control signal output from the controller 106. The second semiconductor chip 21 further includes horizontal signal lines 215a and 215b for transferring signals from the AD conversion units 211 in accordance with the timing controlled by the column scanning circuits 213a and 213b.

The second semiconductor chip 21 further includes a switch (signal switch) 216 that switches an output destination of the digital image signals output via the horizontal signal line 215b. When the switch 216 has a first setting, the output destination of the digital image signals output via the horizontal signal line 215b is set to a phase difference evaluation value calculator 217 of the AF evaluation value calculator 1021. Meanwhile, when the switch 216 has a second setting, the output destination of the digital image signals output via the horizontal signal line 215b is set to a contrast evaluation value calculator 218 of the AF evaluation value calculator 1021 and the signal processor 104.

As described above, the pixel 201 located in the row not including the pixels 201SHA and 201SHB for phase difference detection, that is, the normal row, is connected to the column signal line 202a. Therefore, a signal acquired by the pixel 201 located in the normal row is output to the signal processor 104 via the column signal line 202a and the horizontal signal line 215a. The signal acquired by the pixel 201 located in the normal row is used for, for example, an image for live view.

Meanwhile, as described above, the pixel 201 located in the row including the pixels 201SHA and 201SHB for phase difference detection, that is, the phase difference AF row, is connected to the column signal line 202b. Therefore, signals SHA or SHB acquired by the pixels 201 located in the phase difference AF row are transferred via the column signal lines 202b and the horizontal signal line 215b. The signals SHA or SHB acquired by the pixels 201SHA or 201SHB for phase difference detection, which are located in the phase difference AF row, are transferred to the phase difference evaluation value calculator 217 via the column signal lines 202b and the horizontal signal line 215b. Incidentally, in the phase difference AF row, not only the pixels 201SHA and 201SHB for phase difference detection but also pixels 201G for image pickup are located (see FIG. 4A). When pixels having specific spectral sensitivity like red (R), green (G), and blue (B) are described, reference symbols of 201R, 201G, and 201B are used, respectively. Further, when the pixels for the phase difference detection are described, reference symbols of 201SHA and 201SHB are used. Further, when general pixels are described, a reference symbol of 201 is used. Signals Gr and Gb acquired by the pixels 201G for image pickup among the pixels 201 located in the phase difference AF row are transmitted to the contrast evaluation value calculator 218 via the column signal lines 202b and the horizontal signal line 215b. Further, the signals Gr and Gb acquired by the pixels 201G located in the phase difference AF row are transmitted to the signal processor 104. For example, at the time of live view display, the signals Gr and Gb acquired by the pixels 201G for image pickup, which are located in the phase difference AF row, may be used for interpolation processing of an image signal for live view display, which is read out while being decimated. A signal transferred to the horizontal signal line 215a from the pixel 201 located in the normal row is referred to as "first image signal". Further, a signal transferred to the horizontal signal line 215b from the pixel 201 located in the phase difference AF row is referred to as "second image signal".

FIG. 5 is a diagram for illustrating an example of rows selected at the time of readout in the solid-state image pickup element according to the first embodiment. FIG. 5 is an illustration of pixels 201 in 16 rows and 6 columns extracted from the plurality of pixels 201 arranged in matrix. Those pixels 201 form a Bayer arrangement. In the first embodiment, in order that acquisition of the first image signals and acquisition of the second image signals can be performed in parallel, rows selected when the first image signals are to be acquired and rows selected when the second image signals are to be acquired are each set. The first image signals are output to the column signal line 202a. Meanwhile, the second image signals are output to the column signal line 202b. The rows having the row numbers of 1 and 2 and the rows having the row numbers of 9 and 10 are the rows selected when the second image signals are to be acquired, which include a pixel group (second pixel group) for acquiring the second image signals. The rows having the row numbers of 3 to 8 and the rows having the row numbers of 11 to 16 are the rows selected when the first image signals are to be acquired, which include a pixel group (first pixel group) for acquiring the first image signals.

The second image signals include signals acquired by the pixels 201SHA and 201SHB for phase difference detection, and hence increasing the frame rate becomes important to achieve a fast autofocus. Therefore, the second image signals are set to have a relatively high decimation ratio. Meanwhile, the first image signals are used for live view display and the like, and hence the image quality becomes important. Therefore, the first image signals are set to have a relatively low decimation ratio. Focusing on the rows having the row numbers of 1 to 8, the first image signals are obtained by decimating one pixel among the four same-color pixels arranged in the vertical direction, and the second image signals are obtained by decimating three pixels among the four same-color pixels arranged in the vertical direction. When the first image signals are to be acquired, the first pixel group is read out at a first frame rate. When the second image signals are to be acquired, the second pixel group is read out at a second frame rate that is higher than the first frame rate. Description is given here of an example of a case in which the second frame rate is three times as high as the first frame rate.

As described above, in the first embodiment, the rows from which the first image signals are read out and the rows from which the second image signals are read out are separately set. Therefore, according to the first embodiment, the first image signal and the second image signal having different charge accumulation time periods, different data sizes, and different frame rates can be acquired in parallel. Description has been given of an example of a case in which the second pixel group for acquiring the second image signals is located in the rows having the row numbers of 1 and 2, and the first pixel group for acquiring the first image signals is located in the rows having the row numbers of 3 to 8, but the present invention is not limited thereto. Further, the decimation ratio for the readout can be set as appropriate.

The analog signal output from the pixel 201 to the column signal line 202a or the column signal line 202b is converted from analog to digital in the AD conversion unit 211. The column scanning circuit 213a transmits the digital first image signal output from the AD conversion unit 211 to the signal processor 104 via the horizontal signal line 215a. The first image signal is output to the signal processor 104 via an output terminal 222 of the solid-state image pickup element 102. Further, the column scanning circuit 213b transmits the digital second image signal output from the AD conversion unit 211 to the AF evaluation value calculator 1021 or the signal processor 104 via the horizontal signal line 215b.

The controller 106 uses the signal output from the phase difference evaluation value calculator 217 of the solid-state image pickup element 102, that is, the phase difference evaluation value, to perform autofocus control by the phase difference detection method, that is, phase difference focus control (phase difference AF). The controller 106 also uses the signal output from the contrast evaluation value calculator 218 of the solid-state image pickup element 102, that is, the contrast evaluation value, to perform autofocus control by the contrast detection method, that is, contrast focus control (contrast AF).

The phase difference evaluation value calculator 217 performs correlation calculation with respect to a pair of image signals generated by the signals SHA and SHB output from the plurality of pixels 201SHA and 201SHB for phase difference detection, which are located in the phase difference AF row, to thereby calculate a phase difference representing a relative deviation between the pair of image signals. Then, the phase difference evaluation value calculator 217 calculates a defocus amount Df, which represents an amount of out-of-focus, based on the phase difference. The controller 106 calculates, based on the defocus amount Df obtained by the phase difference evaluation value calculator 217, the amount to move the focus lens in order to obtain a state close to an in-focus state, that is, a focus lens drive amount to a position near an in-focus position. The controller 106 causes the drive unit 103 to control the optical mechanism 1011 so that the focus lens is moved by the calculated drive amount.

The contrast evaluation value calculator 218 calculates the contrast evaluation value by extracting, as appropriate, high-frequency components in the signals Gr and Gb output from the pixels 201G for image pickup, which are located in the phase difference AF row. The controller 106 causes the drive unit 103 to control the optical mechanism 1011 based on the contrast evaluation value obtained by the contrast evaluation value calculator 218 so that the focus lens is driven as appropriate.

Figure 3B:
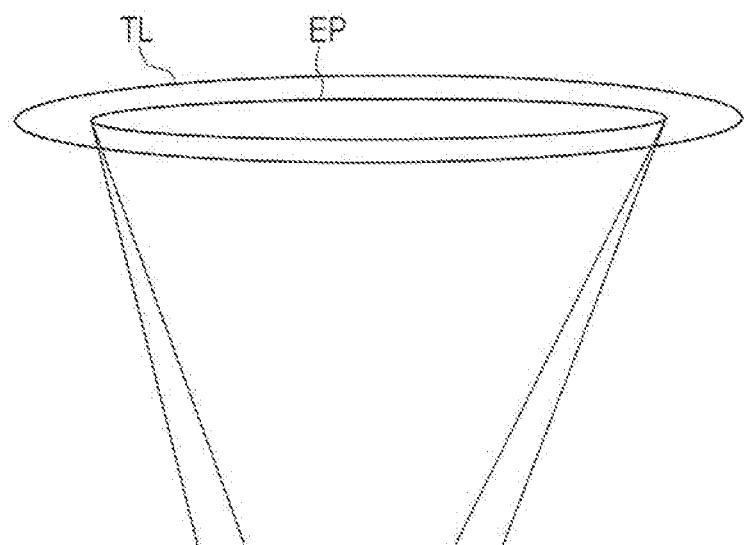
FIG. 3A and FIG. 3B are diagrams for illustrating pixels arranged in a normal row and an image pickup optical system.
Figure 3A:
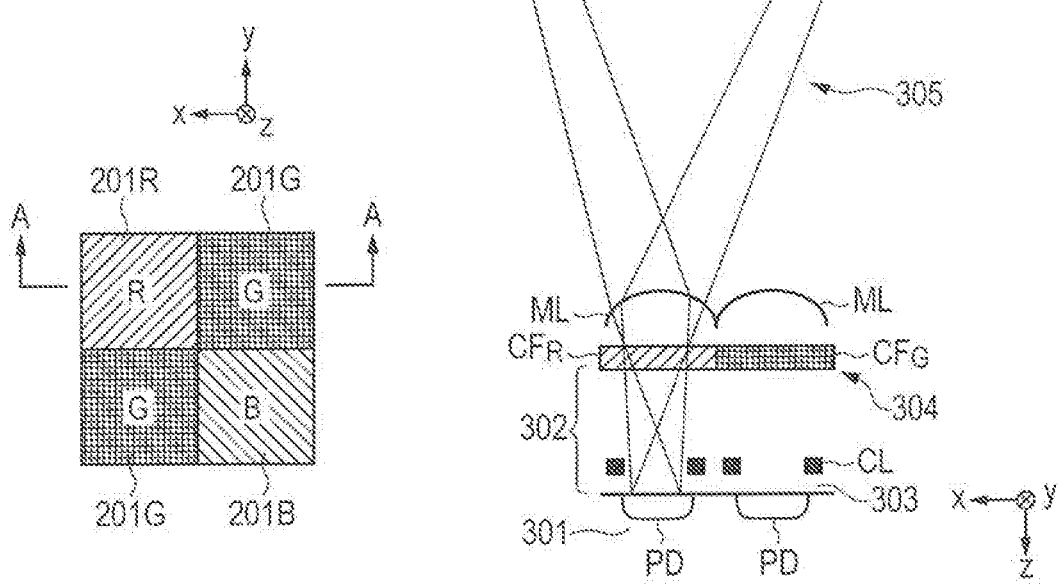

FIG. 3A and FIG. 3B are diagrams for illustrating the pixels and the image pickup optical system. FIG. 3A is a plan view for illustrating the pixels. The four pixels 201 arranged in two rows and two columns illustrated in FIG. 3A are all pixels for image pickup. At two locations at the opposing corners of the four pixels 201, pixels 201G having spectral sensitivity of green (G) are arranged, and pixels 201R and 201B having spectral sensitivity of red (R) and blue (B) are arranged at the two remaining locations. Such a pixel arrangement is referred to as "Bayer arrangement". FIG. 3A is an illustration of one pixel unit being extracted from the Bayer arrangement. FIG. 3B is a sectional view for illustrating the relationship between the image pickup optical system and the pixels. FIG. 3B corresponds to a cross section taken along the line A-A of FIG. 3A.

As illustrated in FIG. 3B, the photoelectric converters PD are formed in a semiconductor substrate 301 of the first semiconductor chip 20 of the solid-state image pickup element 102. The photoelectric converters PD are formed so as to correspond to the respective plurality of pixels 201 formed in matrix. A multi-layer wiring structure 302 is formed on the semiconductor substrate 301 having the photoelectric converters PD formed therein. The multi-layer wiring structure 302 includes a wiring layer CL and an insulating layer 303. The wiring layer CL forms signal lines for transmitting various signals in the solid-state image pickup element 102. A color filter layer 304 is formed on the multi-layer wiring structure 302. The color filter layer 304 includes a red (R) color filter $CF_R$, a green (G) color filter $CF_G$, and a blue (B) color filter $CF_B$. Those color filters $CF_R$, $CF_G$, and $CF_B$ are formed so as to correspond to the respective pixels 201. In FIG. 3A, R conceptually represents a location where the R color filter $CF_R$ is arranged, G conceptually represents a location where the G color filter $CF_G$ is arranged, and B conceptually represents a location where the B color filter $CF_B$ is arranged.

On the color filter layer 304, the microlenses ML, that is, on-semiconductor chip microlenses, are arranged. The microlenses ML are formed so as to correspond to the respective pixels 201. The microlenses ML and the photoelectric converters PD are configured such that light fluxes 305 passing through an exit pupil EP of an image pickup optical system TL can be introduced as effectively as possible. In other words, the microlenses ML are formed so that a conjugate relationship is satisfied between the exit pupil EP of the image pickup optical system TL and the photoelectric converters PD. Further, an effective area of the photoelectric converter PD is designed to be large. In FIG. 3B, the light fluxes 305 entering the R pixel 201 are illustrated as an example, but there are similarly light fluxes entering the G pixel 201 and light fluxes entering the B pixel 201. As described above, the exit pupil EP corresponding to the RGB pixels 201 for image pickup has a large diameter, and thus the light fluxes from the object reach the pixels 201 efficiently. Therefore, an image signal having a high S/N ratio can be obtained in each of the pixels 201.

Figure 4A:
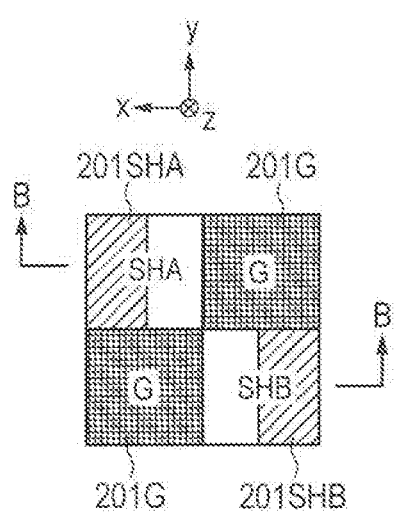
FIG. 4A and FIG. 4B are diagrams for illustrating pixels arranged in a phase difference AF row and the image pickup optical system.
Figure 4B:
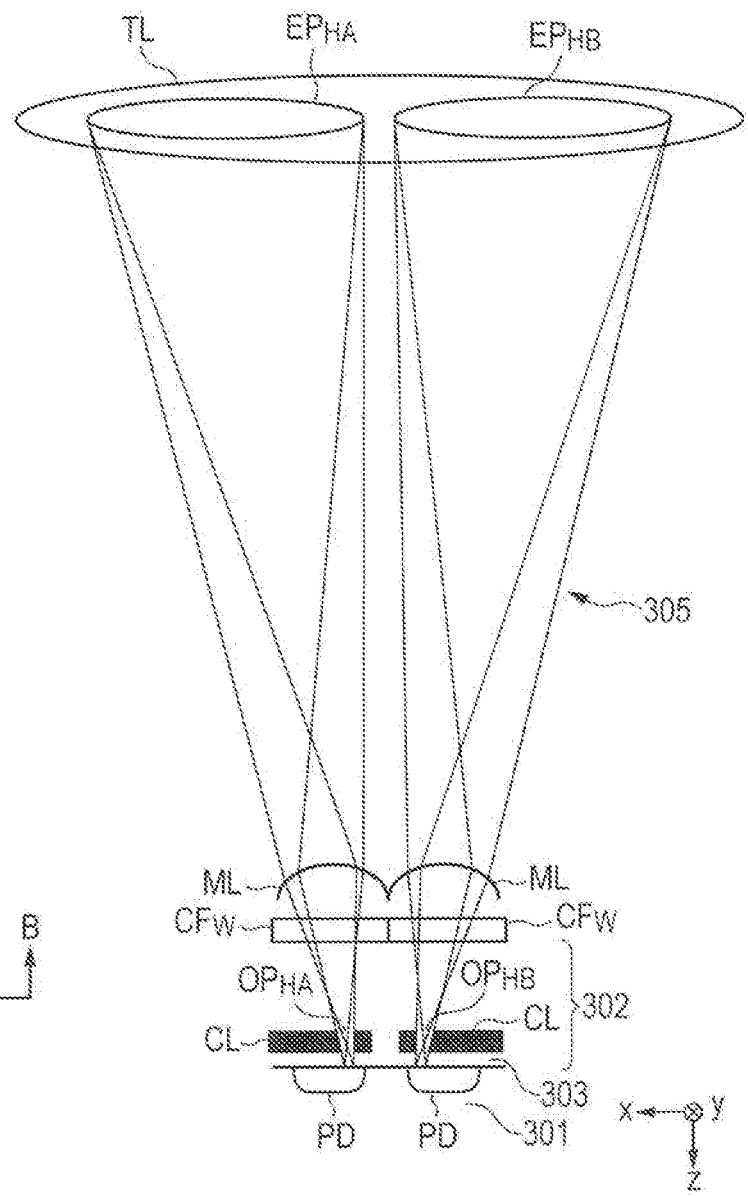

FIG. 4A and FIG. 4B are diagrams for illustrating the pixels and the image pickup optical system. FIG. 4A is a plan view of the pixels. When an image signal is to be obtained, the output from the pixel 201G having the spectral sensitivity of G is a main component of brightness information. Human image recognition characteristics are sensitive to brightness information, and hence when the output from the pixel 201G having the spectral sensitivity of G is defective, the image quality deterioration is easily recognized. Meanwhile, the R pixel 201R (see FIG. 3A and FIG. 3B) and the B pixel 201B (see FIG. 3A and FIG. 3B) are pixels mainly for acquiring color information, and humans are relatively insensitive to color information. Therefore, even when the R and B pixels 201R and 201B for acquiring the color information are slightly defective, humans are less liable to notice the image quality deterioration. In view of this, in the first embodiment, two G pixels 201G among the four pixels 201 arranged in two rows and two columns are left as the pixels for image pickup, and the pixels 201SHA and 201SHB for phase difference detection are arranged at positions of the R pixel 201R and the B pixel 201B, respectively.

In FIG. 4A, SHA conceptually represents the pixel 201SHA for phase difference detection, which is arranged at the position of the R pixel 201R, and SHB conceptually represents the pixel 201SHB for phase difference detection, which is arranged at the position of the B pixel 201B. As described above, in the phase difference AF row, the pixels 201SHA and 201SHB for phase difference detection are dispersedly arranged. Further, as described above, in the phase difference AF row, not only the pixels 201SHA and 201SHB for phase difference detection but also the pixels 201G for image pickup are located. The plurality of pixels 201SHA for phase difference detection construct a first pixel group for phase difference detection. The plurality of pixels 201SHB for phase difference detection construct a second pixel group for phase difference detection.

FIG. 4B corresponds to a cross section taken along the line B-B of FIG. 4A. Also in the pixels 201SHA and 201SHB for phase difference detection, similarly to the pixels 201R, 201G, and 201B for image pickup, the photoelectric converters PD are formed in the semiconductor substrate 301. The signals from the pixels 201SHA and 201SHB for phase difference detection are not used for the image, and hence transparent films (white films) $CF_W$ are arranged for the pixels 201SHA and 201SHB for phase difference detection instead of the color filters $CF_R$ and $CF_B$ for color separation. In the pixels 201SHA and 201SHB for phase difference detection, the wiring layer CL constructs a light shielding portion having opening portions $OP_{HA}$ and $OP_{HB}$ in order to achieve pupil separation.

In order to obtain pupil separation in an x direction, the opening portions $OP_{HA}$ and $OP_{HB}$ are each deviated in the x direction with respect to the center of the microlens ML. The opening portion $OP_{HA}$ of the pixel 201SHA for phase difference detection is deviated in a −x direction with respect to the center of the microlens ML. Therefore, the photoelectric converter PD of the pixel 201SHA for phase difference detection receives the light flux that has passed through a +x-side pupil region, that is, a first pupil region $EP_{HA}$, of a plurality of pupil regions $EP_{HA}$ and $EP_{HB}$ included in the exit pupil of the image pickup optical system TL.

The pixel 201SHA acquires a signal corresponding to the light flux passing through the first pupil region $EP_{HA}$ of the exit pupil of the image pickup optical system TL. Meanwhile, the opening portion $OP_{HB}$ of the pixel 201SHB for phase difference detection is deviated in the +x direction with respect to the center of the microlens ML. Therefore, the photoelectric converter PD of the pixel 201SHB for phase difference detection receives the light flux that has passed through a −x-side pupil region, that is, a second pupil region $EP_{HB}$, of the plurality of pupil regions $EP_{HA}$ and $EP_{HB}$ included in the exit pupil of the image pickup optical system TL. The pixel 201SHB acquires a signal corresponding to the light flux passing through the second pupil region $EP_{HB}$ of the exit pupil of the image pickup optical system TL.

An object image acquired by the plurality of pixels 201SHA for phase difference detection regularly arranged in the x direction, that is, the first pixel group for phase difference detection, is referred to as "first image". Further, an object image acquired by the plurality of pixels 201SHB for phase difference detection regularly arranged in the x direction, that is, the second pixel group for phase difference detection, is referred to as "second image". Further, a relative deviation amount between the first image and the second image, that is, the phase difference, is detected so that the defocus amount Df of the focus lens with respect to the object can be calculated based on the phase difference.

Signals output from the pixels 201 to the column signal lines 202a and 202b are converted from analog to digital by the AD conversion units 211. The signals converted into digital by the AD conversion units 211 are output from the AD conversion units 211 to the horizontal signal lines 215a and 215b by the column scanning circuits 213a and 213b, respectively. The signals output to the horizontal signal line 215a, that is, the signals from the pixels 201 located in the normal row, are output to the signal processor 104 located outside of the solid-state image pickup element 102. Meanwhile, the signals output to the horizontal signal line 215b are output via the switch 216. When the switch 216 has the first setting, the signals SHA and SHB from the pixels 201SHA and 201SHB for phase difference detection are output to the phase difference evaluation value calculator 217. When the switch 216 has the second setting, the signals from the pixels 201 for image pickup, which are located in the phase difference AF row, are output to the contrast evaluation value calculator 218 and the signal processor 104.

The phase difference evaluation value calculator 217 calculates the phase difference evaluation value through correlation calculation based on the signals SHA and SHB transmitted to the phase difference evaluation value calculator 217 via the horizontal signal line 215b and the switch 216. That is, the phase difference evaluation value calculator 217 calculates the phase difference evaluation value for focus detection by the phase difference detection method based on the signals SHA and SHB from the pixels 201SHA and 201SHB. The phase difference evaluation value calculator 217 outputs the phase difference evaluation value to the controller 106 as soon as the calculation of the phase difference evaluation value is completed regardless of whether or not the output of the image signal acquired by the pixel array 206 to the signal processor 104 is completed. The phase difference evaluation value is output to the controller 106 via an output terminal 219 of the solid-state image pickup element 102.

The contrast evaluation value calculator 218 calculates the contrast evaluation value through contrast calculation based on the signals transmitted to the contrast evaluation value calculator 218 via the horizontal signal line 215b and the switch 216, more specifically, for example, the signals Gr and Gb. That is, the contrast evaluation value calculator 218 calculates the contrast evaluation value for focus detection by the contrast detection method based on the signals Gr and Gb from the pixels 201G for image pickup. The contrast evaluation value calculator 218 outputs the contrast evaluation value to the controller 106 as soon as the calculation of the contrast evaluation value is completed regardless of whether or not the output of the image signal acquired by the pixel array 206 to the signal processor 104 is completed. The contrast evaluation value is output to the controller 106 via an output terminal 220 of the solid-state image pickup element 102.

As described above, when the switch 216 has the second setting, the signals Gr and Gb from the pixels 201G for image pickup, which are located in the phase difference AF row, are output to the signal processor 104 via the horizontal signal line 215b and the switch 216. The signals Gr and Gb are output to the signal processor 104 via an output terminal 221 of the solid-state image pickup element 102. The signals Gr and Gb transmitted to the signal processor 104 via the horizontal signal line 215b and the switch 216 may be used for, for example, interpolation processing of the live view image that is read out while being decimated.

In this case, a path through which the first image signal is output via the column signal line 202a and the horizontal signal line 215a is referred to as "first channel CH1", and a path through which the second image signal is output via the column signal line 202b and the horizontal signal line 215b is referred to as "second channel CH2".

Figure 6:
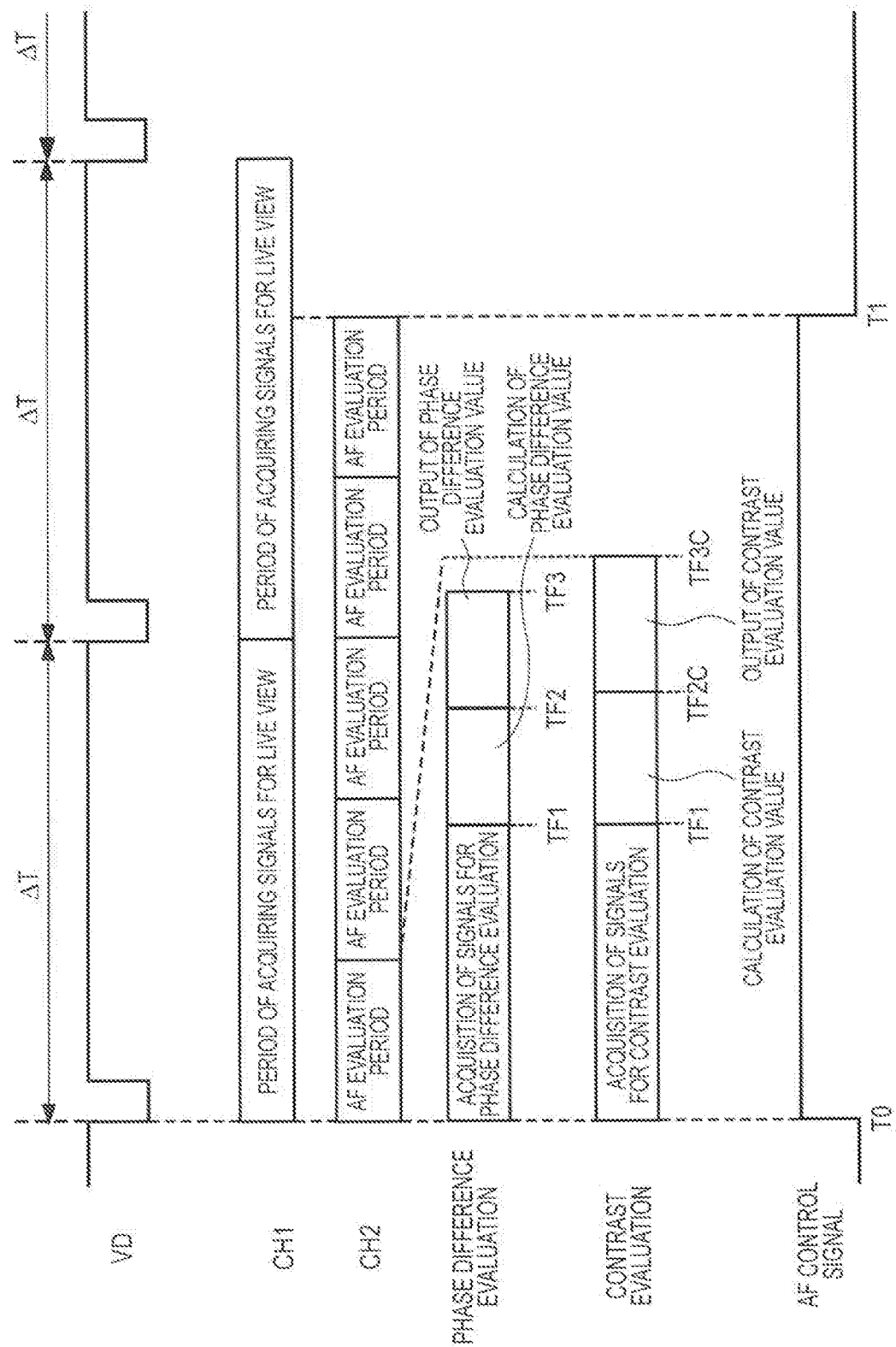
FIG. 6 is a time chart for illustrating an operation of the image pickup apparatus according to the first embodiment.

FIG. 6 is a time chart for illustrating an operation of the image pickup apparatus according to the first embodiment. FIG. 6 is an illustration of an operation in a mode in which live view display is performed while an autofocus operation is performed, that is, an AF evaluation mode.

The AF evaluation mode is started when an AF control signal from the controller 106 is turned on. A timing at which the AF control signal is turned on is set to T0. At the timing T0, a vertical synchronization signal VD falls, that is, the level changes from a High level to a Low level. In synchronization with the vertical synchronization signal VD, acquisition of the first image signals, that is, the signals from the pixels 201 located in the normal row, and acquisition of the second image signals, that is, the signals from the pixels 201 located in the phase difference AF row, are started. As described above, the first image signals are output via the first channel CH1, and the second image signals are output via the second channel CH2.

During a period between T0 and TF1, the signals SHA and SHB are read out from the pixels 201SHA and 201SHB for phase difference detection, which are located in the phase difference AF row. The readout of the signals from the pixels 201SHA and 201SHB for phase difference detection, which are located in the phase difference AF row, is performed in parallel to the readout of the signals from the pixels 201 located in the normal row, that is, the readout of signals for live view. The signals SHA and SHB for phase difference evaluation, which are read out from the pixels 201SHA and 201SHB, are transmitted to the phase difference evaluation value calculator 217 via the horizontal signal line 215b and the switch 216. Then, during a period between TF1 and TF2, the phase difference evaluation value calculator 217 calculates the phase difference evaluation value.

During a period between TF2 and TF3, the phase difference evaluation value calculated by the phase difference evaluation value calculator 217 is output to the controller 106. Further, during the period between T0 and TF1, the signals Gr and Gb are read out from the pixels 201G for image pickup, which are located in the phase difference AF row. The readout of the signals Gr and Gb from the pixels 201G for image pickup, which are located in the phase difference AF row, is performed in parallel to the readout of the signals from the pixels 201 located in the normal row, that is, the readout of the signals for live view. The signals Gr and Gb for contrast evaluation, which are read out from the pixels 201G, are transmitted to the contrast evaluation value calculator 218 via the horizontal signal line 215b and the switch 216. Then, during a period between TF1 and TF2C, the contrast evaluation value calculator 218 calculates the contrast evaluation value. During a period between TF2C and TF3C, the contrast evaluation value calculated by the contrast evaluation value calculator 218 is output to the controller 106.

As illustrated in FIG. 6, the vertical synchronization signal VD falls, that is, changes to the Low level, at each predetermined time interval ΔT. The vertical synchronization signal that has changed to the Low level is returned to the High level after an elapse of a predetermined time period. The predetermined time interval ΔT corresponds to a period required for acquiring an image for live view of one frame, that is, a one-frame live view signal acquisition period. In the first embodiment, during the one-frame live view signal acquisition period, AF evaluation is performed three times. Acquisition of the signal for AF evaluation, that is, acquisition of the second image signals, is performed independently and in parallel to acquisition of the signals for live view, that is, acquisition of the first image signals. The controller 106 determines whether or not a desired in-focus state can be obtained. When the desired in-focus state can be obtained, the AF control signal is turned off, that is, returned to the Low level. In FIG. 6, a timing T1 indicates the timing at which the AF control signal is turned off. When the AF control signal is turned off, the AF evaluation is canceled, but the image for live view is continuously acquired.

Figure 7:
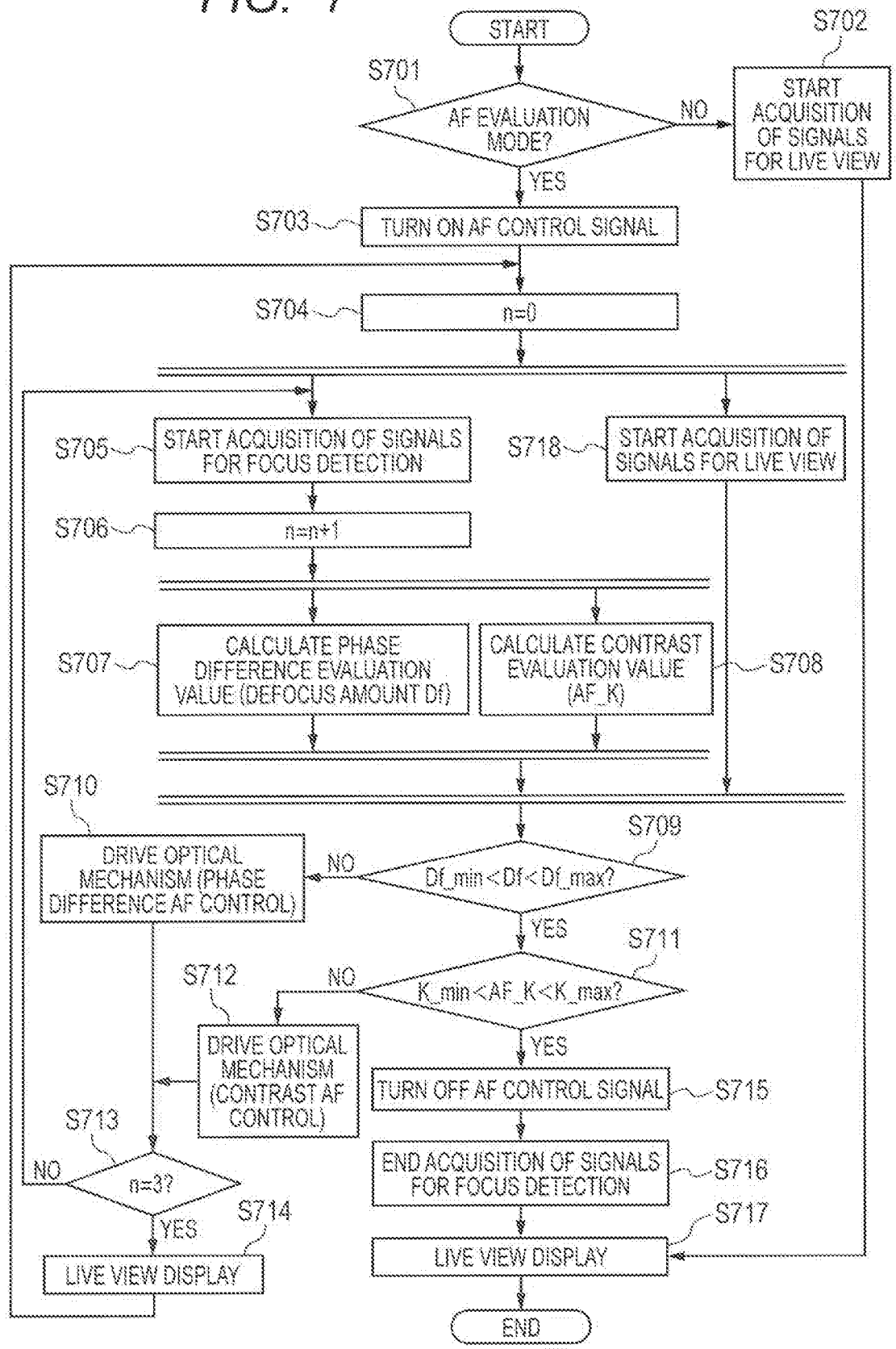
FIG. 7 is a flow chart for illustrating the operation of the image pickup apparatus according to the first embodiment.

FIG. 7 is a flow chart for illustrating the operation of the image pickup apparatus according to the first embodiment.

When the user operates the operation unit 108 to turn on the power of the image pickup apparatus 100, the controller 106 sets the image pickup apparatus 100 to a standby state. The controller 106 determines whether or not the image pickup apparatus 100 is required to be operated in the AF evaluation mode based on the operation performed by the user on the operation unit 108 or the like (Step S701). When the image pickup apparatus 100 is not required to be operated in the AF evaluation mode (NO in Step S701), acquisition of the signals for live view is started (Step S702). Then, a live view image obtained by the acquisition of the signals for live view is displayed on the image display 109 (Step S717). On the other hand, when the image pickup apparatus 100 is required to be operated in the AF evaluation mode (YES in Step S701), the controller 106 turns on the AF control signal (Step S703), and sets the number of times n of acquiring the signals for phase difference evaluation to 0 (Step S704).

After that, the controller 106 causes the solid-state image pickup element 102 to start the acquisition of the signals for live view (Step S718), and causes the solid-state image pickup element 102 to start the acquisition of the signals for phase difference evaluation (Step S705). After the controller 106 causes the solid-state image pickup element 102 to start the acquisition of the signals for phase difference evaluation, the controller 106 increments the number of times n of acquiring the signals for phase difference evaluation (Step S706). After that, the phase difference evaluation value is calculated by the phase difference evaluation value calculator 217 (Step S707), and the contrast evaluation value is calculated by the contrast evaluation value calculator 218 (Step S708).

In the calculation of the phase difference evaluation value (Step S707), the phase difference evaluation value calculator 217 calculates the phase difference evaluation value based on the signals SHA and SHB for phase difference evaluation acquired in Step S705, to thereby obtain the defocus amount Df. The phase difference evaluation value calculator 217 outputs the phase difference evaluation value, specifically, the defocus amount Df, to the controller 106 as soon as the calculation of the defocus amount Df is completed. In the calculation of the contrast evaluation value (Step S708), the contrast evaluation value calculator 218 calculates a contrast evaluation value AF_K based on the signals Gr and Gb for contrast evaluation acquired in Step S705. The contrast evaluation value calculator 218 outputs the contrast evaluation value AF_K to the controller 106 as soon as the calculation of the contrast evaluation value AF_K is completed.

In Step S709, the controller 106 determines whether or not the defocus amount Df calculated in Step S707 falls within a range of a desired defocus amount based on Expression (1).

$$Df\_min < Df < Df\_max \qquad (1)$$

In Expression (1), Df_min and Df_max represent the minimum value and the maximum value of the desired defocus amount Df, respectively, and are, for example, stored in advance in the ROM of the controller 106. Those values Df_min and Df_max may be determined at the time of design or adjustment.

When the defocus amount Df does not satisfy Expression (1) (NO in Step S709), the processing proceeds to Step S710. In Step S710, the controller 106 determines the feed-back control amount, that is, the focus lens drive amount, based on the defocus amount Df. Then, the controller 106 causes the drive unit 103 to control the optical mechanism 1011, to thereby drive the focus lens in the image pickup optical system 101 (phase difference AF control). After that, the processing proceeds to Step S713. In Step S713, the controller 106 determines whether or not the number of times n of acquiring the signals for phase difference evaluation is 3. When the number of times n of acquiring the signals for phase difference evaluation is not 3 (NO in Step S713), the processing returns to Step S705. On the other hand, when the number of times n of acquiring the signals for phase difference evaluation is 3 (YES in Step S713), live view display is performed (Step S714), and the processing returns to Step S704.

When the defocus amount Df satisfies Expression (1) (YES in Step S709), the controller 106 determines whether or not the contrast evaluation value AF_K obtained in Step S708 falls within a range of a desired contrast amount based on Expression (2).

$$K\_min < AF\_K < K\_max \quad (2)$$

In Expression (2), K_min and K_max are the minimum value and the maximum value of the desired contrast evaluation value AF_K, respectively, and are, for example, stored in the ROM of the controller 106. Those values K_min and K_max may be determined at the time of design or adjustment.

When the contrast evaluation value AF_K does not satisfy Expression (2) (NO in Step S711), the processing proceeds to Step S712. In Step S712, the controller 106 determines the feed-back control amount, that is, the focus lens drive amount, based on the contrast evaluation value AF_K. Then, the controller 106 causes the drive unit 103 to control the optical mechanism 1011, to thereby drive the focus lens in the image pickup optical system 101 (contrast AF control). After that, the processing proceeds to Step S713. When the contrast evaluation value AF_K satisfies Expression (2) (YES in Step S711), the controller 106 turns off the AF control signal (Step S715). After that, the controller 106 ends the acquisition of the signals for phase difference evaluation (Step S716). The controller 106 displays the signals for live view acquired in Step S718 on the image display 109 (Step S717), and then causes the image pickup apparatus 100 to shift to the standby state.

As described above, according to the first embodiment, when the phase difference evaluation value is calculated by the phase difference evaluation value calculator 217, the solid-state image pickup element 102 outputs the phase difference evaluation value regardless of whether or not the output of the signals for live view is completed. Further, according to the first embodiment, when the contrast evaluation value is calculated by the contrast evaluation value calculator 218, the solid-state image pickup element 102 outputs the contrast evaluation value regardless of whether or not the output of the signals for live view is completed. According to the first embodiment, the phase difference evaluation value and the contrast evaluation value are output to the controller 106 regardless of whether or not the output of the signals for live view is completed. Thus, an image pickup apparatus capable of achieving a fast autofocus with high accuracy can be provided.

Second Embodiment

A solid-state image pickup element, a method of controlling a solid-state image pickup element, and an image pickup apparatus according to a second embodiment are described with reference to FIG. 8 and FIG. 9. Like components in the solid-state image pickup element, the method of controlling a solid-state image pickup element, and the image pickup apparatus according to the first embodiment illustrated in FIG. 1 to FIG. 7 are denoted by like reference symbols to omit or simplify the description.

The image pickup apparatus 100 according to the second embodiment continuously acquires still images, that is, perform continuous shooting of still images.

Figure 8:
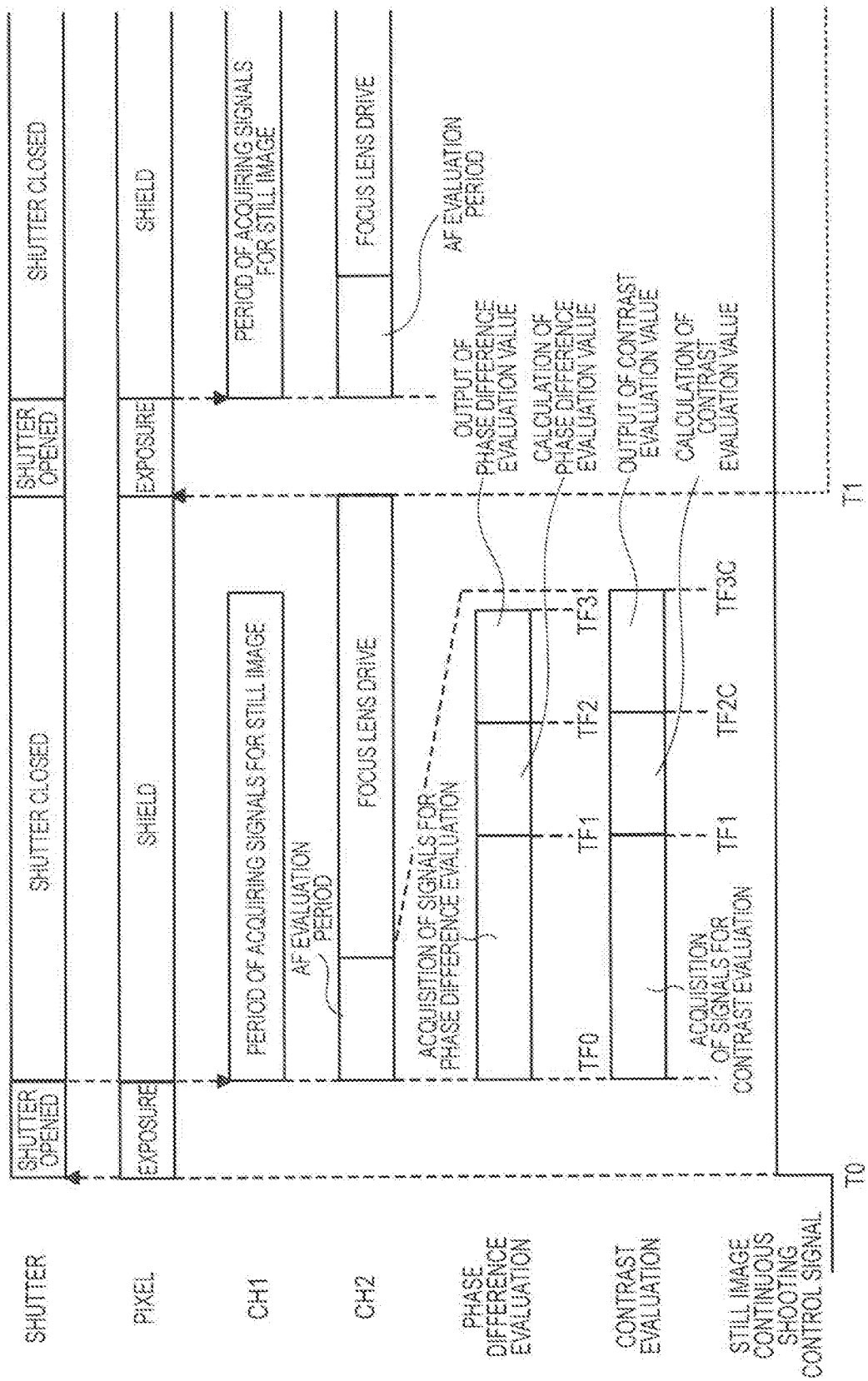
FIG. 8 is a time chart for illustrating an operation of an image pickup apparatus according to a second embodiment.

FIG. 8 is a time chart for illustrating an operation of the image pickup apparatus according to the second embodiment. A still image continuous shooting mode, which is a mode of continuously acquiring the still images, is started when a still image continuous shooting control signal from the controller 106 is turned on. The controller 106 causes the drive unit 103 to control the mechanical shutter mechanism and the diaphragm mechanism of the optical mechanism 1011, and causes the drive unit 103 to control the solid-state image pickup element 102. Specifically, a reset operation is performed on the pixels 201, and a mechanical shutter (shutter) is opened so that exposure to the pixels 201 is started. After the exposure to the pixels 201 is started, photoelectric conversion by the photoelectric converters PD is started.

After an elapse of such a predetermined exposure time period that satisfies an exposure condition set in advance, the controller 106 causes the drive unit 103 to close the shutter. When the shutter is closed, the exposure to the pixels 201 is completed. After the exposure to the pixels 201 is completed, acquisition of the first image signals, that is, the signals for the still image, and acquisition of the second image signals, that is, the signals for phase difference evaluation, are started. The timing at which the acquisition of the first image signals and the acquisition of the second image signals are started is TF0. The first image signals are output via the first channel CH1, and the second image signals are output via the second channel CH2. The rows selected when the first image signals are to be acquired and the rows selected when the second image signals are to be acquired may be the same as those in the case of the first embodiment described above with reference to FIG. 5, for example.

During a period between TF0 and TF1, the signals SHA and SHB for phase difference evaluation are transmitted to the phase difference evaluation value calculator 217 via the horizontal signal line 215b and the switch 216. Then, during a period between TF1 and TF2, the phase difference evaluation value calculator 217 calculates the phase difference evaluation value. During a period between TF2 and TF3, the phase difference evaluation value calculated by the phase difference evaluation value calculator 217 is output to the controller 106. Further, during the period between TF0 and TF1, the signals for contrast evaluation are transmitted to the contrast evaluation value calculator 218 via the horizontal signal line 215b and the switch 216. Then, during a period between TF1 and TF2C, the contrast evaluation value calculator 218 calculates the contrast evaluation value.

During a period between TF2C and TF3C, the contrast evaluation value calculated by the contrast evaluation value calculator 218 is output to the controller 106. The controller 106 causes the drive unit 103 to drive the focus lens of the image pickup optical system 101 based on the phase difference evaluation value and the contrast evaluation value. When the drive of the focus lens is completed, and the still image continuous shooting mode is not ended, the processing proceeds to the acquisition of the next still image.

Figure 9:
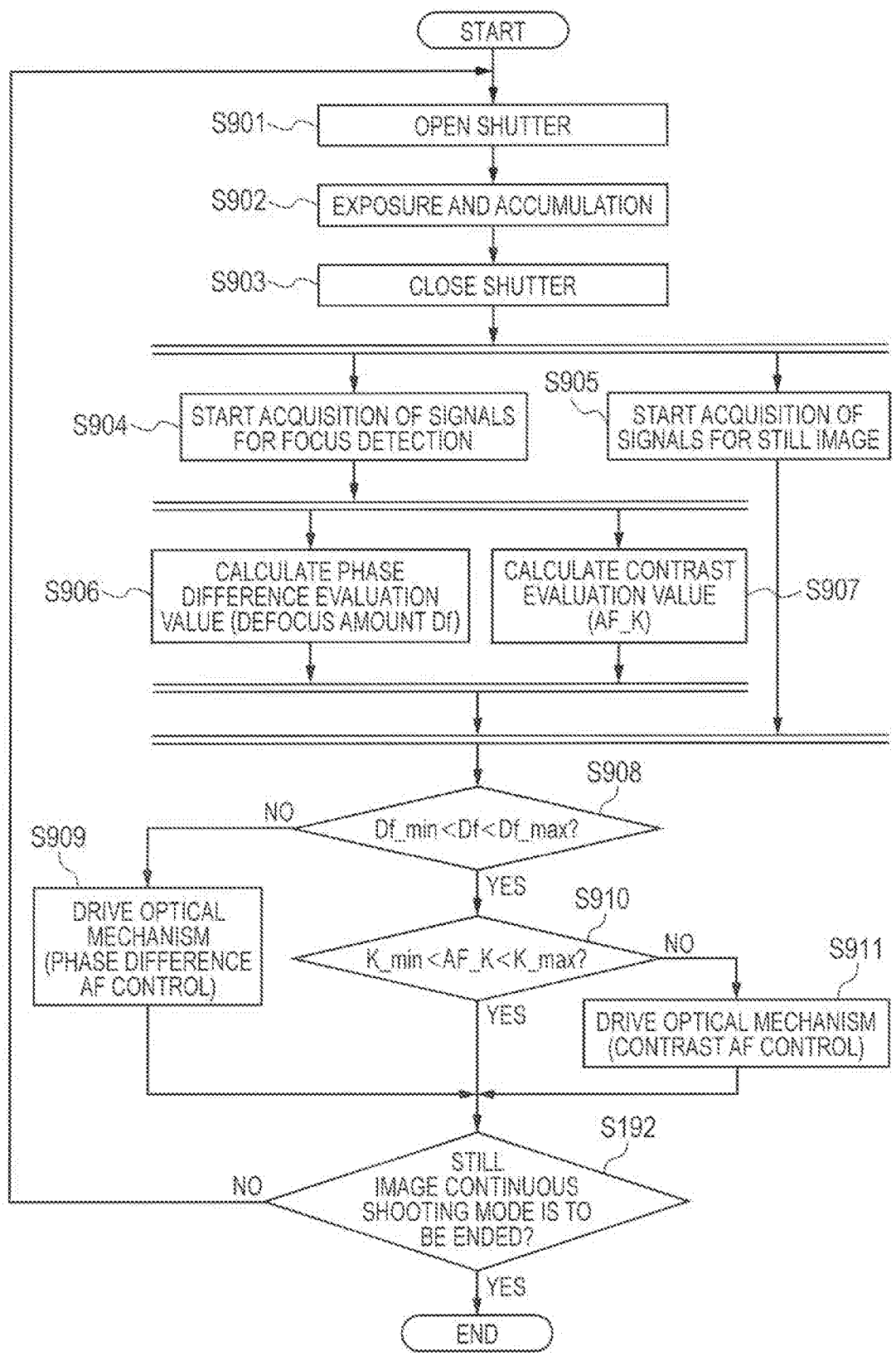
FIG. 9 is a flow chart for illustrating the operation of the image pickup apparatus according to the second embodiment.

FIG. 9 is a flow chart for illustrating the operation of the image pickup apparatus according to the second embodiment. First, the controller 106 causes the image pickup apparatus 100 to shift from the standby state to the still image continuous shooting mode based on the operation input performed by the user on the operation unit 108. In Step S901, the controller 106 causes the drive unit 103 to open the mechanical shutter of the optical mechanism 1011. In this manner, the exposure to the pixels 201 is started, and the photoelectric conversion by the photoelectric converters PD is started so that charges are started to be accumulated (Step S902). After an elapse of a predetermined exposure time period, the controller 106 causes the drive unit 103 to close the mechanical shutter of the optical mechanism 1011 (Step S903).

Next, the controller 106 causes the solid-state image pickup element 102 to start the acquisition of the signals for the still image (Step S905), and causes the solid-state image pickup element 102 to start the acquisition of the signals for phase difference evaluation (Step S904). After that, the phase difference evaluation value is calculated by the phase difference evaluation value calculator 217 (Step S906), and the contrast evaluation value is calculated by the contrast evaluation value calculator 218 (Step S907). In the calculation of the phase difference evaluation value (Step S906), the phase difference evaluation value calculator 217 calculates the phase difference evaluation value based on the signals SHA and SHB for phase difference evaluation acquired in Step S904, to thereby obtain the defocus amount Df.

The phase difference evaluation value calculator 217 outputs the phase difference evaluation value, specifically, the defocus amount Df, to the controller 106 as soon as the calculation of the phase difference evaluation value is completed. In the calculation of the contrast evaluation value (Step S907), the contrast evaluation value calculator 218 calculates the contrast evaluation value AF_K based on the signals Gr and Gb for image pickup acquired in Step S904. The contrast evaluation value calculator 218 outputs the contrast evaluation value AF_K to the controller 106 as soon as the calculation of the contrast evaluation value AF_K is completed.

In Step S908, the controller 106 determines whether or not the defocus amount Df calculated in Step S906 falls within a range of a desired defocus amount based on Expression (1) described above in the first embodiment. When the defocus amount Df does not satisfy Expression (1) (NO in Step S908), the processing proceeds to Step S909. In Step S909, the controller 106 determines the feed-back control amount, that is, the focus lens drive amount, based on the defocus amount Df. Then, the controller 106 causes the drive unit 103 to control the optical mechanism 1011, to thereby drive the focus lens in the image pickup optical system 101 (phase difference AF control). After that, the processing proceeds to Step S912. When the defocus amount Df satisfies Expression (1) (YES in Step S908), the processing proceeds to Step S910.

In Step S910, the controller 106 determines whether or not the contrast evaluation value AF_K obtained in Step S907 falls within a range of a desired contrast amount based on Expression (2) described above in the first embodiment. When the contrast evaluation value AF_K does not satisfy Expression (2) (NO in Step S910), the processing proceeds to Step S911. In Step S911, the controller 106 determines the feed-back control amount, that is, the focus lens drive amount, based on the contrast evaluation value AF_K. The controller 106 causes the drive unit 103 to control the optical mechanism 1011, to thereby drive the focus lens in the image pickup optical system 101 (contrast AF control). After that, the processing proceeds to Step S912. When the contrast evaluation value AF_K satisfies Expression (2) (YES in Step S910), the processing proceeds to Step S912.

In Step S912, the controller 106 determines whether or not to end the still image continuous shooting mode in accordance with the operation input performed by the user on the operation unit 108. When the still image continuous shooting mode is not to be ended (NO in Step S912), the processing returns to Step S901 to start the acquisition of the next still image. On the other hand, when the still image continuous shooting mode is to be ended (YES in Step S912), the controller 106 causes the image pickup apparatus 100 to shift to the standby state without acquiring the next still image.

As described above, according to the second embodiment, when the phase difference evaluation value is calculated by the phase difference evaluation value calculator 217, the solid-state image pickup element 102 outputs the phase difference evaluation value regardless of whether or not the output of the signals for the still image is completed. Further, according to the second embodiment, when the contrast evaluation value is calculated by the contrast evaluation value calculator 218, the solid-state image pickup element 102 outputs the contrast evaluation value regardless of whether or not the output of the signals for the still image is completed. According to the second embodiment, the phase difference evaluation value and the contrast evaluation value are output to the controller 106 regardless of whether or not the output of the signals for the still image is completed. Thus, an image pickup apparatus capable of achieving a fast autofocus with high accuracy can be provided.

Third Embodiment

A solid-state image pickup element, a method of controlling a solid-state image pickup element, and an image pickup apparatus according to a third embodiment are described with reference to FIG. 10 to FIG. 11D. Like components in the solid-state image pickup element, the method of controlling a solid-state image pickup element, and the image pickup apparatus according to the first and second embodiments illustrated in FIG. 1 to FIG. 9 are denoted by like reference symbols to omit or simplify the description.

The solid-state image pickup element according to the third embodiment outputs the image signal and the AF evaluation value via a common output terminal.

Figure 10:
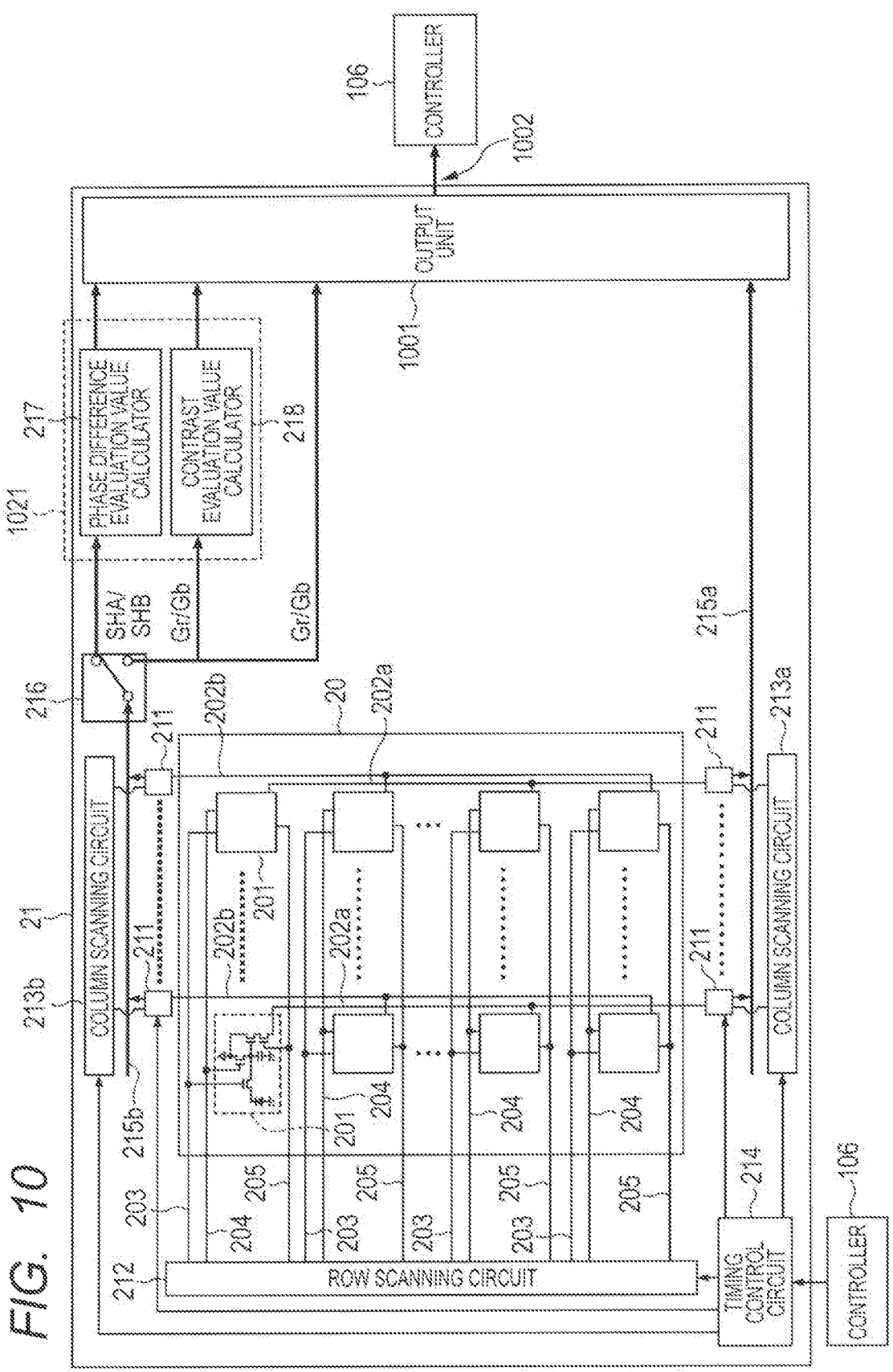
FIG. 10 is a circuit diagram for illustrating a solid-state image pickup element according to a third embodiment.

FIG. 10 is a circuit diagram for illustrating the solid-state image pickup element according to the third embodiment. As illustrated in FIG. 10, in the third embodiment, an output unit 1001 is provided. The signals transferred to the horizontal signal line 215a from the pixels 201 located in the normal row are input to the output unit 1001. Further, the phase difference evaluation value output from the phase difference evaluation value calculator 217 of the AF evaluation value calculator 1021 is input to the output unit 1001. Further, the contrast evaluation value output from the contrast evaluation value calculator 218 of the AF evaluation value calculator 1021 is input to the output unit 1001. Further, the signals Gr and Gb transferred to the horizontal signal line 215b from the pixels 201G for image pickup (see FIG. 4A and FIG. 4B) located in the phase difference AF row are input to the output unit 1001. The output unit 1001 outputs the image signal and the AF evaluation value to the controller 106 via a common output terminal 1002. The image signal may be an image signal for live view as described above in the first embodiment, or may be an image signal for the still image as described above in the second embodiment.

Figure 11A:
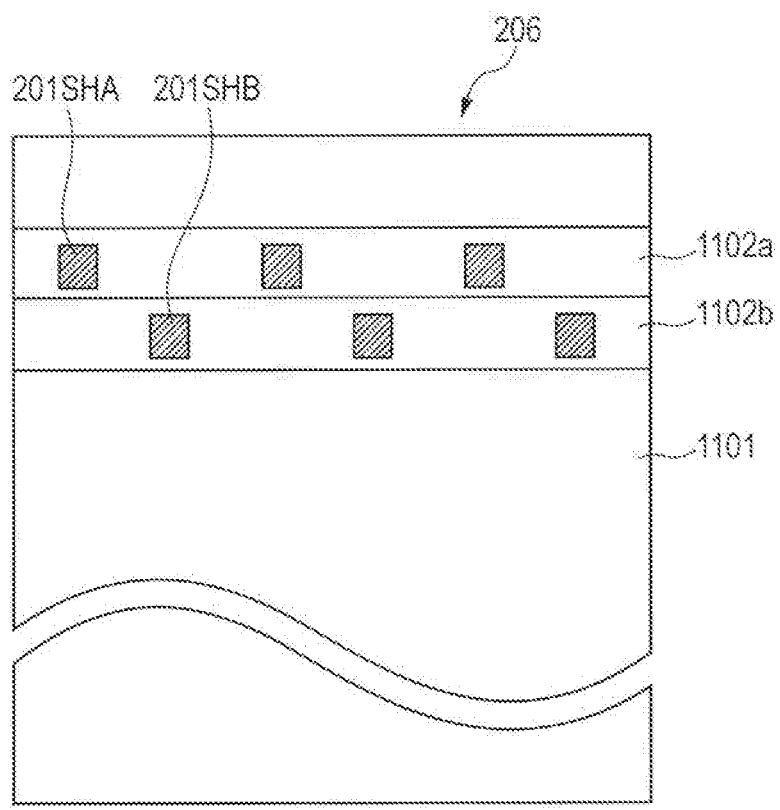
FIG. 11A and FIG. 11B are diagrams for conceptually illustrating a layout of a pixel array and signals to be output.

FIG. 11A is a diagram for conceptually illustrating a layout of a pixel array in the image pickup element according to the third embodiment. FIG. 11A is an illustration of a part extracted from the pixel array 206. The pixel array 206 has a region 1101 in which a plurality of normal rows, which are rows not including the pixels 201SHA and 201SHB for phase difference detection, are arranged. Further, the pixel array 206 includes phase difference AF rows 1102a and 1102*b* including the pixels 201SHA and 201SHB for phase difference detection, respectively. The pixels 201SHA and 201SHB may correspond to respective divided regions (not shown) of the pixel array 206 divided into a plurality of sections, or may correspond to AF frames. For example, the readout of the signal from the phase difference AF row 1102*a* is performed, then the readout of the signal from the phase difference AF row 1102*b* is performed, and then the readout of the signals from the plurality of normal rows included in the region 1101 is sequentially performed.

Figure 11B:
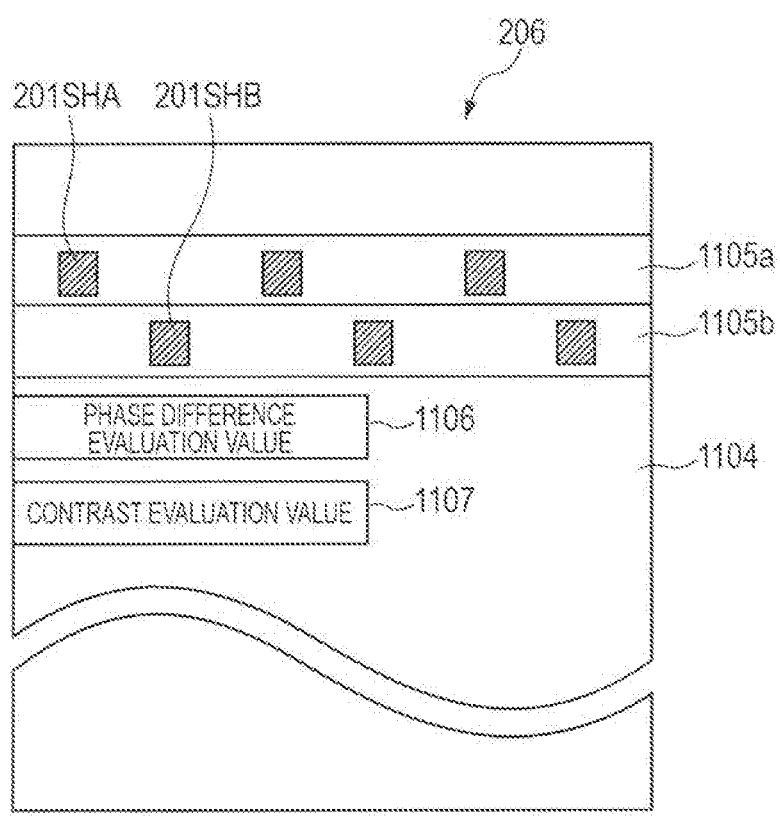

FIG. 11B is a diagram for conceptually illustrating signals to be output from the image pickup element according to the third embodiment. As illustrated in FIG. 11B, a signal 1105*a* read out from the phase difference AF row 1102*a* is output to the controller 106 via the output unit 1001. After that, a signal 1105*b* read out from the phase difference AF row 1102*b* is output to the controller 106 via the output unit 1001. After that, the output to the controller 106 of a signal 1104 read out from the plurality of normal rows located in the region 1101 is started.

Before the readout of the signals from the plurality of normal rows located in the region 1101 is completed, as soon as the phase difference evaluation value is calculated by the phase difference evaluation value calculator 217, the phase difference evaluation value is input to the output unit 1001. Further, before the readout of the signals from the plurality of normal rows located in the region 1101 is completed, as soon as the contrast evaluation value is calculated by the contrast evaluation value calculator 218, the contrast evaluation value is input to the output unit 1001. At a stage before the output of the signals read out from the plurality of normal rows located in the region 1101 is completed, that is, at a stage before the output of the image signal 1104 is completed, the output unit 1001 outputs the phase difference evaluation value and the contrast evaluation value to the controller 106 as soon as those values are acquired.

The AF evaluation value, that is, the phase difference evaluation value and the contrast evaluation value, are calculated for each of the regions divided so as to correspond to the phase difference AF rows arranged evenly in the pixel array 206, and the number of the regions is roughly from 10 to 30, for example. Further, the data length of the AF evaluation value is about 8 bits, for example. The data amount of the AF evaluation value is extremely smaller than those of the signals read out from the normal row, that is, the signal for live view and the signal for the still image, and hence the data of the AF evaluation value can be inserted as invalid data that does not affect the signal for live view and the signal for the still image. The timing to insert and output the data of the AF evaluation value can be set to a timing within a period in which the signal read out from the normal row is not output to the controller 106, for example, a timing corresponding to a horizontal blanking period. FIG. 11B is a diagram for conceptually illustrating a state in which a phase difference evaluation value 1106 and a contrast evaluation value 1107 are inserted in the horizontal blanking period.

FIG. 11C is a time chart for illustrating an example of an operation of the image pickup apparatus according to the third embodiment. FIG. 11C is an illustration of a case in which an operation is performed in the mode of performing live view display while the autofocus operation is performed, that is, the AF evaluation mode. As described above in the first embodiment, first, the acquisition of the signals for live view and the acquisition of the signals for phase difference evaluation are performed in parallel. When the phase difference evaluation value obtained by the phase difference evaluation value calculator 217 is input to the output unit 1001, the output unit 1001 inserts and outputs the phase difference evaluation value to a part of the horizontal blanking period of the signals for live view as invalid data. When the contrast evaluation value obtained by the contrast evaluation value calculator 218 is input to the output unit 1001, the output unit 1001 inserts and outputs the contrast evaluation value to a part of the horizontal blanking period of the signals for live view as invalid data.

FIG. 11D is a time chart for illustrating another example of the operation of the image pickup apparatus according to the third embodiment. FIG. 11D is an illustration of a case in which an operation is performed in the still image continuous shooting mode, which is a mode of continuously acquiring the still images. As described above in the second embodiment, the acquisition of the signals for the still image and the acquisition of the signals for phase difference evaluation are performed in parallel. When the phase difference evaluation value obtained by the phase difference evaluation value calculator 217 is input to the output unit 1001, the output unit 1001 inserts and outputs the phase difference evaluation value to a part of the horizontal blanking period of the signals for the still image as invalid data. Further, when the contrast evaluation value obtained by the contrast evaluation value calculator 218 is input to the output unit 1001, the output unit 1001 inserts and outputs the contrast evaluation value to a part of the horizontal blanking period of the signals for the still image as invalid data.

The controller 106 drives the focus lens based on the phase difference evaluation value output from the output unit 1001. Further, the controller 106 drives the focus lens based on the contrast evaluation value output from the output unit 1001. When the drive of the focus lens is completed, and the still image continuous shooting mode is not ended, the processing proceeds to the acquisition of the next still image.

Figure 12A:
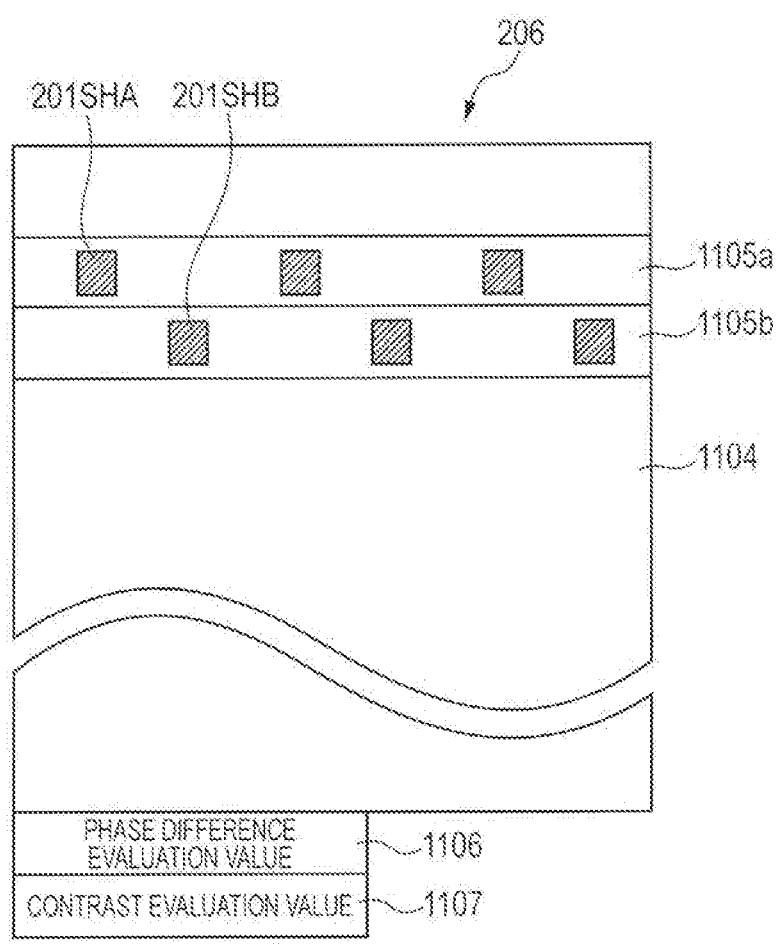
FIG. 12A is a diagram for conceptually illustrating signals to be output from a solid-state image pickup element according to Reference Example 1.

FIG. 12A is a diagram for conceptually illustrating signals to be output from a solid-state image pickup element according to Reference Example 1. As illustrated in FIG. 12A, in the image pickup apparatus according to Reference Example 1, the phase difference evaluation value 1106 and the contrast evaluation value 1107 are added after the image signal (image data) 1104. That is, in the image pickup apparatus according to the Reference Example 1, the phase difference evaluation value 1106 and the contrast evaluation value 1107 are arranged at the tail of the image signal 1104.

FIG. 12B is a time chart for illustrating an example of an operation of an image pickup apparatus according to Reference Example 1. FIG. 12B is an illustration of a case in which an operation is performed in the mode of performing live view display while the autofocus operation is performed, that is, the AF evaluation mode. Also in Reference Example 1, the acquisition of the signals for phase difference evaluation and the acquisition of the signals for contrast evaluation are performed in parallel to the acquisition of the signals for live view. Also in the image pickup apparatus according to Reference Example 1, at a stage before the output of the signals for live view is completed, the calculation of the phase difference evaluation value and the contrast evaluation value is completed. In the image pickup apparatus according to Reference Example 1, after the output of the signals for live view is completed, the phase difference evaluation value and the contrast evaluation value are output. Therefore, in Reference Example 1, even if the phase difference evaluation value and the contrast evaluation value are calculated at a stage before the output of the signals for live view is completed, a fast autofocus cannot be achieved.

FIG. 12C is a time chart for illustrating another example of the operation of the image pickup apparatus according to Reference Example 1. FIG. 12C is an illustration of a case in which an operation is performed in the still image continuous shooting mode, which is a mode of continuously acquiring the still images. Also in Reference Example 1, the acquisition of the signals for phase difference evaluation and the acquisition of the signals for contrast evaluation are performed in parallel to the acquisition of the signals for the still image. Also in the image pickup apparatus according to Reference Example 1, at a stage before the output of the signals for the still image is completed, the calculation of the phase difference evaluation value and the contrast evaluation value is completed. In the image pickup apparatus according to Reference Example 1, after the output of the signals for the still image is completed, the phase difference evaluation value and the contrast evaluation value are output. Therefore, in Reference Example 1, even if the phase difference evaluation value and the contrast evaluation value are calculated at a stage before the output of the signals for the still image is completed, a fast autofocus cannot be achieved.

In contrast, in the third embodiment, when the phase difference evaluation value is calculated, similarly to the image pickup apparatus according to the first and second embodiments, the solid-state image pickup element 102 outputs the phase difference evaluation value regardless of whether or not the output of the image signal is completed. Further, in the third embodiment, when the contrast evaluation value is calculated, similarly to the image pickup apparatus according to the first and second embodiments, the solid-state image pickup element 102 outputs the contrast evaluation value regardless of whether or not the output of the image signal is completed. Therefore, according to the third embodiment, similarly to the image pickup apparatus according to the first and second embodiments, it is possible to provide the image pickup apparatus capable of achieving a fast autofocus with high accuracy. In addition, according to the third embodiment, the image signal and the AF evaluation value are output via the common output terminal 1002, and hence the third embodiment can contribute to reduction in cost or the like.

Fourth Embodiment

A solid-state image pickup element, a method of controlling a solid-state image pickup element, and an image pickup apparatus according to a fourth embodiment are described with reference to FIG. 13 to FIG. 17. Like components in the solid-state image pickup element and the like according to the first to third embodiments illustrated in FIG. 1 to FIG. 11D are denoted by like reference symbols to omit or simplify the description.

The configuration of the image pickup apparatus according to the fourth embodiment is similar to the configuration of the image pickup apparatus according to the first embodiment described above with reference to FIG. 1. Further, the structure of the solid-state image pickup element according to the fourth embodiment is similar to the structure of the solid-state image pickup element according to the first embodiment described above with reference to FIG. 2A. In the fourth embodiment, an interpolation processor 1301 (see FIG. 13) is formed on the second semiconductor chip 21.

Figure 13:
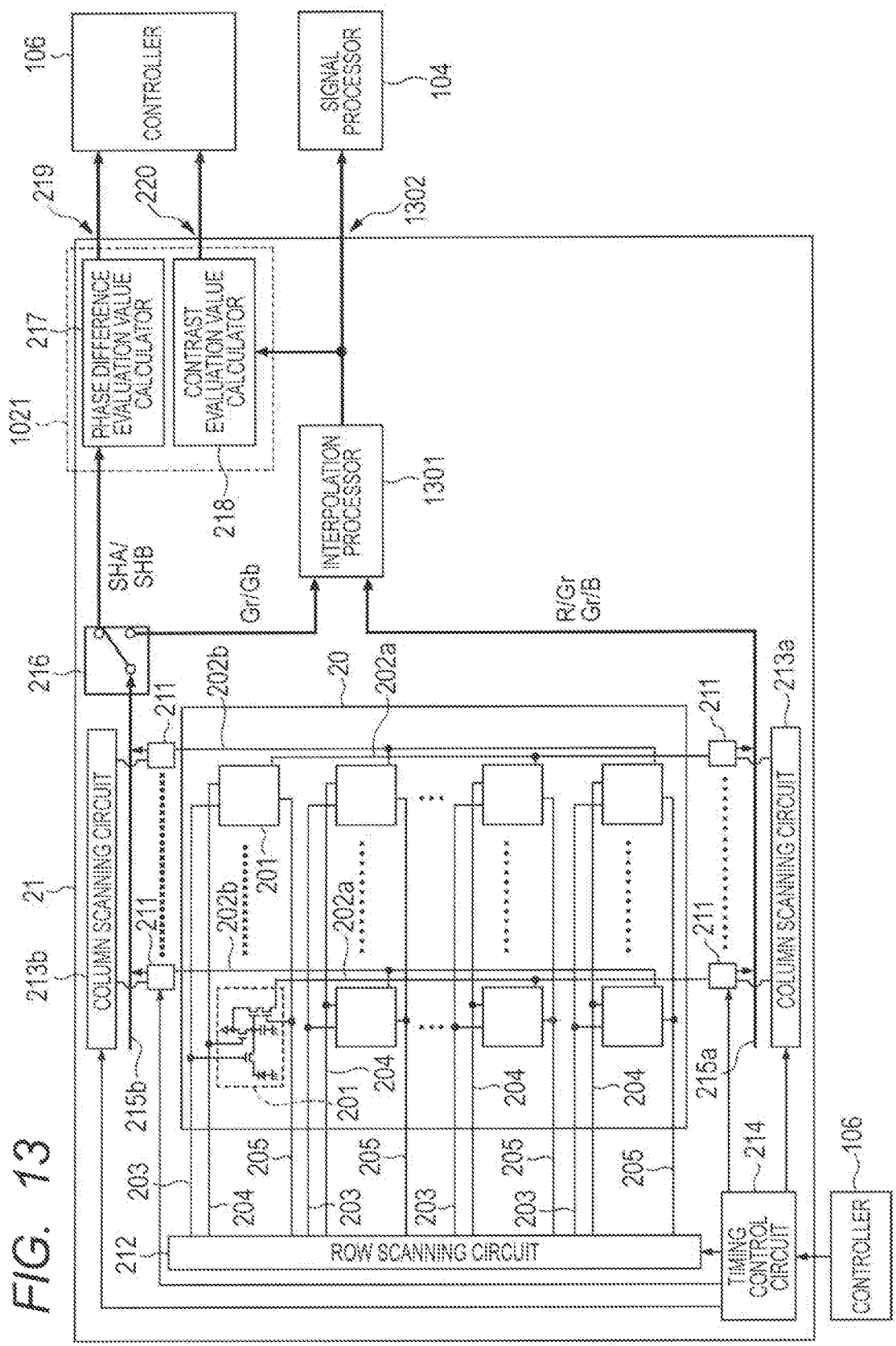
FIG. 13 is a circuit diagram for illustrating a solid-state image pickup element according to a fourth embodiment.

FIG. 13 is a circuit diagram for illustrating the solid-state image pickup element according to the fourth embodiment.

As illustrated in FIG. 13, the plurality of pixels 201 arrayed in a two-dimensional matrix manner are formed on the first semiconductor chip 20. Each of the pixels 201 is connected to the transfer signal line 203, the reset signal line 204, and the row selection signal line 205 in the horizontal direction, and is connected to the column signal line 202a or the column signal line 202b in the vertical direction. The pixel 201 connected to the column signal line 202a or 202b differs depending on a readout row. That is, the pixel 201 located in the row including the pixels 201SHA and 201SHB (see FIG. 4A) for phase difference detection (for focus detection), that is, the phase difference AF row, is connected to the column signal line 202b. Meanwhile, the pixel 201 located in the row not including the pixels 201SHA and 201SHB for phase difference detection, that is, the normal row, is connected to the column signal line 202a. The configuration of the pixel 201 is similar to the configuration of the pixel 201 of the first embodiment described above with reference to FIG. 2C.

The second semiconductor chip 21 includes the AD conversion units 211. Each of the AD conversion units 211 is connected to the column signal line 202a or the column signal line 202b. The second semiconductor chip 21 further includes the row scanning circuit 212 that scans respective rows, and the column scanning circuit 213a and 213b that scan respective columns. The second semiconductor chip 21 further includes the timing control circuit 214 that controls the operation timing of each of the row scanning circuit 212, the column scanning circuits 213a and 213b, and the AD conversion units 211 based on the control signal output from the controller 106. The second semiconductor chip 21 further includes the horizontal signal lines 215a and 215b for transferring the signals from the AD conversion units 211 in accordance with the timing controlled by the column scanning circuits 213a and 213b.

The second semiconductor chip 21 further includes the switch 216 that switches the output destination of the digital image signals output via the horizontal signal line 215b. When the switch 216 has the first setting, the output destination of the digital image signals output via the horizontal signal line 215b is set to the phase difference evaluation value calculator 217 of the AF evaluation value calculator 1021. Meanwhile, when the switch 216 has the second setting, the output destination of the digital image signals output via the horizontal signal line 215b is set to the interpolation processor 1301.

The pixel 201 located in the row including the pixels 201SHA and 201SHB for phase difference detection, that is, the phase difference AF row, is connected to the column signal line 202b. Therefore, the signals acquired by the pixels 201 located in the phase difference AF row are transferred via the column signal lines 202b and the horizontal signal line 215b. The signals acquired by the pixels 201SHA or 201SHB for phase difference detection, which are located in the phase difference AF row, are transferred to the phase difference evaluation value calculator 217 via the column signal lines 202b, the horizontal signal line 215b, and the switch 216.

Incidentally, in the phase difference AF row, not only the pixels 201SHA and 201SHB for phase difference detection but also the pixels 201G for image pickup are located (see FIG. 4A). When the pixels having specific spectral sensitivity like red (R), green (G), and blue (B) are described, the reference symbols of 201R, 201G, and 201B are used, respectively. Further, when the pixels for the phase difference detection are described, the reference symbols of 201SHA and 201SHB are used. Further, when general pixels are described, the reference symbol of 201 is used. The signal acquired by the pixel 201G for image pickup among the pixels 201 located in the phase difference AF row is transmitted to the interpolation processor 1301 via the column signal line 202b, the horizontal signal line 215b, and the switch 216.

As described above, the pixel 201 located in the row not including the pixels 201SHA and 201SHB for phase difference detection, that is, the normal row, is connected to the column signal line 202a. Therefore, the signal acquired by the pixel 201 located in the normal row is output to the interpolation processor 1301 via the column signal line 202a and the horizontal signal line 215a. As described above, the interpolation processor 1301 receives input of the digital image signal output via the horizontal signal line 215a and input of the digital image signal output via the horizontal signal line 215b. The signal appropriately subjected to interpolation processing by the interpolation processor 1301, that is, the image signal, is output to the contrast evaluation value calculator 218 of the AF evaluation value calculator 1021, and to the signal processor 104.

The phase difference evaluation value calculated by the phase difference evaluation value calculator 217 and the contrast evaluation value calculated by the contrast evaluation value calculator 218 are output to the controller 106. The signal appropriately subjected to interpolation processing by the interpolation processor 1301, that is, the image signal, is transmitted to the signal processor 104 to be used for an image for live view at the time of live view display, for example.

A signal transferred to the horizontal signal line 215a from the pixel 201 located in the normal row is referred to as "first image signal". Further, a signal transferred to the horizontal signal line 215b from the pixel 201 located in the phase difference AF row is referred to as "second image signal".

The rows selected at the time of readout in the solid-state image pickup element according to the fourth embodiment are the same as the rows selected at the time of readout in the solid-state image pickup element according to the first embodiment, which are described with reference to FIG. 5. Also in the fourth embodiment, in order that acquisition of the first image signals and acquisition of the second image signals can be performed in parallel, rows selected when the first image signals are to be acquired and rows selected when the second image signals are to be acquired are each set. The first image signals are output to the column signal line 202a. Meanwhile, the second image signals are output to the column signal line 202b.

Figure 14:
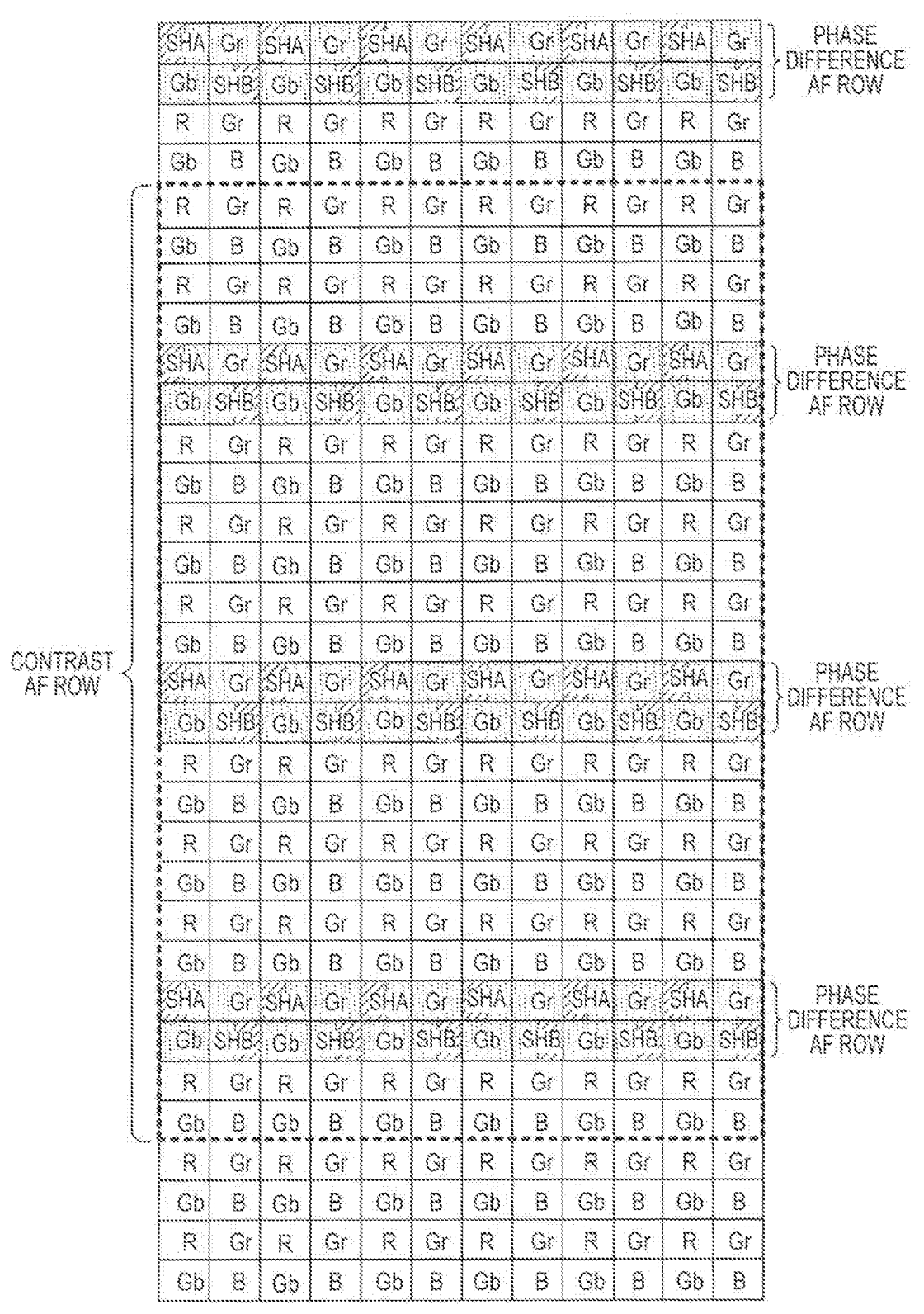

FIG. 14 is a diagram for illustrating a layout of pixels in the solid-state image pickup element according to the fourth embodiment. FIG. 14 is an illustration of a part of pixels 201 extracted from the plurality of pixels 201 arranged in matrix. The signals R, Gr, Gb, and B output from the pixels 201 located in a part of the plurality of normal rows, and the signals Gr and Gb output from the pixels 201G located in a part of the plurality of phase difference AF rows are also used when the contrast evaluation value is acquired. The row in which the pixels 201 that output signals to be used for acquiring the contrast evaluation value are located is also referred to as "contrast AF row". As illustrated in FIG. 14, the contrast AF row includes the phase difference AF rows and the normal rows. The contrast AF row is set so as to include not only the normal rows but also the phase difference AF rows because the contrast evaluation value can be acquired with high accuracy by setting the contrast AF row to have a wide range.

The second image signals include signals acquired by the pixels 201SHA and 201SHB for phase difference detection, and hence increasing the frame rate becomes important to achieve a fast autofocus. Therefore, the second image signals are set to have a relatively high decimation ratio. Meanwhile, the first image signals are used for live view display and the like, and hence the image quality becomes important. Therefore, the first image signals are set to have a relatively low decimation ratio. Focusing on the rows having the row numbers of 1 to 8, the first image signals are obtained by decimating one pixel among the four same-color pixels arranged in the vertical direction, and the second image signals are obtained by decimating three pixels among the four same-color pixels arranged in the vertical direction. When the first image signals are to be acquired, the first pixel group is read out at a first frame rate. When the second image signals are to be acquired, the second pixel group is read out at a second frame rate that is higher than the first frame rate. Description is given here of an example of a case in which the second frame rate is three times as high as the first frame rate.

As described above, in the first embodiment, the rows from which the first image signals are read out and the rows from which the second image signals are read out are separately set. Therefore, according to the fourth embodiment, the first image signal and the second image signal having different charge accumulation time periods, different data sizes, and different frame rates can be acquired in parallel. Description has been given of an example of a case in which the second pixel group for acquiring the second image signals is located in the rows having the row numbers of 1 and 2, and the first pixel group for acquiring the first image signals is located in the rows having the row numbers of 3 to 8, but the present invention is not limited thereto. Further, the decimation ratio for the readout can be set as appropriate.

The analog signal output from the pixel 201 to the column signal line 202a or the column signal line 202b is converted from analog to digital in the AD conversion unit 211. The column scanning circuit 213a transmits the digital first image signal output from the AD conversion unit 211 to the interpolation processor 1301 via the horizontal signal line 215a. Further, the column scanning circuit 213b transmits the digital second image signal output from the AD conversion unit 211 to the phase difference evaluation value calculator 217 or the interpolation processor 1301 via the horizontal signal line 215b. Further, the signal appropriately subjected to interpolation processing by the interpolation processor 1301, that is, the image signal, is transmitted to the contrast evaluation value calculator 218, and is output to the signal processor 104 via an output terminal 1302 of the solid-state image pickup element 102.

The controller 106 uses the signal output from the phase difference evaluation value calculator 217 of the solid-state image pickup element 102 to perform autofocus control by the phase difference detection method, that is, phase difference focus control (phase difference AF). Further, the controller 106 also uses the signal output from the contrast evaluation value calculator 218 of the solid-state image pickup element 102 to perform autofocus control by the contrast detection method, that is, contrast focus control (contrast AF).

The phase difference evaluation value calculator 217 calculates the phase difference evaluation value for focus detection by the phase difference detection method based on the pixels 201SHA and 201SHB for phase difference detection included in the plurality of pixels 201. The phase difference evaluation value calculator 217 performs correlation calculation with respect to a pair of image signals generated by the signals SHA and SHB output from the plurality of pixels 201SHA and 201SHB for phase difference detection, to thereby calculate a phase difference representing a relative deviation between the pair of image signals. Then, the phase difference evaluation value calculator 217 calculates a defocus amount Df, which represents an amount of out-of-focus, based on the phase difference. The controller 106 calculates, based on the defocus amount Df, the amount to move the focus lens in order to obtain a state close to an in-focus state, that is, a focus lens drive amount to a position near an in-focus position. The controller 106 causes the drive unit 103 to control the optical mechanism 1011 so that the focus lens is moved by the calculated drive amount. The contrast evaluation value calculator 218 calculates the contrast evaluation value by extracting a high-frequency component in the image signal output from the contrast AF row. The controller 106 drives the focus lens as appropriate based on the contrast evaluation value.

The relationship between the image pickup optical system and the pixels in the fourth embodiment is similar to the relationship between the image pickup optical system and the pixels in the first embodiment described above with reference to FIG. 3A to FIG. 4B.

An object image acquired by the plurality of pixels 201SHA for phase difference detection regularly arranged in the x direction, that is, the first pixel group for phase difference detection, is referred to as "first image". Further, an object image acquired by the plurality of pixels 201SHB for phase difference detection regularly arranged in the x direction, that is, the second pixel group for phase difference detection, is referred to as "second image". Further, a relative deviation amount between the first image and the second image, that is, the phase difference, is detected so that the defocus amount Df of the focus lens with respect to the object can be calculated based on the phase difference.

Signals output from the pixels 201 to the column signal lines 202a and 202b are converted from analog to digital by the AD conversion units 211. The signals converted into digital by the AD conversion units 211 are output from the AD conversion units 211 to the horizontal signal lines 215a and 215b by the column scanning circuits 213a and 213b, respectively. The signals R, Gr, Gb, and B output to the horizontal signal line 215a are output to the interpolation processor 1301. Meanwhile, the signal output to the horizontal signal line 215b is output via the switch 216. When the switch 216 has the first setting, the signals SHA and SHB output from the pixels 201SHA and 201SHB for phase difference detection are input to the phase difference evaluation value calculator 217. When the switch 216 has the second setting, the signals Gr and Gb output from the pixels 201G for image pickup, which are located in the phase difference AF row, are input to the interpolation processor 1301.

The phase difference evaluation value calculator 217 calculates the phase difference evaluation value through correlation calculation based on the signals SHA and SHB transmitted to the phase difference evaluation value calculator 217 via the horizontal signal line 215b and the switch 216. That is, the phase difference evaluation value calculator 217 calculates the phase difference evaluation value for focus detection by the phase difference detection method based on the signals SHA and SHB from the pixels 201SHA and 201SHB. The phase difference evaluation value calculated by the phase difference evaluation value calculator 217 is output to the controller 106 via the output terminal 219 of the solid-state image pickup element 102. The phase difference evaluation value calculator 217 outputs the phase difference evaluation value to the controller 106 as soon as the calculation of the phase difference evaluation value is completed regardless of whether or not the output of the image signal acquired by the pixel array 206 to the signal processor 104 is completed.

To the interpolation processor 1301, the signals R, Gr, Gb, and B read out from the normal rows are transmitted via the horizontal signal line 215a, and the signals Gr and Gb read out from the phase difference AF row are transmitted via the horizontal signal line 215b and the switch 216. The interpolation processor 1301 uses those signals as appropriate to perform the interpolation processing.

Figures 15A, 15B:
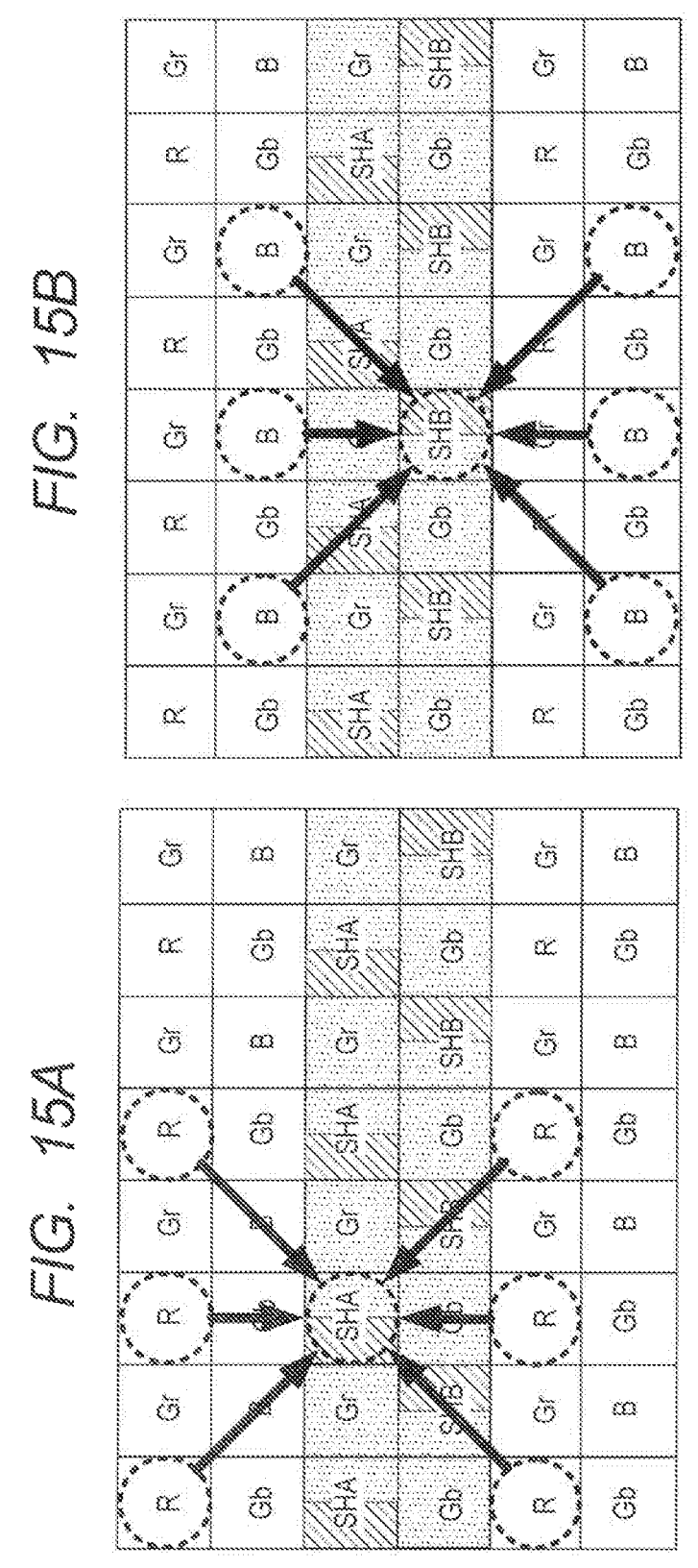

FIG. 15A and FIG. 15B are diagrams for conceptually illustrating interpolation processing. FIG. 15A is an illustration of a state in which the R signal that is absent at a position of the pixel 201SHA for phase difference detection is acquired by the interpolation processing. The interpolation processor 1301 generates a signal for compensating for a defect caused in the image signal acquired by the pixel array 206, that is, a defect caused because the pixel for phase difference detection is included in the plurality of pixels, through interpolation with use of signals from pixels other than the pixel for phase difference detection. Specifically, the interpolation processor 1301 uses the signals from the pixels 201 other than the pixel 201SHA for phase difference detection to generate the R signal that is absent at the position of the pixel 201SHA for phase difference detection through interpolation processing. More specifically, the interpolation processor 1301 acquires the R signal that is absent at the position of the pixel 201SHA for phase difference detection by averaging signals from six pixels 201R located around the pixel 201SHA for phase difference detection.

Further, FIG. 15B is an illustration of a state in which the B signal that is absent at a position of the pixel 201SHB for phase difference detection is acquired by the interpolation processing. The interpolation processor 1301 uses the signals from the pixels 201 other than the pixel 201SHB for phase difference detection to generate the B signal that is absent at the position of the pixel 201SHB for phase difference detection through interpolation processing. More specifically, the interpolation processor 1301 acquires the B signal that is absent at the position of the pixel 201SHB for phase difference detection by averaging signals from six pixels 201B located around the pixel 201SHB for phase difference detection. In general, the signals Gr and Gb transmitted via the horizontal signal line 215b are not subjected to special correction processing. However, the signals Gr and Gb transmitted via the horizontal signal line 215b may be subjected to correction processing as appropriate based on the difference in characteristics between the signals Gr and Gb transmitted via the horizontal signal line 215b and the signals Gr and Gb transmitted via the horizontal signal line 215a.

The signals R and B corresponding to the positions of the pixels 201SHA and 201SHB for phase difference detection and being generated by the interpolation processor 1301 through interpolation processing are transmitted to the contrast evaluation value calculator 218 and the signal processor 104. Further, the signals Gr and Gb output from the pixels 201G for image pickup, which are located in the phase difference AF row, are transmitted to the contrast evaluation value calculator 218 and the signal processor 104 via the interpolation processor 1301. Further, the signals R, Gr, Gb, and B output from the pixels 201 for image pickup, which are located in the normal row, are transmitted to the contrast evaluation value calculator 218 via the interpolation processor 1301.

The contrast evaluation value calculator 218 calculates the contrast evaluation value for focus detection by the contrast detection method based on the image signal including the signal generated by the interpolation processor 1301 through interpolation. The contrast evaluation value calculator 218 performs contrast calculation to calculate the contrast evaluation value based on the image signal subjected to the interpolation processing. The contrast evaluation value calculated by the contrast evaluation value calculator 218 is output to the controller 106 via the output terminal 220 of the solid-state image pickup element 102. The contrast evaluation value calculator 218 outputs the contrast evaluation value to the controller 106 as soon as the calculation of the contrast evaluation value is completed regardless of whether or not the output of the image signal acquired by the pixel array 206 to the signal processor 104 is completed.

In the fourth embodiment, the defects of the R and B signals caused in the pixels 201SHA and 201SHB for phase difference detection are eliminated through the interpolation processing performed by the interpolation processor 1301. Therefore, in the fourth embodiment, the contrast evaluation value may be calculated based on signals from a wide range including the phase difference AF rows. The contrast evaluation value is calculated based on the signals from a wide range including the phase difference AF rows, and hence, according to the fourth embodiment, the contrast evaluation value can be obtained with high accuracy.

Further, in the fourth embodiment, the defects are eliminated by the interpolation processor 1301, and hence the first image signals and the second image signals whose defects are eliminated may be used to obtain a highly-accurate image signal without decimation. The image signal is used for an image for live view at the time of live view display, for example.

In this case, a path through which the first image signal is output via the column signal line 202a and the horizontal signal line 215a is referred to as "first channel CH1", and a path through which the second image signal is output via the column signal line 202b and the horizontal signal line 215b is referred to as "second channel CH2".

FIG. 16 is a time chart for illustrating an operation of the image pickup apparatus according to the fourth embodiment. FIG. 16 is an illustration of an operation in a mode in which live view display is performed while an autofocus operation is performed, that is, an AF evaluation mode.

The AF evaluation mode is started when an AF control signal from the controller 106 is turned on. A timing at which the AF control signal is turned on is set to T0. At the timing T0, a vertical synchronization signal VD changes from a High level to a Low level. In synchronization with the vertical synchronization signal VD, acquisition of the first image signals, that is, acquisition of the signals from the pixels 201 located in the normal row, and acquisition of the second image signals, that is, acquisition of the signals from the pixels 201 located in the phase difference AF row, are started. As described above, the first image signals are output via the first channel CH1, and the second image signals are output via the second channel CH2.

During a period between T0 and TF1, the signals SHA and SHB are read out from the pixels 201SHA and 201SHB located in the phase difference AF row. The readout of the signals from the pixels 201SHA and 201SHB located in the phase difference AF row is performed in parallel to the readout of the signals from the pixels 201 located in the normal row. The signals SHA and SHB for phase difference evaluation, which are read out from the pixels 201SHA and 201SHB located in the phase difference AF row, are transmitted to the phase difference evaluation value calculator 217 via the horizontal signal line 215b and the switch 216. Then, during a period between TF1 and TF2, the phase difference evaluation value calculator 217 calculates the phase difference evaluation value. During a period between TF2 and TF3, the phase difference evaluation value calculated by the phase difference evaluation value calculator 217 is output to the controller 106.

During a period between T0 and TF1C, the acquisition of the image signal, that is, the acquisition of the signals for live view, is performed. The first image signals and the second image signals whose defects are eliminated construct the image signal. During a period between TF1C and TF2C, the contrast evaluation value calculator 218 calculates the contrast evaluation value based on the signal subjected to the interpolation processing by the interpolation processor 1301. During a period between TF2C and TF3C, the contrast evaluation value calculated by the contrast evaluation value calculator 218 is output to the controller 106.

The vertical synchronization signal VD changes to the Low level at each predetermined time interval $\Delta T$. The vertical synchronization signal that has changed to the Low level returns to the High level after an elapse of a predetermined time period. The predetermined time interval $\Delta T$ corresponds to a sum of a period required for acquisition of the signals for live view of one frame, a period required for calculating the contrast evaluation value, and a period required for outputting the contrast evaluation value. That is, the predetermined time interval $\Delta T$ corresponds to a sum of the one-frame live view signal acquisition period, a contrast evaluation value calculation period, and a contrast evaluation value outputting period. In the fourth embodiment, for example, the AF evaluation is performed three times within the predetermined time interval $\Delta T$. Acquisition of the signals for phase difference evaluation, that is, acquisition of the second image signals, is performed independently and in parallel to acquisition of the signals for live view, that is, acquisition of the first image signals.

The controller 106 determines whether or not a desired in-focus state can be obtained. When the desired in-focus state can be obtained, the AF control signal is turned off, that is, returned to the Low level. In FIG. 16, a timing T1 indicates the timing at which the AF control signal is turned off. When the AF control signal is turned off, the AF evaluation is canceled, but the image for live view is continuously acquired.

Figure 17:
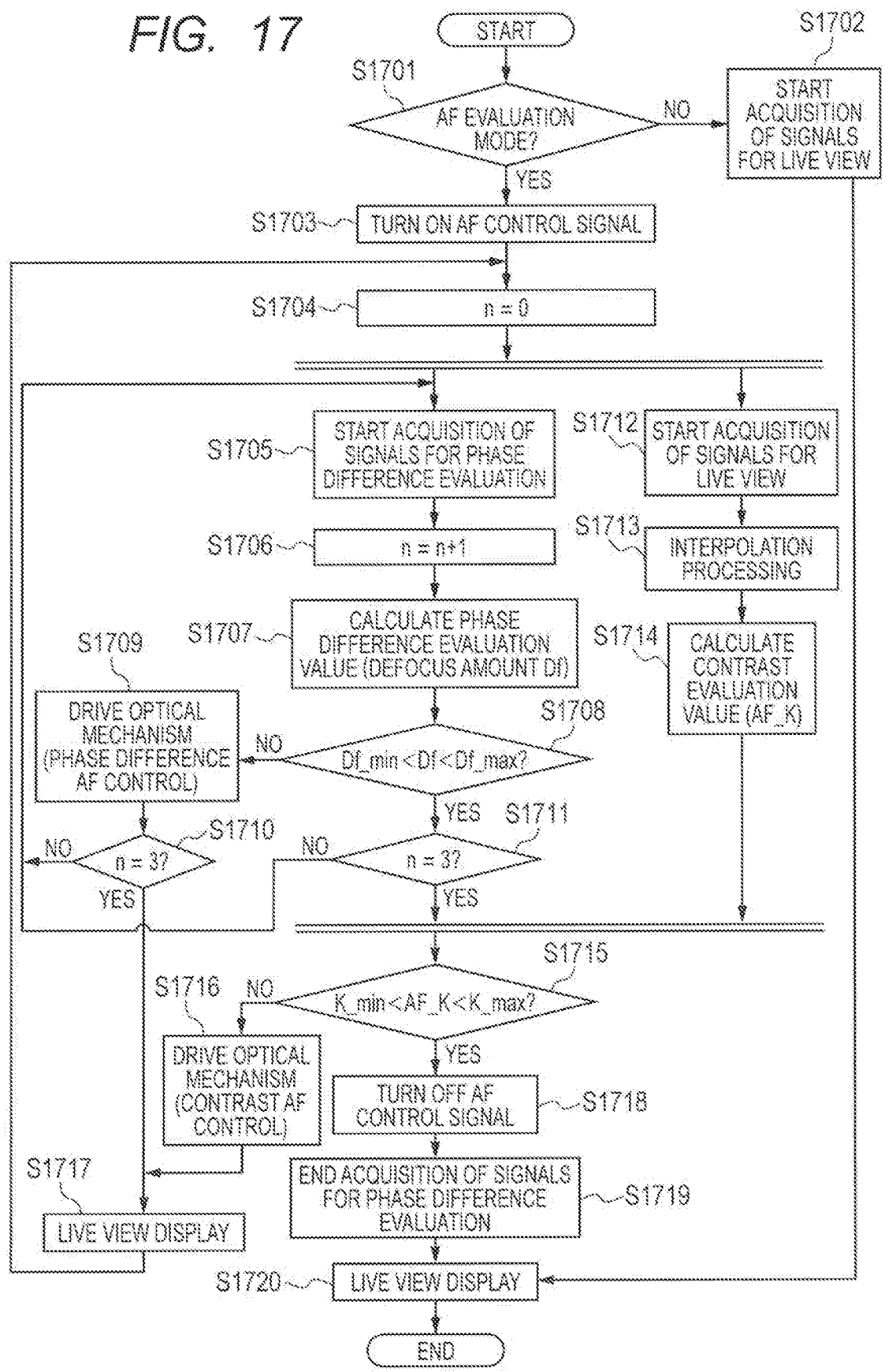
FIG. 17 is a flow chart for illustrating the operation of the image pickup apparatus according to the fourth embodiment.

FIG. 17 is a flow chart for illustrating the operation of the image pickup apparatus according to the fourth embodiment.

When the user operates the operation unit 108 to turn on the power of the image pickup apparatus 100, the controller 106 sets the image pickup apparatus 100 to a standby state. The controller 106 determines whether or not the image pickup apparatus 100 is required to be operated in the AF evaluation mode based on the operation performed by the user on the operation unit 108 or the like (Step S1701). When the image pickup apparatus 100 is not required to be operated in the AF evaluation mode (NO in Step S1701), acquisition of the signals for live view is started (Step S1702). Then, a live view image obtained by the acquisition of the signals for live view is displayed on the image display 109 (Step S1720). On the other hand, when the image pickup apparatus 100 is required to be operated in the AF evaluation mode (YES in Step S1701), the controller 106 turns on the AF control signal (Step S1703), and sets the number of times n of acquiring the signals for phase difference evaluation to 0 (Step S1704).

After that, the controller 106 causes the solid-state image pickup element 102 to start the acquisition of the signals for live view (Step S1712), and causes the solid-state image pickup element 102 to start the acquisition of the signals for phase difference evaluation (Step S1705). After the controller 106 causes the solid-state image pickup element 102 to start the acquisition of the signals for phase difference evaluation, the controller 106 increments the number of times n of acquiring the signals for phase difference evaluation (Step S1706). After that, the phase difference evaluation value is calculated by the phase difference evaluation value calculator 217 (Step S1707). In the calculation of the phase difference evaluation value, the phase difference evaluation value calculator 217 calculates the phase difference evaluation value based on the signals SHA and SHB for phase difference evaluation acquired in Step S1705, to thereby obtain the defocus amount Df. The phase difference evaluation value calculator 217 outputs the phase difference evaluation value, specifically, the defocus amount Df, to the controller 106 as soon as the calculation of the defocus amount Df is completed. After that, the processing proceeds to Step S1708.

In parallel to the operation of Step S1707, Step S1713 is performed. In Step S1713, the interpolation processor 1301 performs the interpolation processing. Then, after completion of the readout of the signals for live view is waited for, the contrast evaluation value is calculated by the contrast evaluation value calculator 218 (Step S1714). In the calculation of the contrast evaluation value, the contrast evaluation value calculator 218 calculates the contrast evaluation value AF_K based on the signals read out from the contrast AF row, that is, the signals that are subjected to interpolation processing as appropriate. The contrast evaluation value calculator 218 outputs the contrast evaluation value AF_K to the controller 106 as soon as the calculation of the contrast evaluation value AF_K is completed. The contrast evaluation value AF_K is used in Step S1715.

In Step S1708, the controller 106 determines whether or not the defocus amount Df calculated in Step S1707 falls within a range of a desired defocus amount based on Expression (1).

When the defocus amount Df does not satisfy Expression (1) (NO in Step S1708), the processing proceeds to Step S1709. In Step S1709, the controller 106 determines the feed-back control amount, that is, the focus lens drive amount, based on the defocus amount Df. Then, the controller 106 causes the drive unit 103 to control the optical mechanism 1011, to thereby drive the focus lens in the image pickup optical system 101 (phase difference AF control). In Step S1710, the controller 106 determines whether or not the number of times n of acquiring the signals for phase difference evaluation is 3. When the number of times n of acquiring the signals for phase difference evaluation is not 3, the processing returns to Step S1705. On the other hand, when the number of times n of acquiring the signals for phase difference evaluation is 3, live view display is performed (Step S1717), and the processing returns to Step S1704.

When the defocus amount Df satisfies Expression (1) (YES in Step S1708), the processing proceeds to Step S1711. In Step S1711, the controller 106 determines whether or not the number of times n of acquiring the signals for phase difference evaluation is 3. When the number of times n of acquiring the signals for phase difference evaluation is not 3 (NO in Step S1711), the processing returns to Step S1705. On the other hand, when the number of times n of acquiring the signals for phase difference evaluation is 3 (YES in Step S1711), the processing proceeds to Step S1715.

In Step S1715, the controller 106 determines whether or not the contrast evaluation value AF_K obtained in Step S1714 falls within a range of a desired contrast amount based on Expression (2).

When the contrast evaluation value AF_K does not satisfy Expression (2) (NO in Step S1715), the processing proceeds to Step S1716. In Step S1716, the controller 106 determines the feed-back control amount, that is, the focus lens drive amount, based on the contrast evaluation value AF_K. Then, the controller 106 causes the drive unit 103 to control the optical mechanism 1011, to thereby drive the focus lens in the image pickup optical system 101 (contrast AF control). After that, the processing proceeds to Step S1717. When the contrast evaluation value AF_K satisfies Expression (2) (YES in Step S1715), the controller 106 turns off the AF control signal (Step S1718). After that, the controller 106 ends the acquisition of the signals for phase difference evaluation (Step S1719). The controller 106 displays the signals for live view acquired in Step S1712 on the image display 109 (Step S1720).

As described above, according to the fourth embodiment, the defects caused in the image signal because the pixel array 206 includes the pixels 201SHA and 201SHB for phase difference detection are compensated for with use of the signals from the pixels 201 other than the pixels 201SHA and 201SHB for phase difference detection. Then, the contrast evaluation value for focus detection by the contrast detection method is calculated based on the image signal subjected to interpolation. The contrast evaluation value may be calculated based on the image signal in a wide range including the rows including the pixels 201SHA and 201SHB for phase difference detection. Therefore, according to the fourth embodiment, the contrast evaluation value can be obtained with high accuracy. That is, according to the fourth embodiment, the contrast evaluation value can be obtained with high accuracy even when the plurality of pixels 201 constructing the pixel array 206 include the pixels 201SHA and 201SHB for phase difference detection. A fast autofocus can be achieved due to the pixels 201SHA and 201SHB for phase difference detection, and hence according to the fourth embodiment, it is possible to provide the image pickup apparatus capable of achieving a fast autofocus with high accuracy.

Fifth Embodiment

A solid-state image pickup element, a method of controlling a solid-state image pickup element, and an image pickup apparatus according to a fifth embodiment are described with reference to FIG. 18 and FIG. 19. Like components in the solid-state image pickup element, the method of controlling a solid-state image pickup element, and the image pickup apparatus according to the first to fourth embodiments illustrated in FIG. 1 to FIG. 11D and FIG. 13 to FIG. 17 are denoted by like reference symbols to omit or simplify the description.

The image pickup apparatus 100 according to the fifth embodiment continuously acquires still images, that is, perform continuous shooting of still images.

Figure 18:
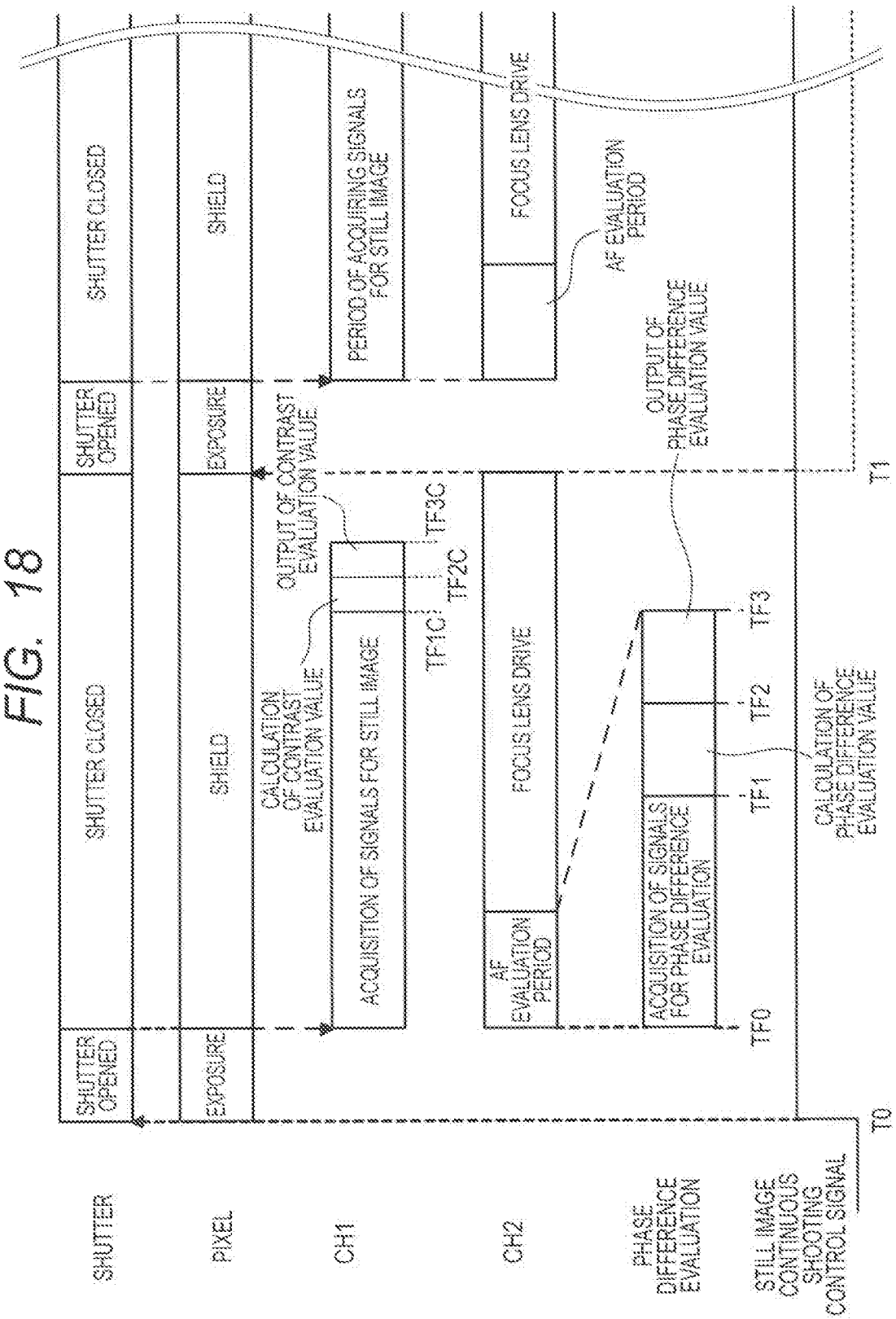
FIG. 18 is a time chart for illustrating an operation of an image pickup apparatus according to a fifth embodiment.

FIG. 18 is a time chart for illustrating an operation of the image pickup apparatus according to the fifth embodiment.

The still image continuous shooting mode, which is a mode of continuously acquiring the still images, is started when the still image continuous shooting control signal from the controller 106 is turned on. The controller 106 causes the drive unit 103 to control the mechanical shutter mechanism and the diaphragm mechanism of the optical mechanism 1011, and causes the drive unit 103 to control the solid-state image pickup element 102. Specifically, the reset operation is performed on the pixels 201, and the mechanical shutter (shutter) is opened so that exposure to the pixels 201 is started. After the exposure to the pixels 201 is started, photoelectric conversion by the photoelectric converters PD is started.

After an elapse of such a predetermined exposure time period that satisfies an exposure condition set in advance, the controller 106 causes the drive unit 103 to close the shutter. When the shutter is closed, the exposure to the pixels 201 is completed. After the exposure to the pixels 201 is completed, acquisition of the first image signals, that is, acquisition of the signals for the still image, and acquisition of the second image signals, that is, acquisition of the signals for phase difference evaluation, are started. The timing at which the acquisition of the first image signals and the acquisition of the second image signals are started is TF0. The first image signals are output via the first channel CH1, and the second image signals are output via the second channel CH2. The rows selected when the first image signals are to be acquired and the rows selected when the second image signals are to be acquired may be the same as those in the case of the first embodiment described above with reference to FIG. 5, for example.

During a period between TF0 and TF1, the signals SHA and SHB for phase difference evaluation are transmitted to the phase difference evaluation value calculator 217 via the horizontal signal line 215b and the switch 216. Then, during a period between TF1 and TF2, the phase difference evaluation value calculator 217 calculates the phase difference evaluation value. During a period between TF2 and TF3, the phase difference evaluation value calculated by the phase difference evaluation value calculator 217 is output to the controller 106. The controller 106 causes the drive unit 103 to drive the focus lens of the image pickup optical system 101 based on the phase difference evaluation value.

During a period between TF0 and TF1C, the signals for the still image are acquired. During a period between TF1C and TF2C, the contrast evaluation value calculator 218 calculates the contrast evaluation value. During a period between TF2C and TF3C, the contrast evaluation value calculated by the contrast evaluation value calculator 218 is output to the controller 106. The controller 106 causes the drive unit 103 to drive the focus lens of the image pickup optical system 101 based on and the contrast evaluation value. When the drive of the focus lens is completed, and the still image continuous shooting mode is not ended, the processing proceeds to the acquisition of the next still image.

Figure 19:
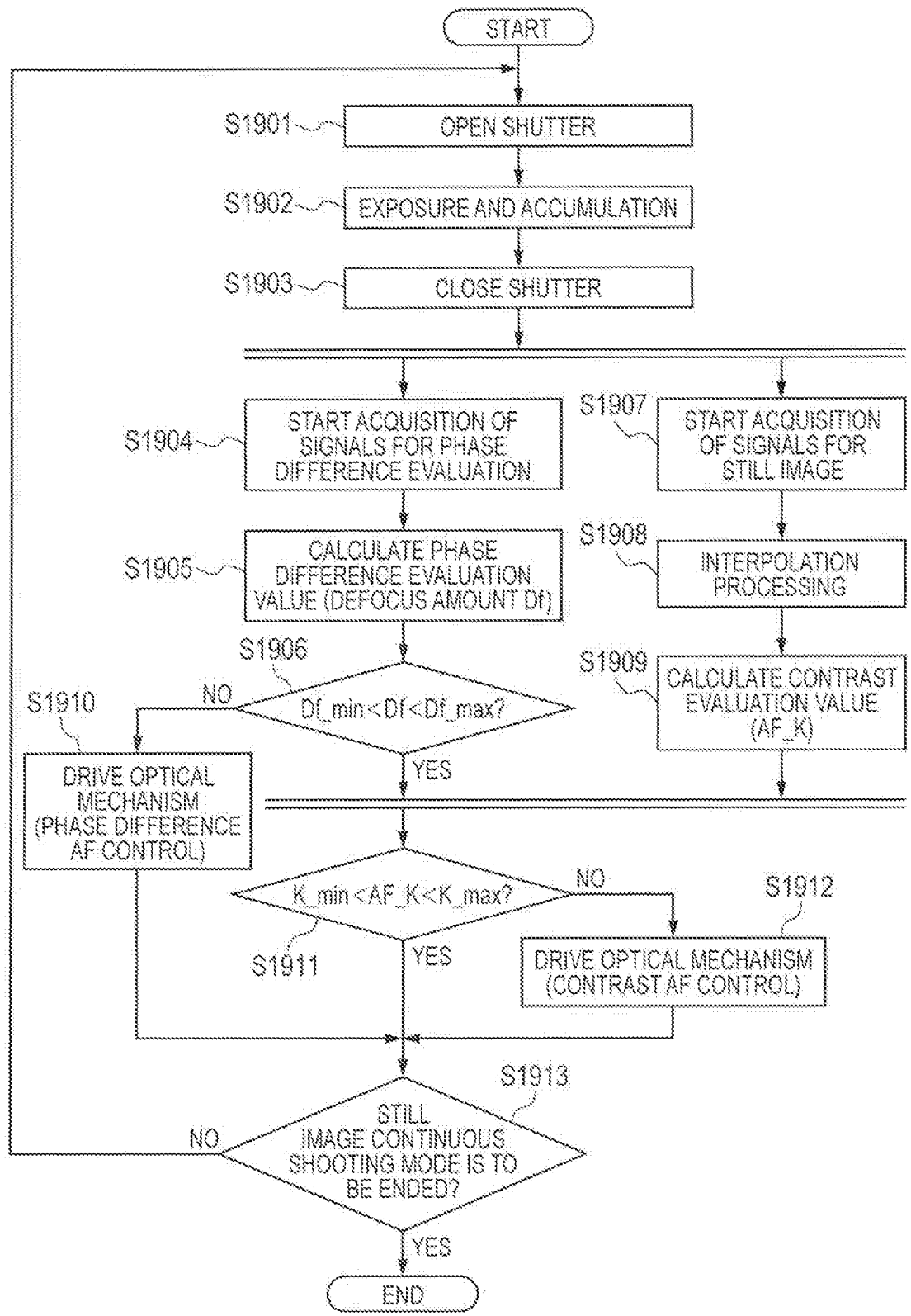
FIG. 19 is a flow chart for illustrating the operation of the image pickup apparatus according to the fifth embodiment.

FIG. 19 is a flow chart for illustrating the operation of the image pickup apparatus according to the fifth embodiment. First, the controller 106 causes the image pickup apparatus 100 to shift from the standby state to the still image continuous shooting mode based on the operation input performed by the user on the operation unit 108. In Step S1901, the controller 106 causes the drive unit 103 to open the mechanical shutter of the optical mechanism 1011. In this manner, the exposure to the pixels 201 is started, and the photoelectric conversion by the photoelectric converters PD is started so that charges are started to be accumulated (Step S1902). After an elapse of a predetermined exposure time period, the controller 106 causes the drive unit 103 to close the mechanical shutter of the optical mechanism 1011 (Step S1903).

Next, the controller 106 causes the solid-state image pickup element 102 to start the acquisition of the signals for the still image (Step S1907), and causes the solid-state image pickup element 102 to start the acquisition of the signals for phase difference evaluation (Step S1904). After that, the phase difference evaluation value is calculated by the phase difference evaluation value calculator 217 (Step S1905). In the calculation of the phase difference evaluation value (Step S1905), the phase difference evaluation value calculator 217 calculates the phase difference evaluation value based on the signals SHA and SHB for phase difference evaluation acquired in Step S1904, to thereby obtain the defocus amount Df. The phase difference evaluation value calculator 217 outputs the phase difference evaluation value, specifically, the defocus amount Df, to the controller 106 as soon as the calculation of the phase difference evaluation value is completed. After that, the processing proceeds to Step S1906.

In Step S1906, the controller 106 determines whether or not the defocus amount Df calculated in Step S1905 falls within a range of a desired defocus amount based on Expression (1) described above in the first embodiment. When the defocus amount Df does not satisfy Expression (1) (NO in Step S1906), the processing proceeds to Step S1910. In Step S1910, the controller 106 determines the feed-back control amount, that is, the focus lens drive amount, based on the defocus amount Df. In Step S1910, the controller 106 causes the drive unit 103 to control the optical mechanism 1011, to thereby drive the focus lens in the image pickup optical system 101 (phase difference AF control). After that, the processing proceeds to Step S1913. When the defocus amount Df satisfies Expression (1) (YES in Step S1906), the processing proceeds to Step S1911.

In parallel to the operation of Step S1905, Step S1908 is performed. In Step S1908, the interpolation processor 1301 performs the interpolation processing. Then, after completion of the readout of the signals for live view is waited for, the contrast evaluation value is calculated by the contrast evaluation value calculator 218 (Step S1909). In the calculation of the contrast evaluation value, the contrast evaluation value calculator 218 calculates the contrast evaluation value AF_K based on the signal read out from the contrast AF row, that is, the signal that is subjected to interpolation processing as appropriate. The contrast evaluation value calculator 218 outputs the contrast evaluation value AF_K to the controller 106 as soon as the calculation of the contrast evaluation value AF_K is completed. The contrast evaluation value AF_K is used in Step S1911.

In Step S1911, the controller 106 determines whether or not the contrast evaluation value AF_K obtained in Step S1909 falls within a range of a desired contrast amount based on Expression (2) described above in the first embodiment. When the contrast evaluation value AF_K does not satisfy Expression (2) (NO in Step S1911), the processing proceeds to Step S1912. In Step S1912, the controller 106 determines the feed-back control amount, that is, the focus lens drive amount, based on the contrast evaluation value AF_K. The controller 106 causes the drive unit 103 to control the optical mechanism 1011, to thereby drive the focus lens in the image pickup optical system 101 (contrast AF control). After that, the processing proceeds to Step S1913. When the contrast evaluation value AF_K satisfies Expression (2) (YES in Step S1911), the processing proceeds to Step S1913.

In Step S1913, the controller 106 determines whether or not to end the still image continuous shooting mode in accordance with the operation input performed by the user on the operation unit 108. When the still image continuous shooting mode is not to be ended (NO in Step S1913), the processing returns to Step S1901 to start the acquisition of the next still image. On the other hand, when the still image continuous shooting mode is to be ended (YES in Step S1913), the controller 106 causes the image pickup apparatus 100 to shift to the standby state without acquiring the next still image.

As described above, the present invention is applicable also to a case in which the still images are continuously taken. Also in the fifth embodiment, it is possible to provide the image pickup apparatus capable of achieving a fast autofocus with high accuracy.

Figure 34:
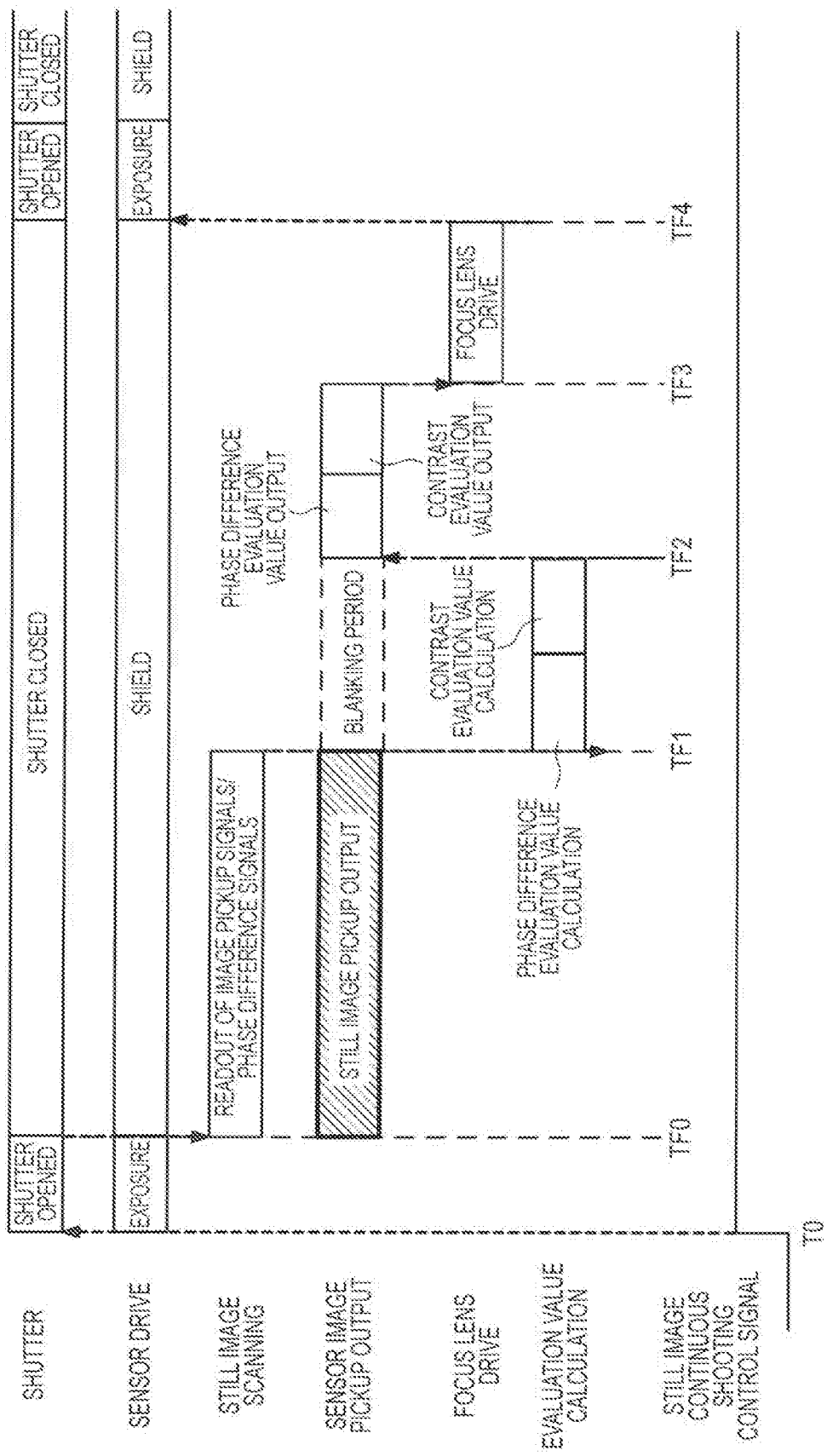
FIG. 34 is a timing chart for illustrating an example of a hybrid AF in an image pickup apparatus according to Reference Example 2.

FIG. 34 is a timing chart for illustrating an example of a hybrid AF in an image pickup apparatus according to Reference Example 2. In the hybrid AF, as described above, the focus detection is first performed with use of the phase difference detection method, and then the focus detection is performed with use of the contrast detection method. In the solid-state image pickup element, a plurality of phase difference detection pixels that each receive a pair of light fluxes that has passed through different pupil partial regions of the image pickup optical system are arranged in a part of the region of the pixel array. Now, the hybrid AF of Reference Example 2 is described with reference to FIG. 34.

For example, when the still image continuous shooting mode is started due to the user operation, the still image continuous shooting control signal representing the still image continuous shooting mode is set to HIGH. In this manner, at the same time as when the opening of the mechanical shutter is opened, the charges accumulated in the pixels are reset, and the exposure to the pixels is started (time T0). Then, after an elapse of a predetermined exposure period, the mechanical shutter is closed to block the light reflected from the object. Then, the exposure to the pixels is ended (time TF0).

Next, readout from the normal image pickup pixels is started (time TF0). After the image pickup signals are read out from all of the image pickup pixels, the readout from the phase difference detection pixels is subsequently started. After the phase difference signals are read out from all of the phase difference detection pixels (time TF1), the solid-state image pickup element calculates the phase difference evaluation value based on the phase difference signals, and calculates the contrast evaluation value based on the image pickup signals (period between TF1 and TF2).

Next, the solid-state image pickup element outputs, to a controller provided outside of the solid-state image pickup element, the calculated phase difference evaluation value and contrast evaluation value in a form of being added to the image pickup signals (period between TF2 and TF3). The controller drives the focus lens based on the phase difference evaluation value and the contrast evaluation value, to thereby perform the in-focus operation (period between TF3 and TF4). After the in-focus operation is completed, as in the time T0, the operation of exposure to the pixels is started to take the next still image (time TF4).

As described above, in the hybrid AF of Reference Example 2, after the completion of the readout of the image pickup signals for generating a photographing image is waited for, the calculation of the phase difference evaluation value and the contrast evaluation value is started, and hence there has been a problem in that the hybrid AF requires time until completion. As a result, for example, the continuous shooting speed in the still image continuous shooting is decreased. In embodiments described below, a method of increasing the speed of the hybrid AF is described.

Sixth Embodiment

An image pickup apparatus according to a sixth embodiment is described with reference to FIG. 20 to FIG. 30. The configuration of the image pickup apparatus according to the sixth embodiment is similar to the configuration of the image pickup apparatus according to the first embodiment described above with reference to FIG. 1. The image pickup apparatus 100 illustrated in FIG. 1 includes the image pickup optical system 101, the solid-state image pickup element 102, the drive unit 103, the signal processor 104, the compression/expansion unit 105, the controller 106, the light emission unit 107, the operation unit 108, the image display 109, and the image recording unit 110. The image pickup apparatus according to the sixth embodiment is applied to a still camera or a video camera, for example.

The image pickup optical system 101 includes an image pickup optical system for condensing light reflected from an object to the solid-state image pickup element 102, a lens, and the optical mechanism 1011. The optical mechanism 1011 is driven by the drive unit 103 to adjust the zooming, the shutter, the aperture value, and the focusing of the image pickup optical system 101. The solid-state image pickup element 102 includes pixels arranged in matrix, and an AD converter that read out the signals output from the pixels. The solid-state image pickup element 102 performs operations such as exposure to each pixel, signal readout, and reset. As the solid-state image pickup element 102, for example, an XY-readout-type CMOS image sensor is used. The drive unit 103 is controlled by the controller 106 to drive the optical mechanism 1011 and the solid-state image pickup element 102.

The AF evaluation value calculator 1021 in the solid-state image pickup element 102 is controlled by the controller 106 to calculate the phase difference evaluation value and the contrast evaluation value based on the image pickup signals and the phase difference signals read out from the pixels, to output the values to the controller 106. The controller 106 includes, for example, a central processor (CPU), a read only memory (ROM), and a random access memory (RAM). The controller 106 generally controls the image pickup apparatus by loading a program stored in the ROM or the like to the RAM and executing the program by the CPU.

The signal processor 104 is controlled by the controller 106 to subject the image pickup signals output from the solid-state image pickup element 102 to signal processing such as white balance adjustment processing, color correction processing, or auto-exposure (AE) processing, to output the corrected signals to the compression/expansion unit 105. The compression/expansion unit 105 is controlled by the controller 106 to subject the corrected image pickup signals to encoding processing to output the encoded signals to the controller 106. As the method of encoding the image pickup signals by the compression/expansion unit 105, for example, when a still image is to be generated, a joint photographic coding experts group (JPEG) method is used. Further, when a moving image is to be generated, a moving picture experts group (MPEG) method is used. The compression/expansion unit 105 may have a function of decoding in addition to the function of encoding.

The light emission unit 107 irradiates the object with light when the signal processor 104 determines that the brightness of the object is low by the AE processing, for example. As the light emission unit 107, for example, a stroboscopic device using a xenon tube or an LED light emitting device can be used. The operation unit 108 includes, for example, various operation keys including a shutter release button, a lever, and a dial. The operation unit 108 outputs a signal corresponding to the operation performed by the user on the controller 106. The image display 109 includes a display device, for example, a liquid crystal display (LCD), and an interface circuit that drive the display device. The image display 109 displays the image data output from the controller 106 on the display device. The image recording unit 110 is constructed with use of, for example, a portable semiconductor memory, an optical disc, a hard disk drive (HDD), or a magnetic tape. The image recording unit 110 records the encoded image data output from the controller 106.

Now, the flow of the signals and the data in the image pickup apparatus according to the sixth embodiment is briefly described. The image pickup signals read out from the pixels of the solid-state image pickup element 102 are subjected to correlated double sampling (CDS) processing, automatic gain control (AGC) processing, or the like to be digitalized by the AD conversion unit.

The digitalized image pickup signals are output to the signal processor 104 and the AF evaluation value calculator 1021 in the solid-state image pickup element 102. The AF evaluation value calculator 1021 calculates the contrast evaluation value based on the contrast information of the image pickup signals to output the contrast evaluation value to the controller 106. The signal processor 104 subjects the image pickup signals to image quality correction processing to output the corrected signals to the controller 106. The controller 106 displays the image pickup signals as a live view image on the image display 109. As a result, the user can adjust the angle of view or the like while viewing the displayed live view image.

Next, when the shutter release button of the operation unit 108 is depressed under a state in which the live view image is displayed on the image display 109, the solid-state image pickup element 102 outputs the image pickup signals to the signal processor 104. The signal processor 104 subjects the image pickup signals to image quality correction processing to output the corrected signals to the compression/expansion unit 105. The compression/expansion unit 105 encodes the corrected image pickup signals to output the encoded signals to the controller 106. The controller 106 records the encoded image pickup signals in the image recording unit 110 as a still image file or a moving image file.

Next, when a play button of the operation unit 108 is depressed under a state in which the still image file or the moving image file recorded in the image recording unit 110 is selected, the controller 106 reads out the selected still image file or moving image file from the image recording unit 110 to output the still image file or the moving image file to the compression/expansion unit 105. The compression/expansion unit 105 decodes the read image data to output the decoded image data to the controller 106. The controller 106 displays the decoded image data on the image display 109. As a result, the user can play and view the recorded still image or moving image.

Meanwhile, the AF evaluation value calculator 1021 performs correlation calculation with respect to a pair of phase difference signals output from the phase difference detection pixels, to thereby obtain a relative image deviation amount. Then, the defocus amount of the image pickup optical system 101 is calculated (detected) based on the image deviation amount. The controller 106 calculates the drive amount for moving the focus lens to a position close to the in-focus position based on the defocus amount. Then, the drive unit 103 is controlled based on the drive amount to drive the focus lens in the optical mechanism 1011. Thus, the in-focus operation is performed.

Further, while controlling the optical mechanism 1011 to move the focus lens, the controller 106 acquires the contrast evaluation value from the AF evaluation value calculator 1021 at a predetermined cycle. Then, the in-focus operation is performed by driving the focus lens in a direction in which the contrast evaluation value calculated based on the image pickup signals of the still image taken at this time becomes larger than the contrast evaluation value calculated based on the image pickup signals of the still image taken at a previous time.

Figure 20:
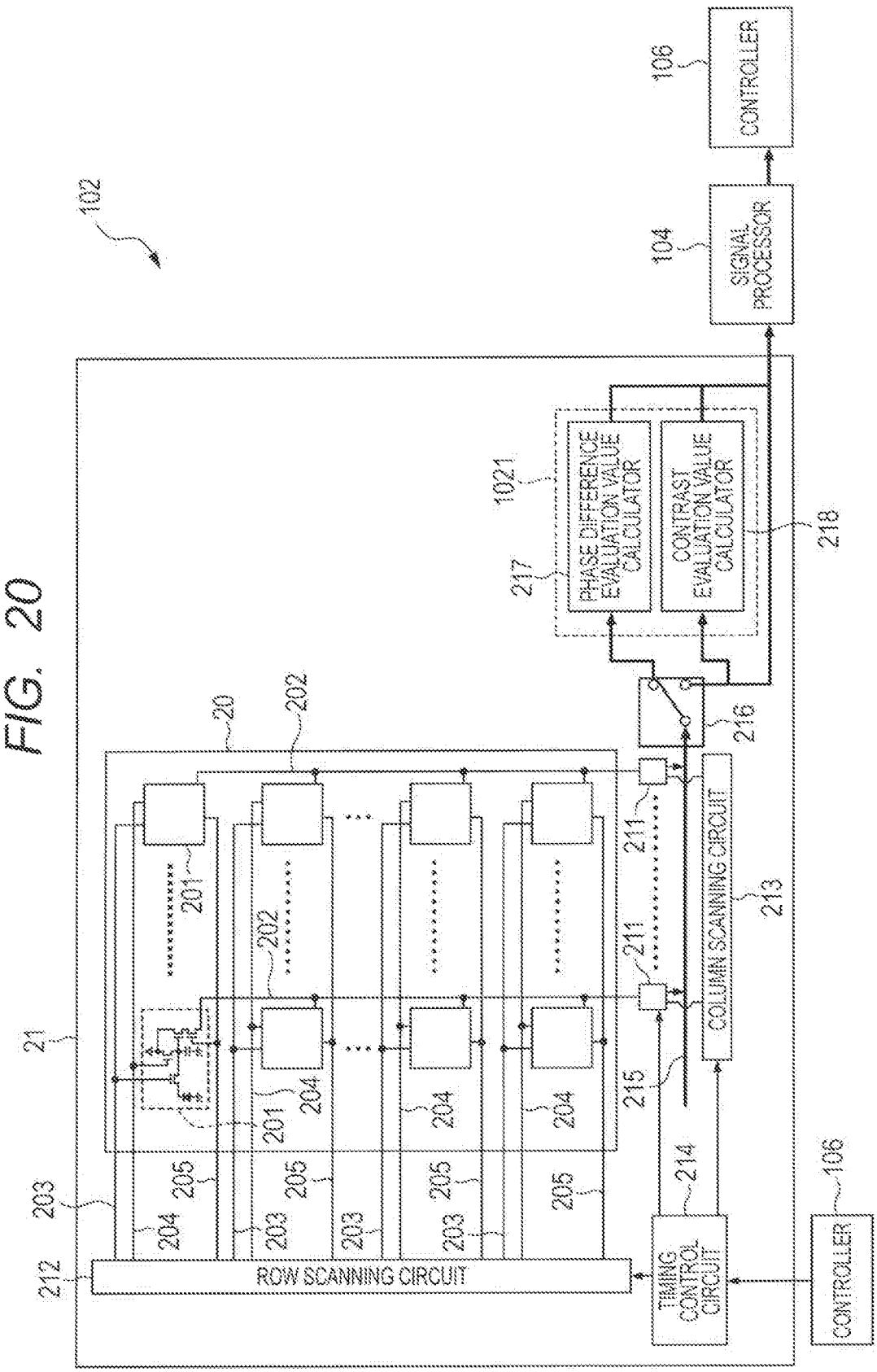
FIG. 20 is a schematic diagram for illustrating a configuration of a solid-state image pickup element according to a sixth embodiment.

FIG. 20 is a schematic diagram for illustrating a configuration of the solid-state image pickup element 102 according to the sixth embodiment. As illustrated in FIG. 2A, the solid-state image pickup element 102 according to the sixth embodiment includes the first semiconductor chip and the second semiconductor chip 21 stacked on the first semiconductor chip 20.

The first semiconductor chip 20 includes the plurality of pixels 201 arranged in matrix. Each of the plurality of pixels 201 is connected to, for each row, the transfer signal line 203, the reset signal line 204, and the row selection signal line 205, and is connected to, for each column, a column signal line 202.

Meanwhile, the second semiconductor chip 21 has arranged thereon the AD conversion units 211, the row scanning circuit 212, a column scanning circuit 213, the timing control circuit 214, the switch 216, and the AF evaluation value calculator 1021. As described above, the pixels 201 and the peripheral circuits therefor are arranged separately on the first semiconductor chip 20 and the second semiconductor chip 21. In this manner, the peripheral circuits may have thinner wiring and higher density, and thus the solid-state image pickup element 102 can be increased in speed, downsized, and sophisticated in function.

The AD conversion unit 211 subjects the signal output to the column signal line 202 to AD conversion to output the signal to the horizontal signal line 215. The row scanning circuit 212 scans respective rows of the solid-state image pickup element 102, and the column scanning circuit 213 scans respective columns of the solid-state image pickup element 102. The timing control circuit 214 is controlled by the controller 106 to control the scanning timing of the row scanning circuit 212 and the column scanning circuit 213.

The switch 216 distributes and supplies the digital signals output to the horizontal signal line 215 to the phase difference evaluation value calculator 217, and the contrast evaluation value calculator 218 and the signal processor 104. The AF evaluation value calculator 1021 includes the phase difference evaluation value calculator 217 and the contrast evaluation value calculator 218. The AF evaluation value calculator 1021 detects (calculates) the AF evaluation value to be used for focus detection. The phase difference evaluation value calculator 217 and the contrast evaluation value calculator 218 are described in detail later.

Figure 21:
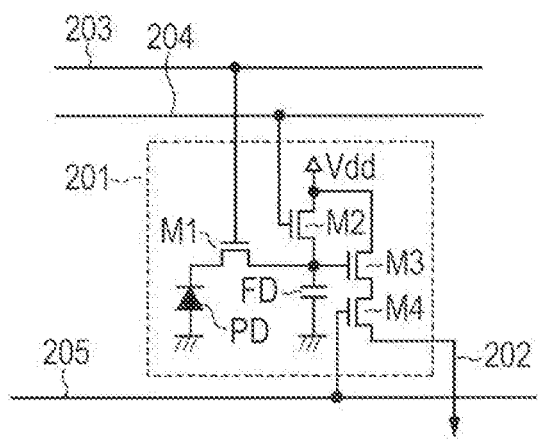
FIG. 21 is a schematic diagram for illustrating a configuration of a pixel in the image pickup element according to the sixth embodiment.

FIG. 21 is a schematic diagram for illustrating a configuration of the pixel 201 in the image pickup element 102 according to the sixth embodiment. The pixel 201 includes the photoelectric converter PD, the transfer transistor M1, the reset transistor M2, the amplification transistor M3, and the selection transistor M4. As those transistors, for example, n-channel metal-oxide-semiconductor field-effect transistors (MOSFETs) can be used.

The transfer signal line 203, the reset signal line 204, and the row selection signal line 205 are connected to the gate terminal of the transfer transistor M1, the gate terminal of the reset transistor M2, and the gate terminal of the selection transistor M4, respectively. Control signals are output from the row scanning circuit 212 to those signal lines so that the pixels 201 in the same row are simultaneously driven. With such a configuration, an operation of a row sequential operation rolling shutter or an operation of an all-row simultaneous drive global shutter can be achieved. The column signal line 202 is connected to the source terminal of the selection transistor M4.

The photoelectric converter PD accumulates charges generated through photoelectric conversion. A p-side of the photoelectric converter is grounded, and an n-side thereof is connected to the source terminal of the transfer transistor M1. When the transfer transistor M1 is turned on, the charges accumulated in the photoelectric converter PD are transferred to the floating diffusion FD. In this case, the floating diffusion FD refers to a floating capacitance region formed at a node of three terminals, specifically, the drain terminal of the transfer transistor M1, the gate terminal of the amplification transistor M3, and the source terminal of the reset transistor M2.

The amplification transistor M3 outputs a signal corresponding to the amount of charges transferred to the floating diffusion FD. The power supply voltage Vdd is supplied to the drain terminal of the amplification transistor M3. The selection transistor M4 selects the pixel from which the signal is read out. The drain terminal of the selection transistor M4 is connected to the source terminal of the amplification transistor M3, and the source terminal of the selection transistor M4 is connected to the column signal line 202. When the selection transistor M4 is turned on, a signal corresponding to the amount of charges transferred to the floating diffusion FD is output to the column signal line 202. The reset transistor M2 resets the charges transferred to the floating diffusion FD. The power supply voltage Vdd is supplied to the drain terminal of the reset transistor M2, and the source terminal of the reset transistor M2 is connected to the floating diffusion FD.

Figure 22B:
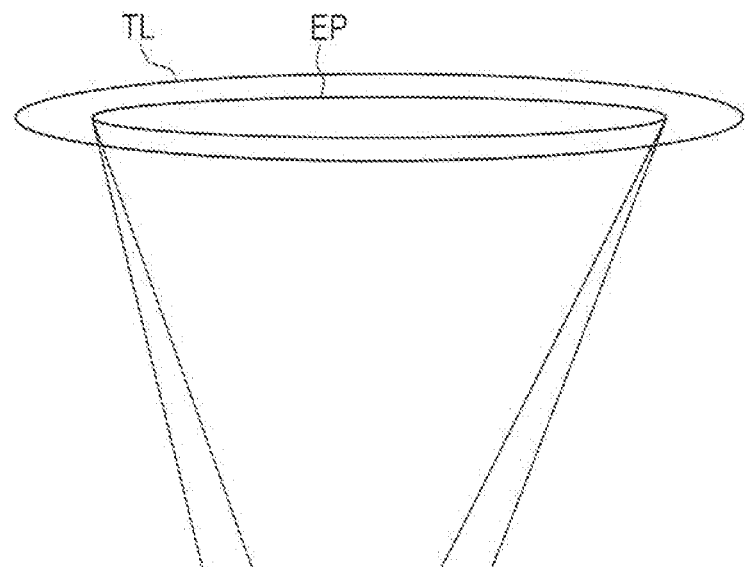
FIG. 22A and FIG. 22B are schematic diagrams for illustrating a structure of image pickup pixels of the image pickup element according to the sixth embodiment.
Figure 22A:
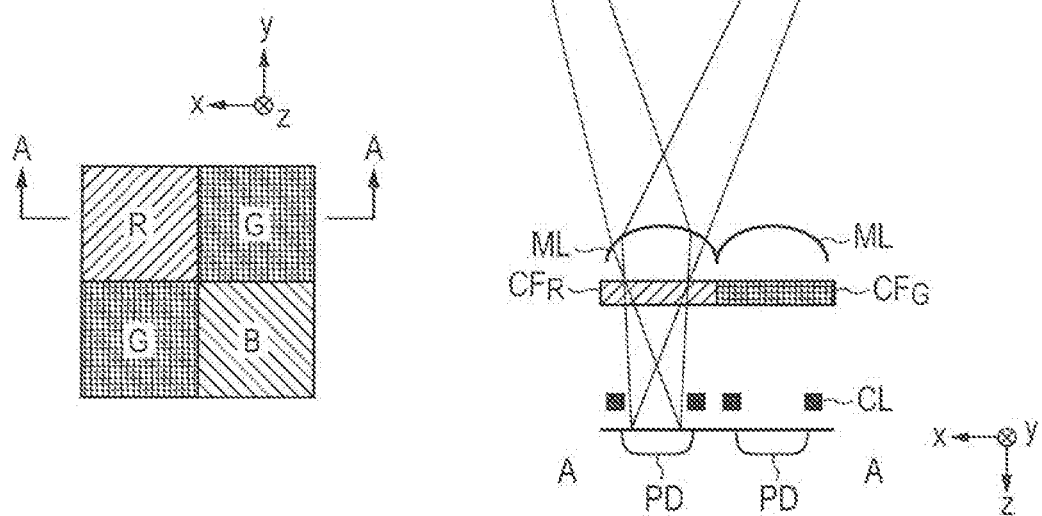

FIG. 22A and FIG. 22B are schematic diagrams for illustrating a structure of image pickup pixels of the image pickup element 102 according to the sixth embodiment. In this case, the image pickup pixel refers to a normal pixel 201 not including a sub-pixel for focus detection. FIG. 22A is a plan view of the image pickup pixels, and FIG. 22B is a sectional view taken along the line A-A of FIG. 22A. For example, in the solid-state image pickup element 102 employing the Bayer arrangement, as illustrated in FIG. 22A, pixels having spectral sensitivity of green (G) are arranged at two diagonal locations in the pixels of two rows and two columns, and pixels having spectral sensitivity of red (R) and blue (B) are arranged at the two remaining locations.

The image pickup pixels illustrated in FIG. 22B include the microlenses ML, the color filters CF, the wiring layer CL, and the photoelectric converters PD. In this case, the suffix of the color filter CF represents the color of the light that is allowed to pass therethrough. For example, the color filter $CF_R$ allows red light (Red) to pass therethrough, and the color filter $CF_G$ allows green light (Green) to pass therethrough. Similarly, the color filter $CF_B$ (not shown) allows blue light (Blue) to pass therethrough. The photoelectric converter PD corresponds to the photoelectric converter PD of the CMOS sensor illustrated in FIG. 21. The wiring layer CL corresponds to the signal lines for transmitting various signals in the CMOS sensor.

The microlens ML and the photoelectric converter PD of the image pickup pixel are configured so that the light flux that has passed through the image pickup optical system TL can be introduced as effectively as possible. In other words, the exit pupil EP of the image pickup optical system TL and the photoelectric converter PD are arranged in a conjugate relationship due to the microlens ML. As a result, the exit pupil EP corresponding to the photoelectric converter PD has a large diameter, and the effective area of the photoelectric converter PD is increased. Thus, the light flux from the object can be efficiently introduced to improve the S/N ratio. FIG. 22B is an illustration of the structure of the R pixel, but the G pixel and the B pixel also have the same structure.

FIG. 23A and FIG. 23B are schematic diagrams for illustrating the structure of the phase difference detection pixel in the solid-state image pickup element 102 according to the sixth embodiment. In this case, the phase difference detection pixel refers to the pixel 201 including the sub-pixel for focus detection. FIG. 23A is a plan view of the phase difference detection pixel, and FIG. 23B is a sectional view taken along the line B-B of FIG. 23A.

Among the RGB signals output from the RGB pixels, the G signal is a main component of the brightness information. Human image recognition characteristics are sensitive to brightness information, and hence the image quality deterioration is easily recognized when the G signal is defective. Meanwhile, the R signal or the B signal is a signal for acquiring color information, but humans are insensitive to color information, and hence the image quality deterioration is less noticed even when the R signal or the B signal is slightly defective. In view of this, in the sixth embodiment, as illustrated in FIG. 23A, two G pixels of the four pixels arranged in two rows and two columns are left as normal image pickup pixels, and sub-pixels SHA and SHB are arranged at a predetermined ratio at locations of the R pixel and the B pixel.

In the sixth embodiment, the sub-pixel SHA and the sub-pixel SHB construct the phase difference detection pixel. The microlens ML and the photoelectric converter PD have substantially the same structure as those of the image pickup pixel illustrated in FIG. 22B. In the sixth embodiment, the phase difference signal output from the sub-pixel is not used as the image pickup signal for generating the photographing image. Therefore, as illustrated in FIG. 23B, a color filter $CF_W$ being a transparent film (white film) is arranged instead of the color filter for color separation. The phase difference detection pixel can also be used as the image pickup pixel. In this case, a sum of the pair of phase difference signals output from the phase difference detection pixels is used as the image pickup signal.

In the phase difference detection pixel illustrated in FIG. 23B, pupil division is performed in the x direction. The opening portion $OP_{HA}$ of the wiring layer CL of the sub-pixel SHA is deviated to the right side (−x direction), and the photoelectric converter PD of the sub-pixel SHA receives a light flux that has passed through the exit pupil region (first pupil region) $EP_{HA}$ on the left side (+x direction) of the image pickup optical system TL. Meanwhile, the opening portion $OP_{HB}$ of the wiring layer CL of the sub-pixel SHB is deviated to the left side (+x direction), and the photoelectric converter PD of the sub-pixel SHB receives a light flux that has passed through the exit pupil region (second pupil region) $EP_{HB}$ on the right side (−x direction) of the image pickup optical system TL.

An object image acquired by the plurality of sub-pixels SHA (first pixel group) regularly arranged in the x direction is referred to as "image A" (first image). Further, an object image acquired by the plurality of sub-pixels SHB (second pixel group) regularly arranged in the x direction is referred to as "image B" (second image). The relative deviation amount (phase difference) between the image A and the image B is detected so that the defocus amount of the image pickup optical system TL with respect to the object can be calculated.

Now, referring back to FIG. 20, the operation of the solid-state image pickup element 102 is described. The image pickup signals and the phase difference signals that are output to the column signal line 202 are digitalized by the AD conversion unit 211. The digitalized phase difference signals and image pickup signals are output to the switch 216 via the horizontal signal line 215. The switch 216 switches the output destination of the signals read out via the column signal line 202. With the switch 216, the phase difference signals are output to the phase difference evaluation value calculator 217, and the image pickup signals are output to the contrast evaluation value calculator 218 and the signal processor 104.

The phase difference evaluation value calculator 217 performs correlation calculation based on the phase difference signals to calculate the phase difference evaluation value. Meanwhile, the contrast evaluation value calculator 218 performs contrast calculation based on the image pickup signals to calculate the contrast evaluation value. The calculated phase difference evaluation value and contrast evaluation value are output to the controller 106 via the signal processor 104 in a form of being added to the image pickup signals at a timing at which the readout of the image pickup signals from the image pickup pixels is completed.

Next, with reference to FIG. 24 to FIG. 27B, focus detection by the phase difference method is described. FIG. 24 is a schematic diagram for illustrating a focus detection region 602 on a pixel array 601 in the solid-state image pickup element 102 according to the sixth embodiment. The focus detection region 602 illustrated in FIG. 24 represents a pixel region in which focus detection can be performed by the phase difference method. Further, shift regions 603 on both sides of the focus detection region 602 are regions necessary for correlation calculation. That is, for focus detection by the phase difference method, a pixel region 604 including the focus detection region 602 and the shift regions 603 is necessary. Symbols p, q, s, and t of FIG. 24 represent coordinates in the horizontal direction (x-axis direction). Among the symbols, p and q represent x coordinates at the start point and the end point of the pixel region 604, respectively, and s and t represent x coordinates at the start point and the end point of the focus detection region 602, respectively.

Figure 25A:
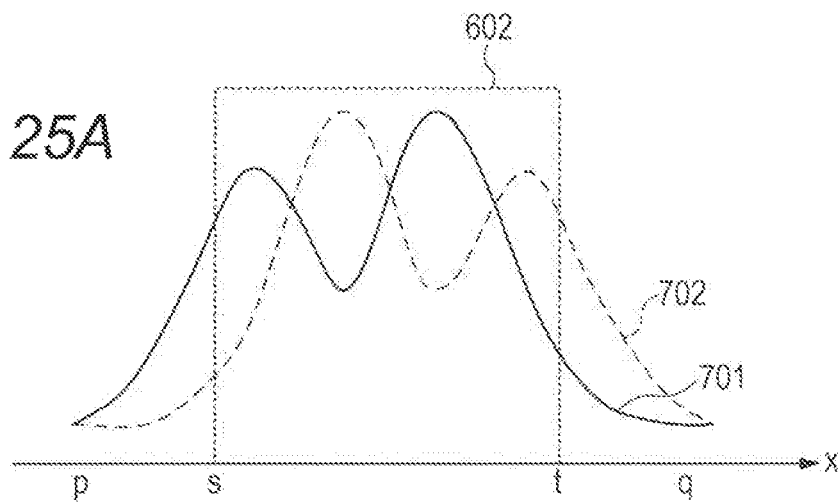
FIG. 25A, FIG. 25B, and FIG. 25C are schematic graphs for showing an example of a pair of phase difference signals for focus detection in the image pickup element according to the sixth embodiment.
Figure 25B:
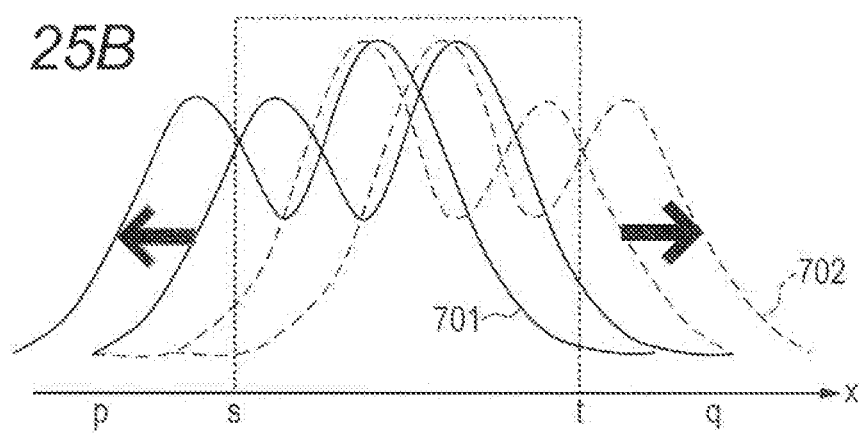
Figure 25C:
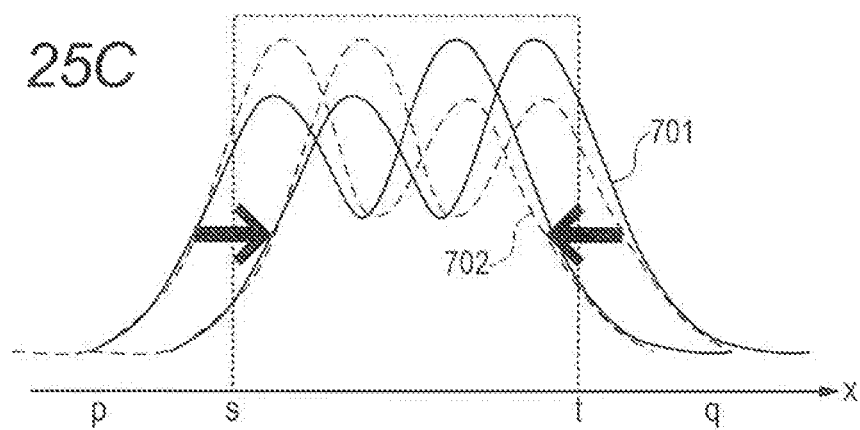

FIG. 25A to FIG. 25C are schematic graphs for showing an example of a pair of phase difference signals 701 and 702 for focus detection in the image pickup element 102 according to the sixth embodiment. In FIG. 25A, one phase difference signal 701 of the pair of phase difference signals subjected to filtering is indicated by the solid line, and the other phase difference signal 702 is indicated by the broken line. The phase difference signals 701 and 702 of FIG. 25A technically represent a pair of object images obtained along the x direction, which are obtained from the plurality of sub-pixels SHA and SHB arranged in the x direction. In the following description, such a pair of object images is referred to as "phase difference signals 701 and 702".

When the correlation amount of the pair of phase difference signals 701 and 702 is to be calculated, the phase difference signals 701 and 702 are each shifted by one pixel in directions opposite to each other as shown in FIG. 25B and FIG. 25C. FIG. 25B is a graph for showing the result of shifting the phase difference signals 701 and 702 shown in FIG. 25A in directions of the arrows shown in FIG. 25B. Meanwhile, FIG. 25C is a graph for showing the result of shifting the phase difference signals 701 and 702 shown in FIG. 25A in directions of the arrows shown in FIG. 25C, which are opposite to the arrows shown in FIG. 25B.

The phase difference evaluation value calculator 217 calculates, while shifting the pair of phase difference signals 701 and 702 by one pixel as shown in FIG. 25B and FIG. 25C, a sum of the absolute value of the difference between the phase difference signal 701 and the phase difference signal 702 in the focus detection region 602. A correlation amount COR is obtained by Expression (3) with use of a shift amount i, a minimum shift amount p−s, a maximum shift amount q−t, a start coordinate s of the focus detection region 602, and an end coordinate t of the focus detection region 602.

$$COR[i] = \sum_{x=s}^{t} |A[x+i] - B[x-i]|  \quad (3)$$

$$\{(p-s) < i < (q-t)\}$$

Figure 26A:
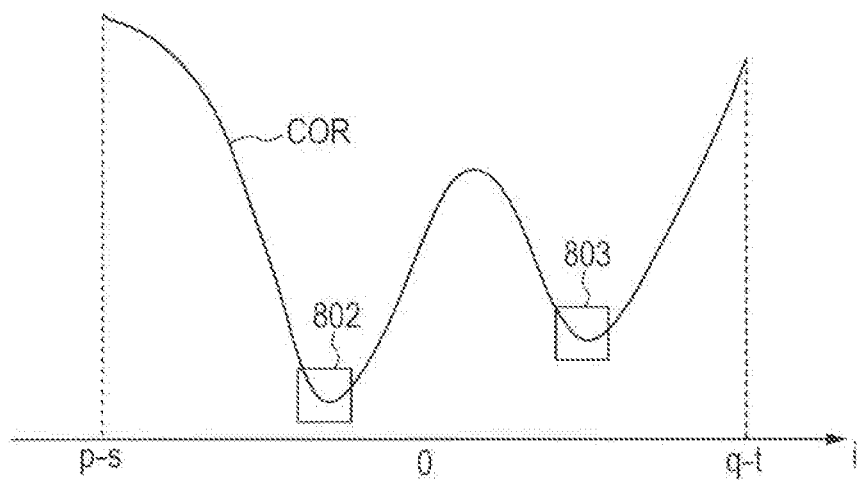
FIG. 26A and FIG. 26B are graphs for showing a relationship between a shift amount and a correlation amount of the phase difference signals in the image pickup element according to the sixth embodiment.
Figure 26B:
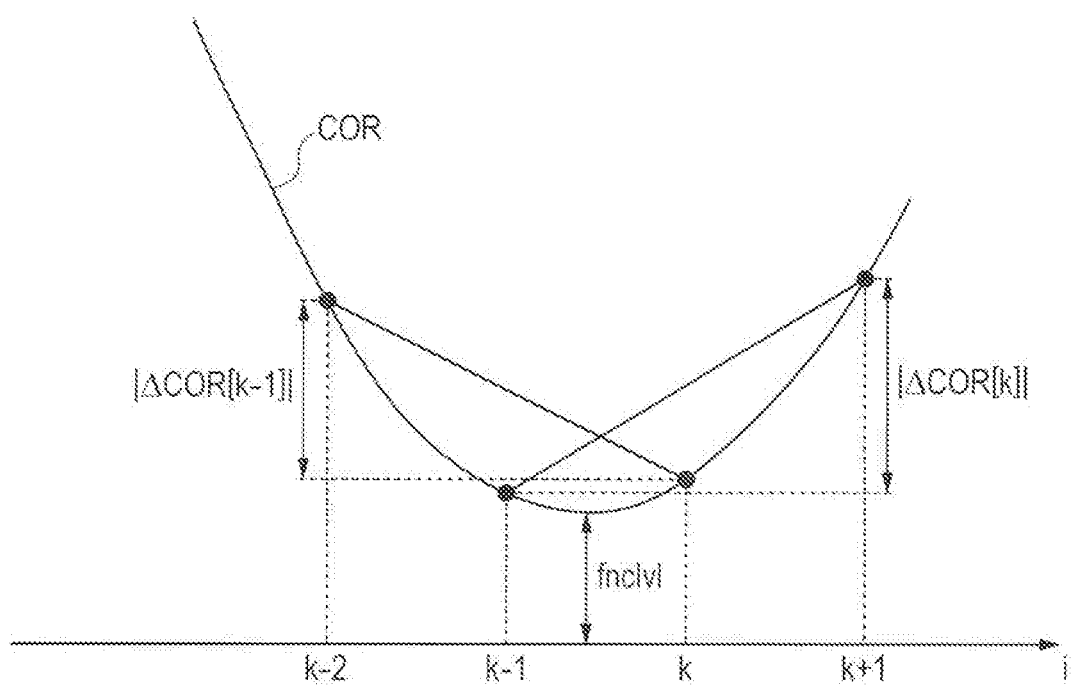

FIG. 26A and FIG. 26B are graphs for showing a relationship between the shift amount i and the correlation amount COR of the phase difference signals in the image pickup element 102 according to the sixth embodiment. The lateral axis represents the shift amount i, and the vertical axis represents the correlation amount COR. The correlation amount COR shown in FIG. 26A changes in accordance with the shift amount i, and the change amount of the correlation amount COR is zero at extreme values 802 and 803. In FIG. 26B, the vicinity of the extreme value 802, which is a smaller one of the extreme values 802 and 803, is shown in an enlarged manner. A correlation change amount ΔCOR per unit shift amount i is obtained by Expression (4) with use of the shift amount i, the minimum shift amount p−s, the maximum shift amount q−t, the start coordinate s of the focus detection region 602, and the end coordinate t of the focus detection region 602.

ΔCOR[i]=COR[i−1]−COR[i+1]

$$\{(p-s+1) < (q-t-1)\} \quad (4)$$

Figure 27A:
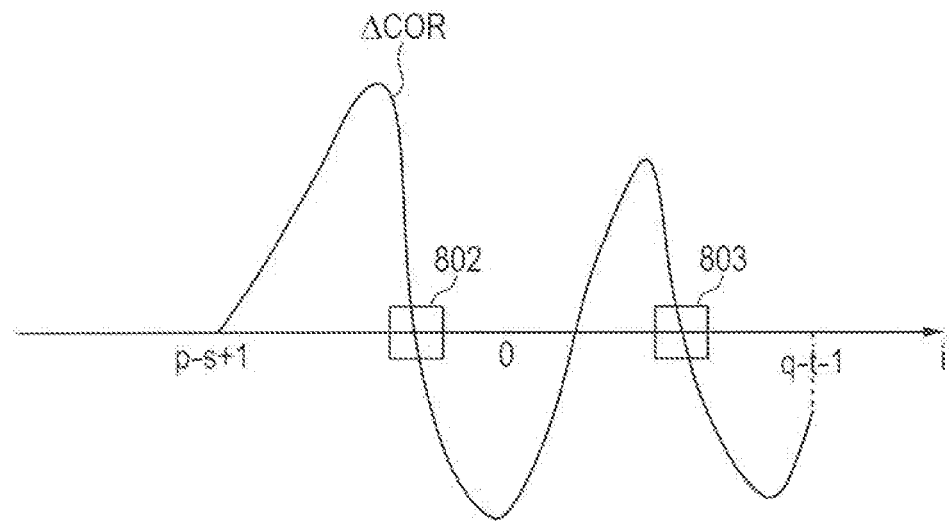
FIG. 27A and FIG. 27B are graphs for showing a relationship between the shift amount and a correlation change amount of the phase difference signals in the image pickup element according to the sixth embodiment.
Figure 27B:
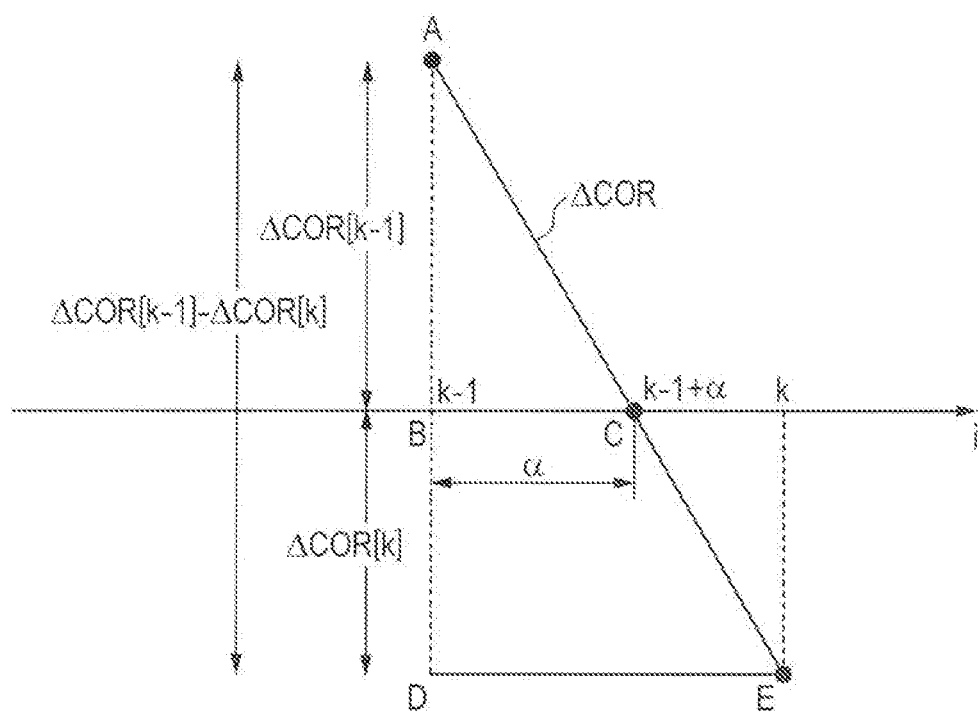

FIG. 27A and FIG. 27B are graphs for showing a relationship between the shift amount i and the correlation change amount ΔCOR of the phase difference signals in the image pickup element 102 according to the sixth embodiment. The lateral axis represents the shift amount i, and the vertical axis represents the correlation change amount ΔCOR per unit shift amount i. The correlation change amount ΔCOR shown in FIG. 27A changes in accordance with the shift amount i, and the value changes from negative to positive at the extreme values 802 and 803. A point at which the correlation change amount ΔCOR becomes zero is called zero-crossing, at which the pair of phase difference signals 701 and 702 has the highest degree of coincidence. The shift amount i for obtaining the zero-crossing corresponds to the image deviation amount.

The phase difference evaluation value calculator 217 outputs the shift amount i for obtaining the zero-crossing to the controller 106 as the phase difference evaluation value for calculating the drive amount of the focus lens. FIG. 27B is a graph for showing the vicinity of the extreme value 802 for obtaining the zero-crossing in an enlarged manner. The shift amount i=α+β for obtaining the zero-crossing is divided into an integer part β (=k−1) and a decimal part α. The decimal part α of the image deviation amount is calculated by Expression (5) based on the similarity relationship between a triangle ABC and a triangle ADE shown in FIG. 27B.

$$AB:AD=BC:DE$$

$$\Delta COR[k-1]:\Delta COR[k-1]-\Delta COR[k]=a:k-(k-1)$$

$$\alpha=\Delta COR[k-1]/(\Delta COR[k-1]-\Delta COR[k]) \quad (5)$$

Further, the integer part β of the image deviation amount is calculated by Expression (6).

$$\beta=k-1 \quad (6)$$

As shown in FIG. 27A, when the correlation change amount ΔCOR has a plurality of zero-crossings, the shift amount i at the zero-crossing when the correlation change amount ΔCOR has the largest change ratio (hereinafter referred to as "steepness") is output to the controller 106 as the phase difference evaluation value. The steepness is an index that represents the easiness of the focus detection, and the focus detection can be performed with higher accuracy as the steepness is increased. A steepness maxder is obtained by Expression (7).

$$\max der=|\Delta COR[k-1]|+|\Delta COR[k]| \quad (7)$$

Next, a method of calculating the reliability of the phase difference evaluation value is described. The evaluation value reliability is defined by a degree of coincidence fnclvl of the pair of phase difference signals 701 and 702. The degree of coincidence fnclvl is an index that represents an accuracy of the image deviation amount, and the focus detection can be performed with higher accuracy as the value is increased. The degree of coincidence fnclvl is calculated by Expression (8) as a reciprocal of the magnitude of the extreme value 802 shown in FIG. 26B.

(a): when $|\Delta COR[k-1]|\times 2 \leq \max der$, $$fnclvl=4/(COR[k-1]+\Delta COR[k-1])$$

(b): when $|\Delta COR[k-1]|\times 2 > \max der$, $$fnclvl=4/(COR[k]-\Delta COR[k]) \quad (8)$$

Next, the hybrid AF in the image pickup apparatus according to the sixth embodiment is described. FIG. 28 is a schematic diagram for illustrating the arrangement of the sub-pixels in the solid-state image pickup element 102 according to the sixth embodiment. In the image pickup apparatus according to the sixth embodiment, the sub-pixels SHA and SHB that output the phase difference signals 701 and 702 and the normal image pickup pixels are arranged in matrix in the solid-state image pickup element 102 as illustrated in FIG. 28, for example. In FIG. 28, the same pixel arrangement is repeated at an eight-row cycle, and in each cycle of the pixel arrangement, the sub-pixels SHA and SHB and the image pickup pixels are arranged in the first and second rows, and the image pickup pixels are arranged in the third to eighth rows.

The row scanning circuit 212 of the sixth embodiment first scans the phase difference detection row in which the sub-pixels SHA and SHB are arranged, and then scans the image pickup row in which the sub-pixels SHA and SHB are not arranged. Specifically, when the image pickup is started due to the operation on the operation unit 108 or the like, first, the first row, the second row, the ninth row, the tenth row, and so on, which are the phase difference detection rows, are sequentially scanned. After that, the third to eighth rows, the eleventh to sixteenth rows, and so on, which are the image pickup rows, are sequentially scanned. As described above, the row scanning is started from the phase difference detection row in which the sub-pixels SHA and SHB are arranged. Thus, the phase difference signals 701 and 702 for focus detection, which are output from the sub-pixels SHA and SHB, can be acquired without waiting for the completion of the readout of the image pickup signals for generating the photographing image.

The pixel arrangement in the solid-state image pickup element 102 is not necessarily limited to the eight-row cycle as illustrated in FIG. 28, and is not required to be cyclic. In the solid-state image pickup element 102 according to the sixth embodiment, at least one phase difference detection row in which the sub-pixels SHA and SHB are arranged and at least one image pickup row in which the sub-pixels SHA and SHB are not arranged are only required to be provided.

Figure 29:
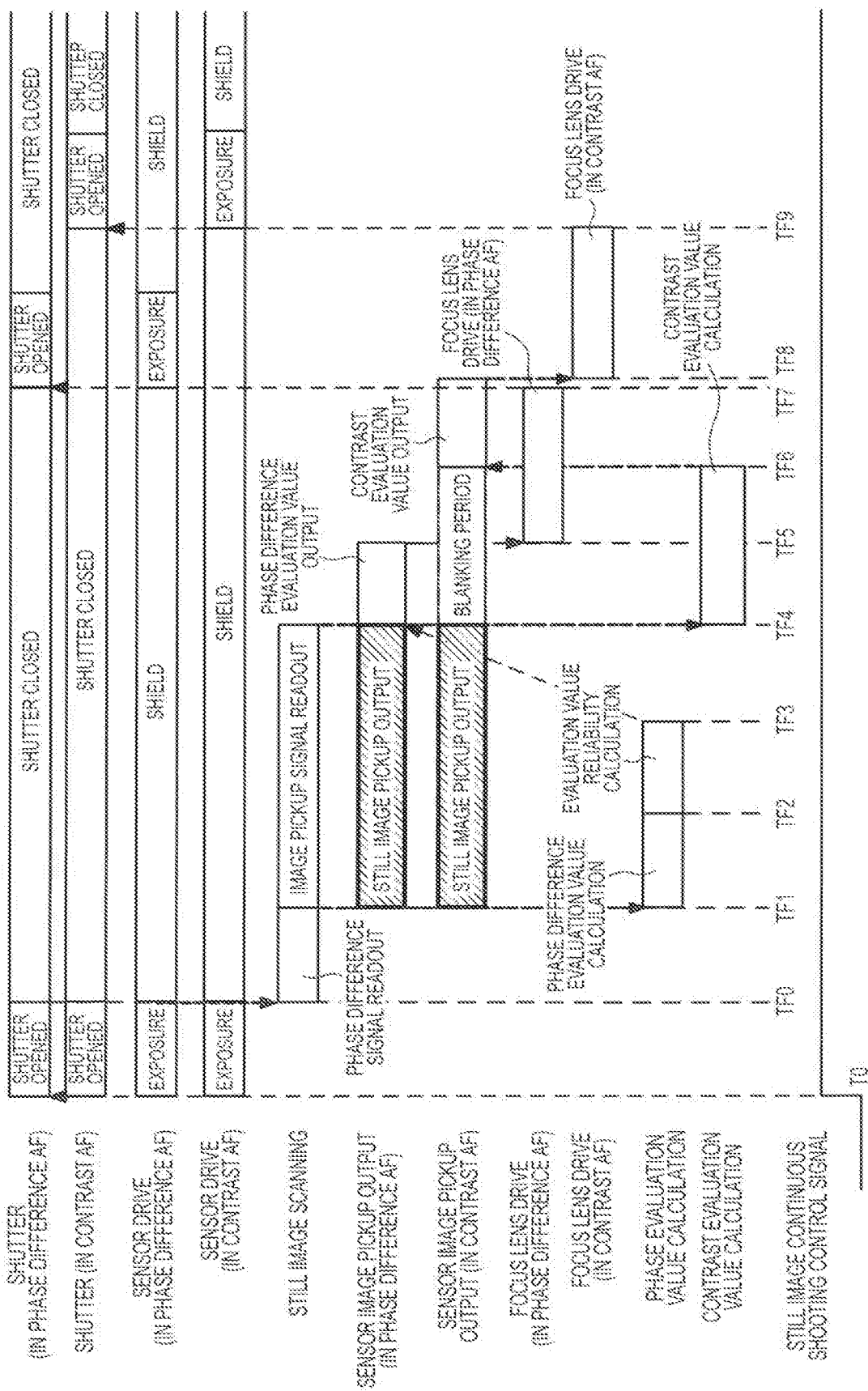
FIG. 29 is a timing chart for illustrating a method of controlling an image pickup element according to the sixth embodiment.

FIG. 29 is a timing chart for illustrating a method of controlling the image pickup element 102 according to the sixth embodiment. As described above, in the hybrid AF of the sixth embodiment, first, the phase difference detection row in which the sub-pixels SHA and SHB are arranged is scanned, and then the image pickup row in which only the normal image pickup pixels are arranged is scanned.

For example, when the still image continuous shooting mode is started due to the operation performed by the user on the operation unit 108, the controller 106 sets the still image continuous shooting control signal representing the still image continuous shooting mode to HIGH (time T0). In this manner, at the same time as when the opening of the mechanical shutter of the optical mechanism 1011 is opened, the charges accumulated in the pixels 201 are reset, and the exposure to the pixels 201 is started. Then, after elapse of an exposure period set so as to satisfy a predetermined exposure condition, the mechanical shutter of the optical mechanism 1011 is closed to block the light reflected from the object. Thus, the exposure to the pixels 201 is ended (time TF0).

The AF evaluation value calculator 1021 first performs focus detection with use of the phase difference detection method. The phase difference evaluation value calculator 217 of the AF evaluation value calculator 1021 starts readout of the phase difference signals in order to calculate the phase difference evaluation value necessary for the phase difference AF (time TF0). After the phase difference signals are read out from all of the phase difference detection pixels (time TF1), the readout of the image pickup signals from the image pickup pixels is subsequently started. While the image pickup signals are read out from the image pickup pixels, the phase difference evaluation value calculator 217 calculates the phase difference evaluation value based on the phase difference signals (period between TF1 and TF2). After that, the evaluation value reliability for determining whether or not focus to the object can be achieved is calculated based on the calculated phase difference evaluation value (period between TF2 and TF3).

When the calculated evaluation value reliability is equal to or larger than a predetermined threshold value, a determination unit (not shown) of the solid-state image pickup element 102 determines that the focus to the object can be achieved by the focus detection using the phase difference detection method. Then, after the image pickup signals are read out from all of the image pickup pixels, the phase difference evaluation values are output to the controller 106 via the signal processor 104 in a form of being added to the image pickup signals (period between TF4 and TF5). The controller 106 drives the focus lens of the optical mechanism 1011 based on the phase difference evaluation value, to thereby perform the in-focus operation (period between TF5 and TF7). After the in-focus operation is completed, as in the time T0, the operation of exposure to the pixels 201 is started to take the next still image (time TF7).

On the other hand, when the calculated evaluation value reliability is smaller than the predetermined threshold value, the determination unit (not shown) of the solid-state image pickup element 102 determines that it is difficult to achieve the focus to the object by only the focus detection using the phase difference detection method. Thus, the AF evaluation value calculator 1021 subsequently performs focus detection with use of the contrast detection method. The determination unit (not shown) may be the phase difference evaluation value calculator 217, or may be the contrast evaluation value calculator 218. Alternatively, the determination unit (not shown) may be a peripheral circuit (circuit) provided on the second semiconductor chip 21 illustrated in FIG. 20.

Now, description is briefly given of the contrast AF before the operation of the contrast evaluation value calculator 218 of the AF evaluation value calculator 1021 is described. In the contrast AF, the contrast evaluation value is calculated at a predetermined cycle while the optical mechanism 1011 is controlled to move the focus lens. Then, the in-focus operation is performed by driving the focus lens in a direction in which the contrast evaluation value calculated based on the image pickup signals of the still image taken at this time becomes larger than the contrast evaluation value calculated based on the image pickup signals of the still image taken at a previous time. In order to determine the direction to drive the focus lens in the contrast AF, the contrast evaluation values are necessary at least at two different times.

Therefore, when the first still image is taken, the focus lens is roughly brought into focus in advance based on the image pickup signals obtained for live view before the still image is taken. When the next second still image is taken, the direction to drive the focus lens is determined based on the difference between the contrast evaluation value that is based on the image pickup signals obtained for live view and the contrast evaluation value that is based on the image pickup signals obtained when the first still image is taken. The same holds true also when the third and subsequent still images are taken.

Referring back to FIG. 29, the operation of the contrast evaluation value calculator 218 is described. After the image pickup signals are read out from all of the image pickup pixels (time TF4), the contrast evaluation value calculator 218 calculates the contrast evaluation value based on the image pickup signals in which high-frequency components are extracted (period between TF4 and TF6). The solid-state image pickup element 102 outputs the calculated contrast evaluation value to the controller 106 via the signal processor 104 (period between TF6 and TF8). The contrast evaluation value is output in a form of being added to the image pickup signals, and hence there is a blanking period from when the image pickup signals are read out to when the contrast evaluation value is calculated (period between TF4 and TF6).

The controller 106 acquires the contrast evaluation value from the contrast evaluation value calculator 218 (time TF8). Then, the controller 106 drives the focus lens of the optical mechanism 1011 based on the contrast evaluation value, to thereby perform the in-focus operation (period between TF8 and TF9). After the in-focus operation is completed, as in the case of the phase difference AF, the operation of exposure to the pixels 201 is started to take the next still image (time TF9).

As described above, in the sixth embodiment, after the phase difference signals are read out, the image pickup signals are read out. In this manner, the phase difference evaluation values can be calculated without waiting for the completion of the readout of the image pickup signals from all of the image pickup pixels. Therefore, the hybrid AF can be started at an earlier timing. As a result, for example, the still image continuous shooting speed can be increased.

Further, in the sixth embodiment, whether or not to calculate the contrast evaluation value is determined based on the phase difference evaluation value. In this manner, when the focus to the object can be achieved by the focus detection using the phase difference detection method, the focus detection using the contrast detection method is omitted, and hence the in-focus operation can be increased in speed. Further, even when it is difficult to achieve the focus to the object by only the focus detection using the phase difference detection method, the focus detection using the contrast detection method can be started as soon as the readout of the image pickup signals from all of the image pickup pixels is completed. Therefore, the in-focus operation can still be increased in speed.

Figure 30:
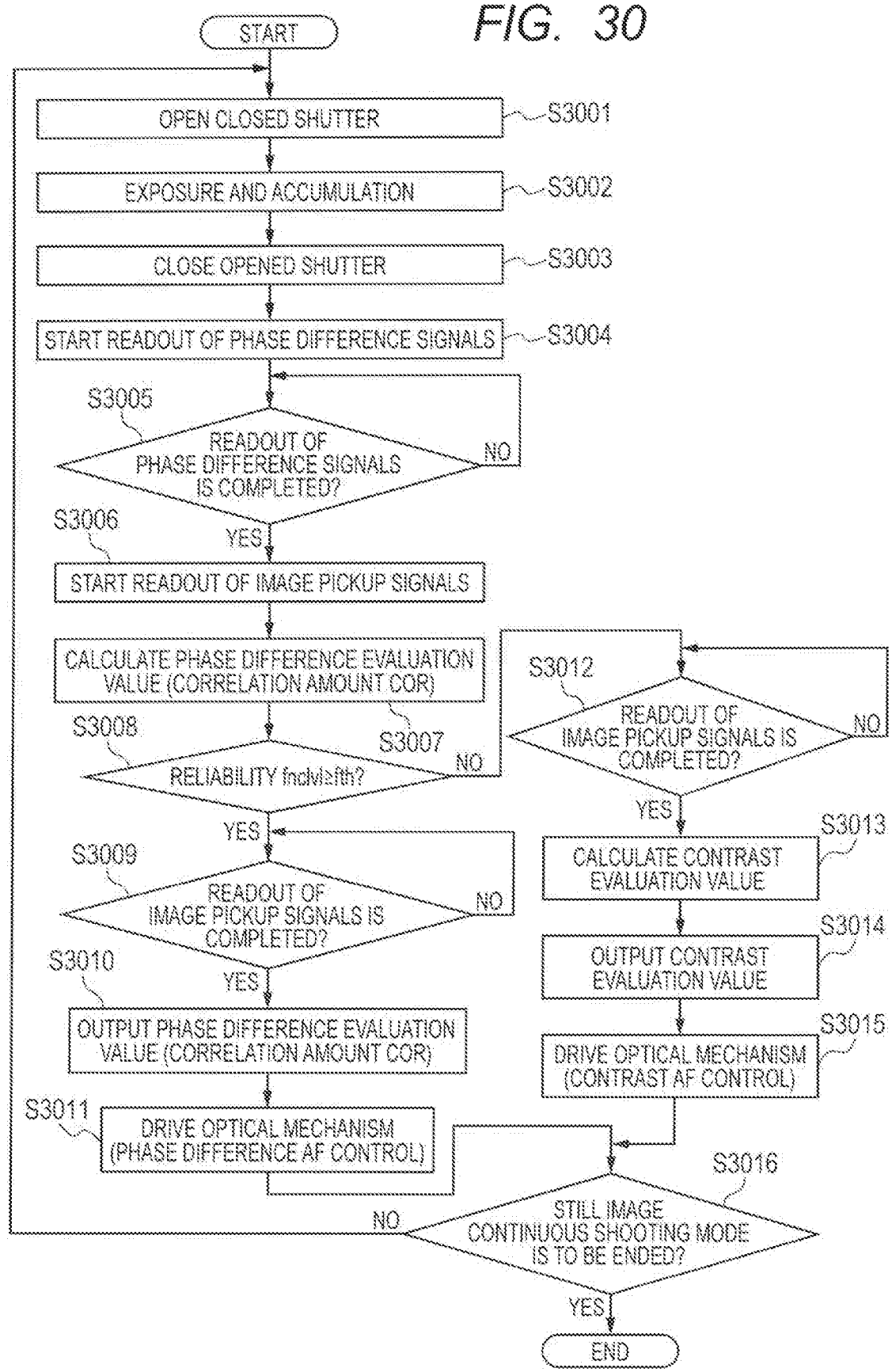
FIG. 30 is a flow chart for illustrating the method of controlling an image pickup element according to the sixth embodiment.

FIG. 30 is a flow chart for illustrating a method of controlling the solid-state image pickup element 102 according to the sixth embodiment. The controller 106 of the sixth embodiment performs hybrid AF in accordance with the flow chart of FIG. 30. For example, when the still image continuous shooting mode is started due to the operation performed by the user on the operation unit 108, the controller 106 controls the optical mechanism 1011 to open the mechanical shutter (Step S3001). As a result, the exposure to the pixels 201 is started (Step S3002). Then, after an elapse of a predetermined exposure period, the controller 106 controls the optical mechanism 1011 to close the mechanical shutter (Step S3003).

Subsequently, the phase difference evaluation value calculator 217 starts the readout of the phase difference signals in order to calculate the phase difference evaluation value necessary for the phase difference AF (Step S3004). Then, the phase difference evaluation value calculator 217 repeats the readout of the phase difference signal until the readout of the phase difference signals from all of the phase difference detection pixels is completed (Step S3005). After the readout of the phase difference signals from all of the phase difference detection pixels is completed, the readout of the image pickup signals from the image pickup pixels is started (Step S3006). The read image pickup signals are output to the contrast evaluation value calculator 218 and the signal processor 104.

The phase difference evaluation value calculator 217 calculates the phase difference evaluation value based on the read phase difference signals before the readout of the image pickup signals is completed (Step S3007). The determination unit of the solid-state image pickup element 102 calculates the evaluation value reliability fnclvl, which is the degree of coincidence of the pair of phase difference signals, based on the phase difference evaluation value, to thereby determine whether or not the evaluation value reliability fnclvl is equal to or larger than a predetermined threshold value fth (Step S3008).

In Step S3008, when the reliability fnclvl is equal to or larger than the threshold value fth (YES), the determination unit of the solid-state image pickup element 102 determines that the focus to the object can be achieved by the focus detection using the phase difference detection method, and thus the processing proceeds to Step S3009. Then, the completion of the readout of the image pickup signals from all of the image pickup pixels is waited for.

After the image pickup signals are read out from all of the image pickup pixels, the solid-state image pickup element 102 outputs the phase difference evaluation value to the controller 106 via the signal processor 104 in a form of being added to the image pickup signals (Step S3010). The controller 106 determines the feed-back control amount based on the phase difference evaluation value, and controls the drive unit 103 to drive the focus lens in the optical mechanism 1011, to thereby perform the in-focus operation (Step S3011).

On the other hand, in Step S3008, when the reliability fnclvl is smaller than the threshold value fth (NO), the determination unit of the solid-state image pickup element 102 determines that it is difficult to achieve the focus to the object by only the focus detection using the phase difference detection method, and the processing proceeds to Step S3012. Then, completion of the readout of the image pickup signals from all of the image pickup pixels is waited for.

After the image pickup signals are read out from all of the image pickup pixels, the contrast evaluation value calculator 218 calculates the contrast evaluation value based on the image pickup signals (Step S3013). The solid-state image pickup element 102 outputs the contrast evaluation value to the controller 106 via the signal processor 104 in a form of being added to the image pickup signals (Step S3014). The controller 106 determines the feed-back control amount based on the phase difference evaluation value, and controls the drive unit 103 to drive the focus lens in the optical mechanism 1011, to thereby perform the in-focus operation (Step S3015).

After the in-focus operation is completed, the controller 106 verifies whether or not the still image continuous shooting mode is ended due to the operation performed by the user on the operation unit 108, for example (Step S3016). When the still image continuous shooting mode is ended (YES), the hybrid AF processing is ended. On the other hand, when the still image continuous shooting mode is continued (NO), the processing returns to Step S3001 so that the processing of the above-mentioned flow chart is repeated to take the next still image.

As described above, the solid-state image pickup element according to the sixth embodiment includes the phase difference evaluation value calculator that calculates the phase difference evaluation value based on the phase difference signals, and the contrast evaluation value calculator that calculates the contrast evaluation value based on the image pickup signals. Further, before the readout of the image pickup signals is completed, the phase difference evaluation value is calculated based on the phase difference signals, and whether or not to calculate the contrast evaluation value is determined based on the phase difference evaluation value.

With such a configuration, the phase difference evaluation value can be calculated without waiting for the completion of the readout of the image pickup signals from all of the image pickup pixels, and hence the timing to start the hybrid AF can be set earlier. That is, focus detection using a combination of the phase difference detection method and the contrast detection method can be performed at a higher speed.

Further, when the focus to the object can be achieved with the focus detection using the phase difference detection method, the focus detection using the contrast detection method can be omitted, and hence the focus detection can be more increased in speed. The determination unit that determines whether or not to calculate the contrast evaluation value may be the phase difference evaluation value calculator 217, or may be the contrast evaluation value calculator 218. Alternatively, the determination unit may be a peripheral circuit (circuit) provided on the second semiconductor chip 21 illustrated in FIG. 20.

Seventh Embodiment

Next, an image pickup apparatus according to a seventh embodiment is described with reference to FIG. 31 to FIG. 33. In the sixth embodiment, a configuration in which one column signal line 202 is provided for each column of the solid-state image pickup element 102 is described. In contrast, in the seventh embodiment, description is given of a configuration in which at least two column signal lines 202a and 202b are provided for each column of a solid-state image pickup element 102b so that the image pickup signals from the image pickup pixels and the phase difference signals from the phase difference detection pixels can be read out in parallel.

Figure 31:
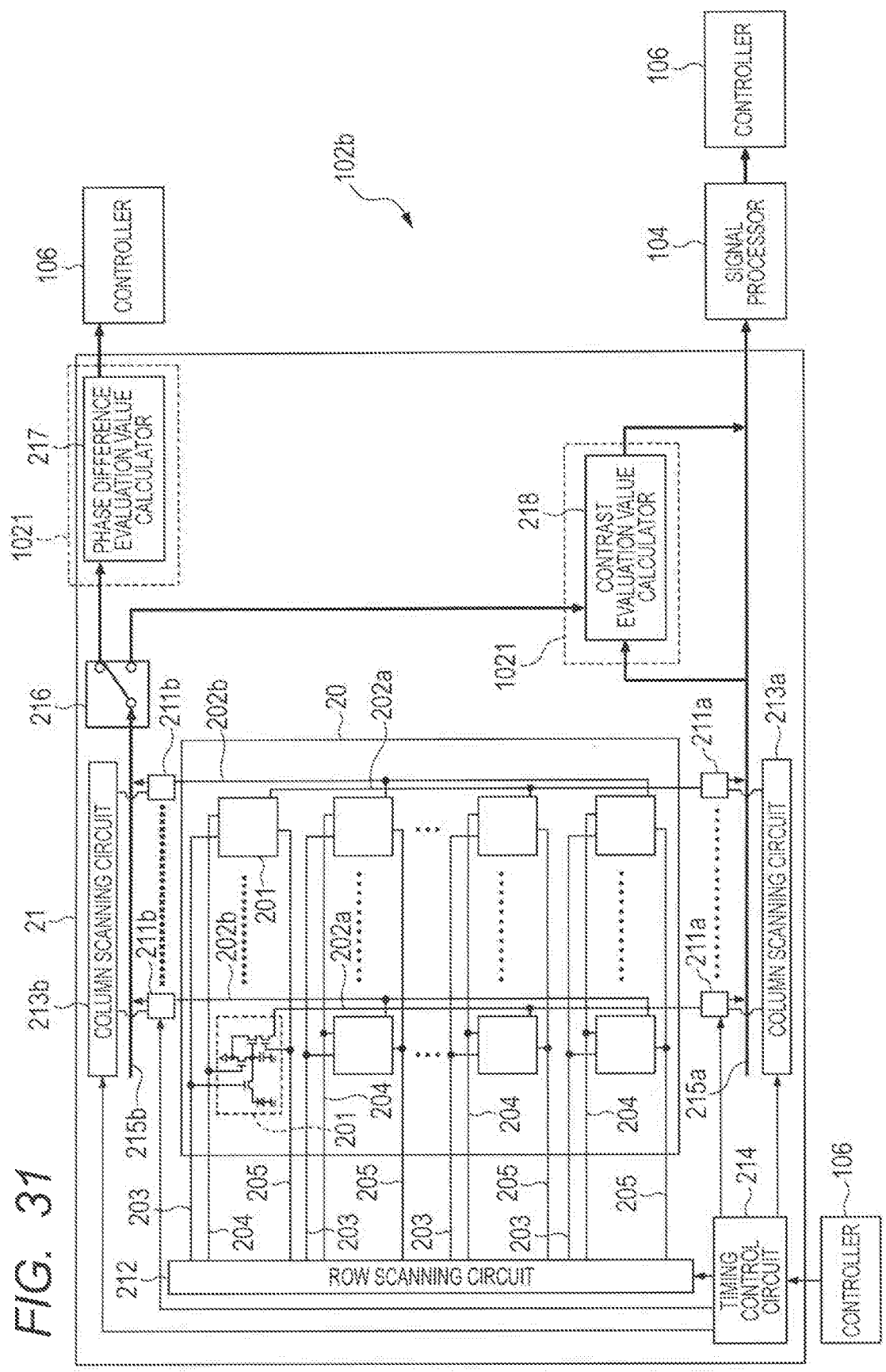
FIG. 31 is a schematic diagram for illustrating an image pickup element configuration in an image pickup element according to a seventh embodiment.
Figure 32:
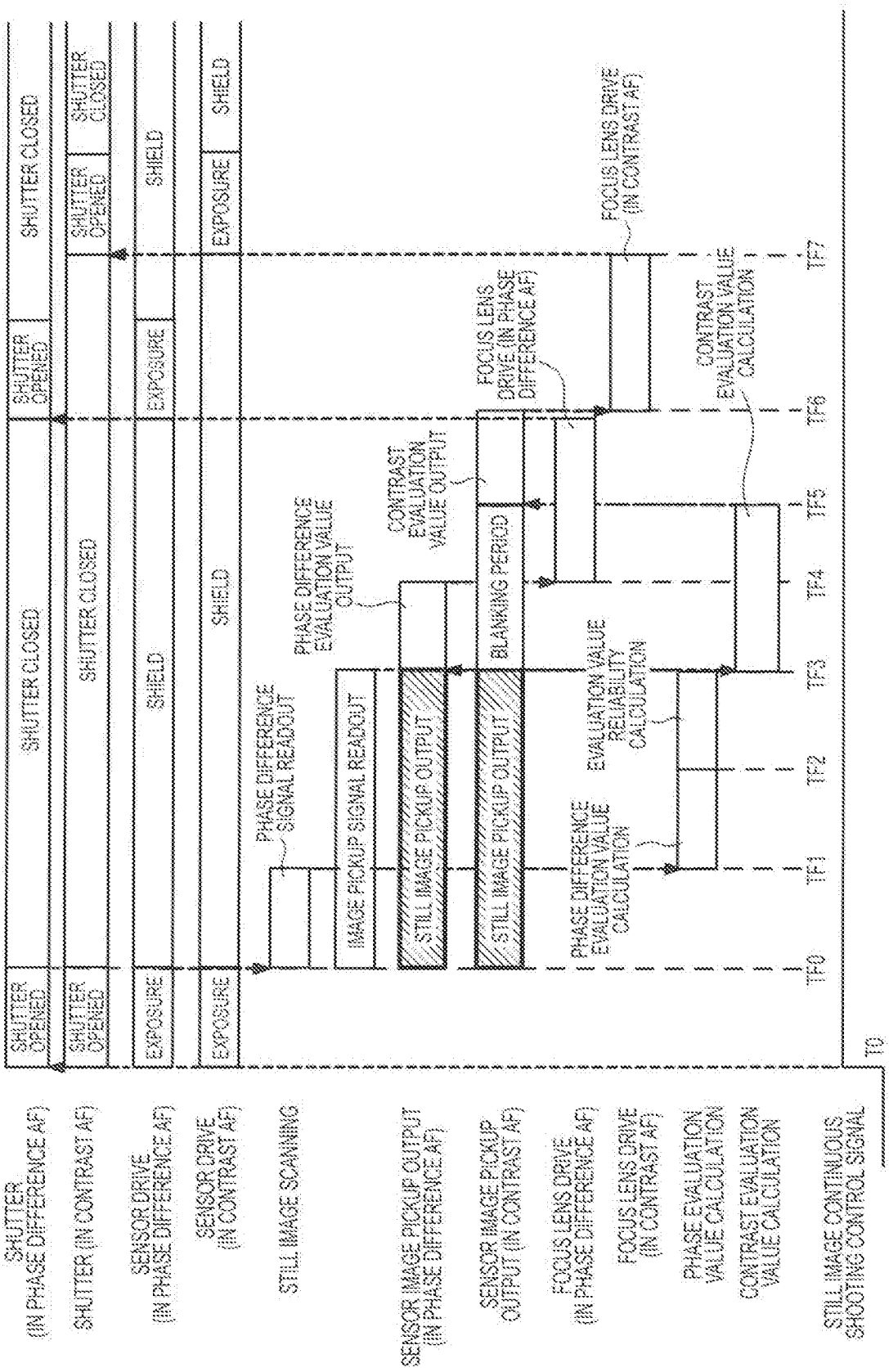
FIG. 32 is a timing chart for illustrating a method of controlling an image pickup element according to the seventh embodiment.

FIG. 31 is a schematic diagram for illustrating a configuration of the image pickup element 102b according to the seventh embodiment. The solid-state image pickup element 102b according to the seventh embodiment illustrated in FIG. 31 includes the two column signal lines 202a and 202b for each column. Further, the solid-state image pickup element 102b includes, on one side of the pixel array of the solid-state image pickup element 102b, AD conversion units 211a, the column scanning circuit 213a, and the horizontal signal line 215a, and on the other side of the pixel array, AD conversion units 211b, the column scanning circuit 213b, and the horizontal signal line 215b. Other configurations are substantially the same as those of the sixth embodiment, and hence description thereof is omitted. Configurations different from those of the sixth embodiment are mainly described below.

On the first semiconductor chip 20 of the solid-state image pickup element 102b according to the seventh embodiment, similarly to the sixth embodiment, the plurality of pixels 201 are arranged in matrix. The column signal line 202b is connected to, among those pixels 201, the pixels 201 in the phase difference detection row in which the sub-pixels SHA and SHB are also arranged. Meanwhile, the column signal line 202a is connected to the pixel 201 in the image pickup row in which only the normal image pickup pixels are arranged. The present invention is not necessarily limited to such a configuration, and in the seventh embodiment, it is only required that all of the sub-pixels SHA and SHB in the pixel array be connected to the column signal lines 202b.

Meanwhile, on the second semiconductor chip 21 of the solid-state image pickup element 102b according to the seventh embodiment, the AD conversion units 211a, the AD conversion units 211b, the column scanning circuit 213a, and the column scanning circuit 213b are arranged. Each of the AD conversion units 211a is controlled by the column scanning circuit 213a to subject the image pickup signals output to the column signal line 202a to AD conversion and then output the image pickup signals to the horizontal signal line 215a. Similarly, each of the AD conversion units 211b is controlled by the column scanning circuit 213b to subject the image pickup signals or the phase different signals output to the column signal line 202b to AD conversion and then output the signals to the horizontal signal line 215b. The column scanning circuits 213a and 213b are controlled by the timing control circuit 214.

With such a configuration, the image pickup signal output from the normal image pickup pixel is output to the contrast evaluation value calculator 218 and the signal processor 104 via the column signal line 202a or the column signal line 202b. Meanwhile, the phase difference signal output from the phase difference detection pixel including the sub-pixels SHA and SHB is output to the switch 216 via the column signal line 202b. The switch 216 switches the output destination of the signal read out via the column signal line 202b. With the switch 216, the image pickup signal is output to the contrast evaluation value calculator 218 and the signal processor 104, and the phase difference signal is output to the phase difference evaluation value calculator 217.

Now, referring back to FIG. 28, the hybrid AF in the image pickup apparatus according to the seventh embodiment is described. The row scanning circuit 212 of the seventh embodiment performs in parallel the scanning of the phase difference detection rows in which the sub-pixels SHA and SHB are arranged and the scanning of the image pickup rows in which only the normal image pickup pixels are arranged.

Specifically, when the image pickup is started due to the operation on the operation unit 108 or the like, the first row, the second row, the ninth row, the tenth row, and so on, which are the phase difference detection rows, are sequentially scanned. Simultaneously, the third to eighth rows, the eleventh to sixteenth rows, and so on, which are the image pickup rows, are sequentially scanned. As described above, the image pickup signals and the phase difference signals are read out in parallel with use of the two column signal lines 202a and 202b. Thus, the image pickup signals and the phase difference signals can be read out at a higher speed.

The pixel arrangement in the solid-state image pickup element 102b is not necessarily limited to the eight-row cycle as illustrated in FIG. 28, and is not required to be cyclic. In the solid-state image pickup element 102b according to the seventh embodiment, at least one phase difference detection row in which the sub-pixels SHA and SHB are arranged and at least one image pickup row in which the sub-pixels SHA and SHB are not arranged are only required to be provided.

Next, the hybrid AF in the image pickup apparatus according to the seventh embodiment is described. FIG. 32 is a timing chart for illustrating the method of controlling the solid-state image pickup element 102b according to the seventh embodiment. In the timing chart of the sixth embodiment of FIG. 29, the readout of the image pickup signals is started after the readout of the phase difference signals is completed. In contrast, in the timing chart of the seventh embodiment of FIG. 32, the readout of the image pickup signals is performed in parallel to the readout of the phase difference signals. Other configurations are substantially the same as those of the sixth embodiment, and hence description thereof is omitted. Configurations different from those of the sixth embodiment are mainly described below.

When the still image continuous shooting mode is started due to the operation performed by the user on the operation unit 108, for example, the controller 106 sets the still image continuous shooting control signal representing the still image continuous shooting mode to HIGH (time T0). In this manner, at the same time as when the opening of the mechanical shutter of the optical mechanism 1011 is opened, the charges accumulated in the pixels 201 are reset, and the exposure to the pixels 201 is started. Then, after elapse of an exposure period set so as to satisfy a predetermined exposure condition, the mechanical shutter of the optical mechanism 1011 is closed to block the light reflected from the object. Thus, the exposure to the pixels 201 is ended (time TF0).

The AF evaluation value calculator 1021 first performs focus detection with use of the phase difference detection method. The phase difference evaluation value calculator 217 of the AF evaluation value calculator 1021 starts the readout of the phase difference signals from the phase difference detection pixels via the horizontal signal line 215b and the switch 216 in order to calculate the phase difference evaluation value necessary for the phase difference AF (time TF0). Simultaneously, the readout of the image pickup signals from the image pickup pixels via the horizontal signal line 215a is started (time TF0).

After the phase difference signals are read out from all of the phase difference detection pixels (time TF1), the phase difference evaluation value calculator 217 calculates the phase difference evaluation value based on the phase difference signals (period between TF1 and TF2). After that, the phase difference evaluation value calculator 217 calculates the evaluation value reliability for determining whether or not focus to the object can be achieved based on the calculated phase difference evaluation value (period between TF2 and TF3). The processing to be performed thereafter is the same as that in the timing chart of the sixth embodiment of FIG. 29, and hence description thereof is omitted.

Figure 33:
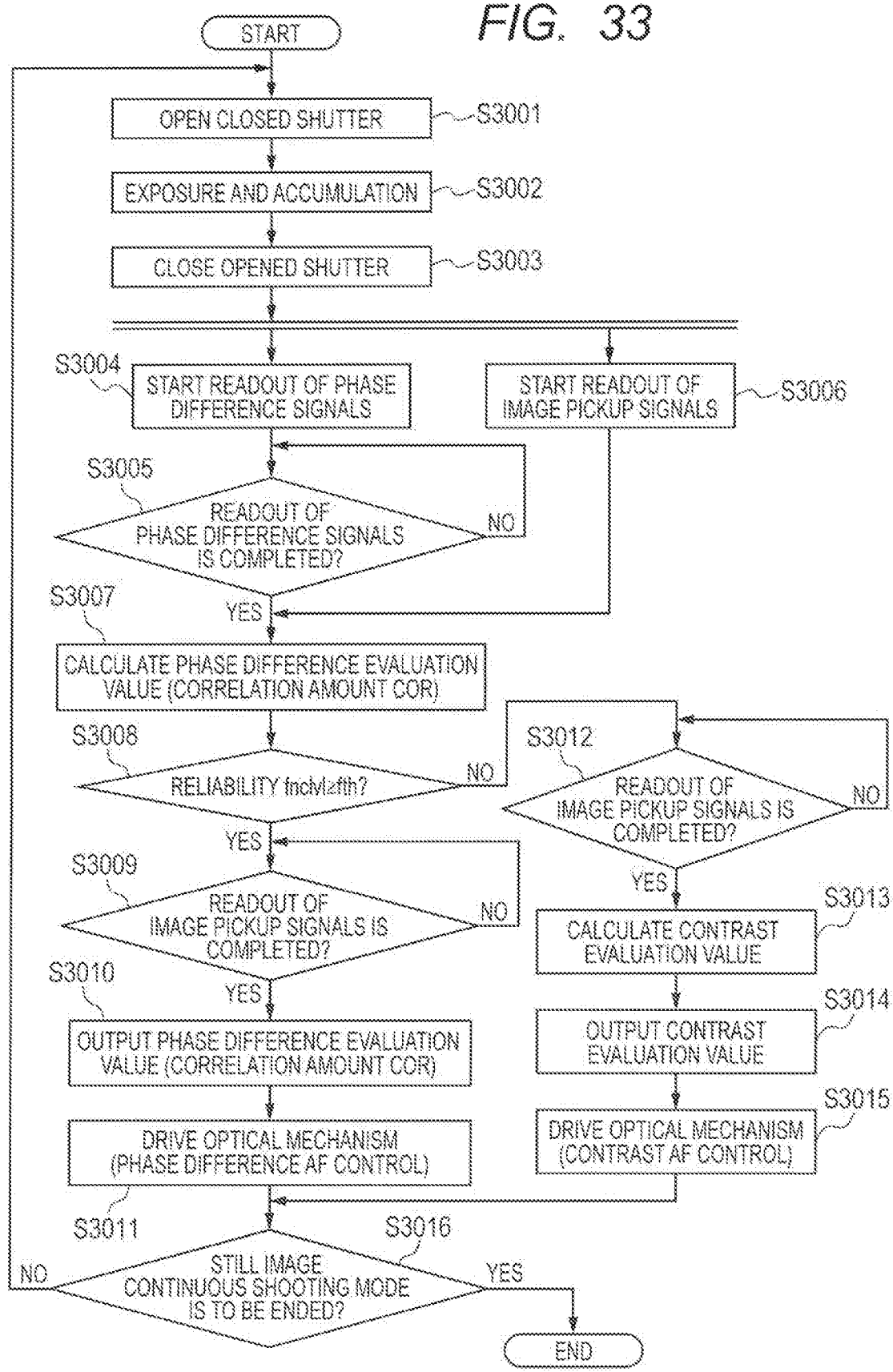
FIG. 33 is a flow chart for illustrating the method of controlling an image pickup element according to the seventh embodiment.

FIG. 33 is a flow chart for illustrating the method of controlling the image pickup element 102b according to the seventh embodiment. The controller 106 of the seventh embodiment performs the hybrid AF in accordance with the flow chart of FIG. 33. In the flow chart of the sixth embodiment of FIG. 30, the readout of the image pickup signals is started after the readout of the phase difference signals is completed. In contrast, in the flow chart of the seventh embodiment of FIG. 33, the readout of the image pickup signals is performed in parallel to the readout of the phase difference signals. Other configurations are substantially the same as those of the sixth embodiment, and hence description thereof is omitted. Configurations different from those of the sixth embodiment are mainly described below.

When the still image continuous shooting mode is started due to the operation performed by the user on the operation unit 108, for example, the controller 106 controls the optical mechanism 1011 to open the mechanical shutter (Step S3001). As a result, the exposure to the pixels 201 is started (Step S3002). Then, after an elapse of a predetermined exposure period, the controller 106 controls the optical mechanism 1011 to close the mechanical shutter (Step S3003).

Subsequently, the phase difference evaluation value calculator 217 starts the readout of the phase difference signals in order to calculate the phase difference evaluation value necessary for the phase difference AF (Step S3004). Simultaneously, the readout of the image pickup signals from the image pickup pixels is started via the horizontal signal line 215a (Step S3006). The read image pickup signals are output to the contrast evaluation value calculator 218 and the signal processor 104. Then, until the readout of the phase difference signals from all of the phase difference detection pixels is completed, the readout of the phase difference signals is repeated (Step S3005).

After the readout of the phase difference signals from all of the phase difference detection pixels is completed, the phase difference evaluation value calculator 217 calculates the phase difference evaluation value based on the read phase difference signals before the readout of the image pickup signals is completed (Step S3007). The processing to be performed thereafter is the same as that in the flow chart of the sixth embodiment of FIG. 30, and hence description thereof is omitted.

As described above, the solid-state image pickup element according to the seventh embodiment performs in parallel the scanning of the row in which the phase difference detection pixels are arranged and the scanning of the row in which the phase difference detection pixels are not arranged. In this manner, the readout of the image pickup signals from the image pickup pixels is completed earlier, and hence the hybrid AF can be started earlier. That is, the focus detection using the combination of the phase difference detection method and the contrast detection method can be further increased in speed.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processor (CPU), micro processor (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, parts of the above-mentioned embodiments may be combined as appropriate.

Further, in the above-mentioned embodiments, description is given of an example of a case in which the image pickup apparatus 100 is a digital camera, but the image pickup apparatus 100 is not limited to a digital camera. For example, the image pickup apparatus 100 may be a digital video camera, or a smart phone, which is an electronic device having both of a function of a mobile information terminal and a function of a mobile phone. Further, the image pickup apparatus 100 may be, for example, a tablet terminal or a personal digital assistant (PDA).

Further, in the above-mentioned embodiments, description is given of an example of a case in which the autofocus operation is performed while the live view display is performed, but the present invention is not limited thereto. The present invention is applicable also to a case in which the autofocus operation is performed while a moving image is taken, for example.

Further, in the above-mentioned embodiments, description is given of an example of a case in which the AF evaluation value is output from the solid-state image pickup element 102 to the controller 106 so that the controller 106 may cause the drive unit 103 to control the optical mechanism 1011, but the present invention is not limited thereto. For example, the AF evaluation value may be output from the solid-state image pickup element 102 directly to a functional block that controls the autofocus operation.

This application claims the benefit of Japanese Patent Application No. 2016-206710, filed Oct. 21, 2016, No. 2016-206720, filed Oct. 21, 2016, and No. 2016-217766, filed Nov. 8, 2016 which are hereby incorporated by reference herein in their entirety.

What is claimed is:

1. A solid-state image pickup element, comprising:
   a pixel array including a plurality of pixels arranged in matrix;
   a first calculating circuit that calculates a phase difference evaluation value for focus detection by a phase difference detection method based on a signal from a pixel for phase difference detection included in the plurality of pixels;
   an interpolation processor that generates a signal for compensating for a defect, which is caused in an image signal acquired by the pixel array and caused because the pixel for phase difference detection is included in the plurality of pixels, through interpolation using a signal from a pixel other than the pixel for phase difference detection; and
   a second calculating circuit that calculates a contrast evaluation value for focus detection by a contrast detection method based on the image signal including the signal generated by the interpolation processor through the interpolation.

2. A solid-state image pickup element according to claim 1, wherein, when the first calculating circuit completes calculation of the phase difference evaluation value, the phase difference evaluation value is output regardless of whether or not output of the image signal acquired by the pixel array is completed.

3. A solid-state image pickup element according to claim 1,
   wherein the pixel array is formed on a first semiconductor chip,
   wherein the first calculating circuit, the interpolation processor, and the second calculating circuit are formed on a second semiconductor chip different from the first semiconductor chip, and
   wherein the first semiconductor chip is stacked on the second semiconductor chip.

4. A solid-state image pickup element according to claim 1, wherein the image signal subjected to the interpolation by the interpolation processor is output.

5. A solid-state image pickup element according to claim 1, wherein each of the phase difference evaluation value and the contrast evaluation value is output via an output terminal that is different from an output terminal from which the image signal subjected to the interpolation by the interpolation processor is output.

6. A solid-state image pickup element according to claim 1, wherein readout of a signal from a row including the pixel for phase difference detection is performed in parallel to readout of a signal from a row not including the pixel for phase difference detection.

7. A solid-state image pickup element according to claim 1,
wherein the pixel array includes a plurality of pixels for phase difference detection,
wherein the plurality of pixels for phase difference detection include:
  a first pixel for phase difference detection, which acquires a signal corresponding to a light flux passing through a first pupil region of an exit pupil of an image pickup optical system; and
  a second pixel for phase difference detection, which acquires a signal corresponding to a light flux passing through a second pupil region different from the first pupil region of the exit pupil, and
wherein the first calculating circuit calculates the phase difference evaluation value based on the signal from the first pixel for phase difference detection and the signal from the second pixel for phase difference detection.

8. A method of controlling a solid-state image pickup element, comprising:
  calculating a phase difference evaluation value for focus detection by a phase difference detection method based on a signal from a pixel for phase difference detection included in a plurality of pixels arranged in matrix in a pixel array;
  generating a signal for compensating for a defect, which is caused in an image signal acquired by the pixel array and caused because the pixel for phase difference detection is included in the plurality of pixels, through interpolation using a signal from a pixel other than the pixel for phase difference detection; and
  calculating a contrast evaluation value for focus detection by a contrast detection method based on the image signal including the signal generated through the interpolation.

9. An image pickup apparatus, comprising:
  a solid-state image pickup element including:
    a pixel array including a plurality of pixels arranged in matrix;
    a first calculating circuit that calculates a phase difference evaluation value for focus detection by a phase difference detection method based on a signal from a pixel for phase difference detection included in the plurality of pixels;
    an interpolation processor that generates a signal for compensating for a defect, which is caused in an image signal acquired by the pixel array and caused because the pixel for phase difference detection is included in the plurality of pixels, through interpolation using a signal from a pixel other than the pixel for phase difference detection; and
    a second calculating circuit that calculates a contrast evaluation value for focus detection by a contrast detection method based on the image signal including the signal generated by the interpolation processor through the interpolation; and
  a controller that controls an imaging position of a focus lens based on the phase difference evaluation value and the contrast evaluation value.

10. An image pickup apparatus according to claim 9, wherein, when the first calculating circuit completes calculation of the phase difference evaluation value, the phase difference evaluation value is output regardless of whether or not output of the image signal acquired by the pixel array is completed.

11. An imaging pickup apparatus according to claim 9,
wherein the pixel array is formed on a first semiconductor chip,
wherein the first circulating circuit, the interpolation processor, and the second calculating circuit are formed on a second semiconductor chip different from the first semiconductor chip, and
wherein the first semiconductor chip is stacked on the second semiconductor chip.

12. An image pickup apparatus according to claim, 9 wherein the image signal subjected to the interpolation by the interpolation processor is output.

13. An image pickup apparatus according to claim 9, wherein each of the phase difference evaluation value and the contrast evaluation value is output via an output terminal that is different from an output terminal from which the image signal subjected to the interpolation by the interpolation processor is output.

14. An image pickup apparatus according to claim 9, wherein readout of a signal from a row including the pixel for phase difference detections in performed in parallel to readout of a signal from a row not including the pixel for phase difference detection.

15. An image pickup apparatus according to claim 9,
wherein the pixel array includes a plurality of pixels for phase difference detection,
wherein the plurality of pixels for phase difference detection include:
  a first pixel for phase difference detection, which acquires a signal corresponding to a light flux passing through a first pupil region of an exit pupil of an image pickup optical system; and
  a second pixel for phase difference detection, which acquires a signal corresponding to a light flux passing through a second pupil region different from the first pupil region of the exit pupil, and
wherein the first calculating circuit calculates the phase difference evaluation value based on the signal from the first pixel for phase difference detection and the signal from the second pixel for phase difference detection.

16. An image pickup apparatus according to claim 9, further comprising at least one of a light emission unit that emits light towards and object, an operation unit that receives an operation input performed by a user, a display that displays an image, and a recording unit that records image data.

* * * * *